US009041096B2

(12) United States Patent
Nakajima

(10) Patent No.: US 9,041,096 B2
(45) Date of Patent: May 26, 2015

(54) SUPERJUNCTION SEMICONDUCTOR DEVICE AND MANUFACTURING METHOD THEREFOR

(71) Applicant: ROHM CO., LTD., Kyoto (JP)

(72) Inventor: Toshio Nakajima, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 14/248,159

(22) Filed: Apr. 8, 2014

(65) Prior Publication Data

US 2014/0306283 A1 Oct. 16, 2014

(30) Foreign Application Priority Data

Apr. 16, 2013 (JP) .................................. 2013-085788
May 13, 2013 (JP) .................................. 2013-101527

(51) Int. Cl.
H01L 29/78 (2006.01)
H01L 29/66 (2006.01)
H01L 29/739 (2006.01)
H01L 29/06 (2006.01)
H01L 29/08 (2006.01)

(52) U.S. Cl.
CPC ...... H01L 29/7827 (2013.01); H01L 29/66666 (2013.01); H01L 29/66333 (2013.01); H01L 29/7395 (2013.01); H01L 29/0634 (2013.01); H01L 29/0834 (2013.01)

(58) Field of Classification Search
CPC ..................... H01L 29/7827; H01L 29/66666; H01L 29/7395; H01L 29/7802

USPC ........................ 257/329, 139; 438/283, 268
See application file for complete search history.

(56) References Cited

U.S. PATENT DOCUMENTS

| 5,556,792 | A | * | 9/1996 | Zambrano | 438/138 |
|---|---|---|---|---|---|
| 5,698,867 | A | * | 12/1997 | Bauer et al. | 257/138 |
| 5,723,349 | A | * | 3/1998 | Fallica | 438/133 |
| 6,323,509 | B1 | * | 11/2001 | Kusunoki | 257/146 |
| 6,627,961 | B1 | * | 9/2003 | Francis | 257/378 |
| 7,250,639 | B1 | * | 7/2007 | Suekawa | 257/133 |
| 2008/0173893 | A1 | | 7/2008 | Hamaguchi et al. | |
| 2009/0039484 | A1 | * | 2/2009 | Mahler et al. | 257/676 |
| 2010/0117117 | A1 | * | 5/2010 | Ruething et al. | 257/139 |
| 2010/0156506 | A1 | * | 6/2010 | Tsuzuki et al. | 327/478 |
| 2012/0126880 | A1 | * | 5/2012 | Patti | 327/537 |
| 2012/0169262 | A1 | | 7/2012 | Nakajima | |
| 2013/0082322 | A1 | * | 4/2013 | Weber et al. | 257/329 |

FOREIGN PATENT DOCUMENTS

JP 2012-142330 A 7/2012
JP 5036327 B2 9/2012

* cited by examiner

Primary Examiner — Nathan Ha
(74) Attorney, Agent, or Firm — Chen Yoshimura LLP

(57) ABSTRACT

A semiconductor device that includes the following is manufactured: an $n^-$ base layer; a p-type base layer formed on the surface of the $n^-$ base layer; an $n^+$ source layer formed in the inner area of the p-type base layer; a gate electrode formed so as to face a channel region across a gate insulating film; a plurality of p-type columnar regions that are formed in the $n^-$ base layer so as to continue from the p-type base layer and that are arranged at a first pitch; and a plurality of $p^+$ collector layers that are selectively formed on the rear surface of the $n^-$ base layer and that are arranged at a second pitch larger than the first pitch.

30 Claims, 58 Drawing Sheets

Low Voltage Range

SUPERJUNCTION SEMICONDUCTOR DEVICE AND MANUFACTURING METHOD THEREFOR

BACKGROUND OF THE INVENTION

1. Field of the Invention

The present invention relates to a superjunction semiconductor device.

2. Description of Related Art

It is well-known that IGBTs (insulated gate bipolar transistors) are used as switching devices in inverter circuits or power circuits provided in various types of home appliances such as refrigerators, air-conditioners, and laundry machines; energy-related systems such as solar power generating systems and wind power generating systems; and vehicles such as electric vehicles (EV) and hybrid electric vehicles (HEV), for example.

An IGBT disclosed in Patent Document 1 includes: an $n^-$ drift layer; a p-base layer formed on the $n^-$ drift layer; an $n^+$ emitter layer formed on a portion of the surface of the p-base layer; a trench formed so as to penetrate the $n^+$ emitter layer; a gate electrode formed in the trench across a gate insulating film; an n-buffer layer formed on the bottom of the wafer; a p-collector layer formed further towards the bottom of the wafer than the n-buffer layer; an emitter electrode formed on the top of the wafer; and a collector electrode formed on the bottom of the wafer.

Patent Document 1: Japanese Patent No. 5036327

In the set shown as an example above, there has been demand for more energy savings for all embedded applications in order to reduce the impact on the environment. The IGBT switching device, however, differs from a MOSFET in that the IGBT is a bipolar device, and thus, an ON voltage greater than or equal to the VF (forward voltage) to the current is necessary. As a result, if using IGBTs in a motor driving circuit, for example, the efficiency of the set using this motor driving circuit will be low in low voltage ranges.

On the other hand, the MOSFET, which is a unipolar device, can form a set with excellent efficiency in low voltage ranges as compared to the IGBT if used in the above-mentioned set, and therefore, is used instead of the IGBT. In general, however, the chip size of the MOSFET must be made larger in order to be compatible with both low voltage ranges and high voltage ranges, which leads to an increase in cost.

The MOSFETs that are used as switching devices in inverter circuits and power circuits are largely separated into planar types and superjunction types. Planar MOSFETs include a drain layer, an n-type base layer arranged on this drain layer, a p-type base layer formed on the surface of the n-type base layer, and an $n^+$ drain layer and $n^+$ source layer formed on the surface of the p-type base layer with a gap therebetween, for example. The gate electrode is arranged so as to face the surface of the p-type base layer between the $n^+$ source/drain layer across the gate insulating film.

As disclosed in Patent Document 2, superjunction MOSFETs include a p-type columnar region that extends from the p-type base layer towards the drain layer, in addition to the configuration of the planar MOSFET described above, for example. This structure enables a reduction in on-resistance and improves switching speed.

Patent Document 2: Japanese Patent Application Laid-Open Publication No. 2012-142330

One problem with superjunction MOSFETs is the hard recovery of the parasitic diode. Hard recovery means that the change in reverse recovery current (dir/dt) is fast. In superjunction MOSFETs, a depletion layer spreads from both the p-type base layer and the p-type columnar region when the parasitic diode is turned off. In particular, the depletion layer that spreads from the p-type columnar region quickly bonds with the depletion layer that spreads from another adjacent p-type columnar region and quickly reaches the drain layer directly below. Therefore, the current changes rapidly, and blocking of the reverse recovery current also occurs at a high speed. In response to this, the reverse recovery current waveforms exhibit an oscillation (ringing) with steep changes and a large amplitude. Such reverse recovery characteristics (hard recovery characteristics) cause a large amount of noise, and could cause the controller supplying control signals to the MOSFETs to malfunction, for example. In particular, in an inverter circuit that drives an inductive load such as in an electric motor, the parasitic diode turns ON and OFF; therefore, the hard recovery characteristics when this parasitic diode is turned off poses a problem. According to Patent Document 2 mentioned above, the reverse recovery characteristics are improved by heavy particle irradiation from the rear surface of the n-type drain layer with heavy particles such as protons, $^3He^{++}$, and $^4He^{++}$, but this does not improve the hard recovery characteristics.

SUMMARY OF THE INVENTION

Accordingly, the present invention is directed to superjunction semiconductor devices and their manufacturing method that substantially obviate one or more of the problems due to limitations and disadvantages of the related art.

An aim of the present invention is to provide an improved and highly functional MOSFET.

An aim of the present invention is to provide a semiconductor device in which on-resistance can be evenly reduced in both low voltage ranges and high voltage ranges.

An aim of the present invention is to provide a superjunction semiconductor device in which it possible to alleviate hard recovery of a parasitic diode with a simple structure, and a method of manufacturing this semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve some or all of these advantages and other advantages in accordance with the purposes of the present invention, as embodied and broadly described, the present invention provides a semiconductor device that includes: a first conductive type base layer; a plurality of second conductive type base layers selectively formed on a surface of the first conductive type base layer; a first conductive type source layer that is formed in an inner area of the respective second conductive type base layers at a gap from a periphery of the respective second conductive type base layers, the first conductive type source layer forming a channel region with this periphery; a gate electrode formed so as to face the channel region across a gate insulating film; a plurality of second conductive type columnar regions that are formed in the first conductive type base layer so as to continue from the respective second conductive type base layers and that are arranged at a prescribed first pitch between the second conductive type base layers that are adjacent to each other; and a plurality of second conductive type collector layers that are selectively formed on a rear surface of the first conductive type base layer and that are arranged at a prescribed second pitch, the second pitch being larger than the first pitch of the second conductive type columnar regions.

With this configuration, a plurality of the second conductive type collector layers are selectively formed on the rear surface of the first conductive type base layer; therefore, both the first conductive type base layer and the second conductive type collector layers are exposed on this rear surface. This makes it possible, when used in a set, to provide a semiconductor device that has MOSFET characteristics capable of forming a set with excellent efficiency in low voltage ranges and IGBT characteristics capable of generating conductivity modulation in high voltage ranges due to the rear surface electrode being formed so as to contact the first conductive type base layer and the second conductive type collector layers exposed on the rear surface of the first conductive type base layer.

Meanwhile, the respective occupancies of the first conductive type base layer and the second conductive type collector layers with respect to the entire rear surface of the first conductive type base layer are smaller than regular MOSFETs and IGBTs where the entire rear surface is occupied by a single first conductive type area or second conductive type area. Thus, if the area of either the first conductive type base layer or the second conductive type collector layers is increased, the area of the other will decrease. As a result, the contact resistance of the rear surface electrode to the relatively small layer is increased, and the reducing effect of the on-resistance is weakened. In other words, there is a trade-off between the MOSFET characteristics and the IGBT characteristics given to the semiconductor device.

After earnest and diligent research, the inventors of the present invention were able to evenly reduce the on-resistance in low voltage ranges and high voltage ranges, not by matching the pitch of the second conductive type collector layers to the pitch of the second conductive type columnar regions (first pitch=second pitch), but by making the second pitch larger than the first pitch (second pitch>first pitch). As a result, the semiconductor device of this aspect of the present invention can have optimal device characteristics for a variety of applications.

In one embodiment, it is preferable that the second pitch be two times to five times the first pitch.

In one embodiment, it is preferable that the occupancy of the second conductive type collector layer with respect to the entire rear surface of the first conductive type base layer be 40% to 80%.

In one embodiment, the second conductive type collector layers may be formed so as to face the respective second conductive type columnar regions in a thickness direction of the first conductive type base layer. With this configuration, on-resistance can be greatly reduced in high voltage ranges.

In one embodiment, the second conductive type columnar regions may be formed in a stripe shape in a plan view. In this case, in one embodiment, it is preferable that the second conductive type collector layers be formed in a shape that intersects the respective second conductive type columnar regions and that faces the respective second conductive type columnar regions at this intersection in a plan view. In one embodiment, it is preferable that the second conductive type collector layers be formed in a stripe shape in a plan view. In one embodiment, it is preferable that the second conductive type collector layers be formed in a stripe shape that is orthogonal to the respective second conductive type columnar regions in a plan view. In one embodiment, if the second conductive type collector layers are formed in a stripe shape that intersects the respective second conductive type columnar regions in a plan view, then the second conductive type collector layers may be formed in a polygonal shape or a circular shape in a plan view.

In other words, if each of the second conductive type collector layers respectively faces one of the second conductive type column sections aligned in a stripe shape, then variation in on-resistance between the cells of the semiconductor device will be reduced. In one embodiment, second conductive type collector layers may be formed in stripe shapes that intersect second conductive type columnar regions, the respective second conductive type collector layers may continue across a plurality of the second conductive type columnar regions, and may approximately evenly face all of the respective second conductive columnar regions. Similarly, in one embodiment, second conductive type collector layers may be formed in stripe shapes that are orthogonal to second conductive type columnar regions, and a uniform amount of the second conductive collector layers may be made to reliably face all of the respective second conductive type columnar regions.

In one embodiment, the second conductive type collector layers may be formed in a stripe shape that is parallel to the respective second conductive type columnar regions in a plan view.

In one embodiment, the second conductive type columnar regions may be formed in a polygonal shape or a circular shape. In this case, the second conductive type collector layers may be formed in a stripe shape in a plan view from a direction normal to the surface of the first conductive type base layer, or may be formed in a polygonal shape or a circular shape in a plan view from a direction normal to the surface of the first conductive type base layer.

In one embodiment, the first conductive type base layer may include a first conductive type contact layer arranged between each of the plurality of the second conductive type collector layers, the first conductive type base layer having a higher impurity concentration than a first conductive type drift layer that is formed in a top area of the plurality of the second conductive type collector layers. With this configuration, the rear surface electrode can be made to have a favorable+ohmic connection with the first conductive type base layer.

In one embodiment, it is preferable that a ratio of a width of the second conductive type collector layer to a width of the first conductive type contact layer in each second pitch be 1:1.

In one embodiment, it is preferable that the first pitch be 5 µm to 20 µm and the second pitch be 5 µm to 200 µm.

In one embodiment, it is preferable that the second conductive type collector layers have a width of 2.5 µm to 160 µm.

In one embodiment, it is preferable that the second conductive type collector layers have a depth of 0.2 µm to 3.0 µm from the rear surface of the first conductive type base layer.

In one embodiment, it is preferable that the second conductive type collector layers have an impurity concentration of $1\times10^{17}$ cm$^{-3}$ to $1\times10^{22}$ cm$^{-3}$.

In a second aspect of the present invention, the present invention provides a semiconductor device that includes: a first conductive type drain layer; a first conductive type base layer formed on the first conductive type drain layer; a plurality of second conductive type base layers selectively formed on a surface of the first conductive type base layer; a first conductive type source layer that is formed in an inner area of the respective second conductive type base layers at a gap from a periphery of the respective second conductive type base layers, the first conductive type source layer forming a channel region with this periphery; a gate electrode formed so as to face the channel region across a gate insulating film; a second conductive type columnar region that is formed in the first conductive type base layer and that extends towards the first conductive type drain layer from at least some of the second conductive type base layers; a drain electrode electrically connected to the first conductive type drain layer; and a source electrode electrically connected to the first conductive type source layer, wherein the second conductive type columnar region has a top columnar region integrally formed with the respective second conductive type base layers and a bottom columnar region that is longer than the top columnar region and that is electrically floating.

The semiconductor device of this aspect of the present invention forms a superjunction MOSFET by the second conductive type columnar regions that continue from the second conductive type base layer extending towards the first conductive type drain layer. If the first conductive type is n, and the second conductive type is p, then an inversion layer (channel) will be formed in the channel region near the surface of the p-type base layer if the drain electrode connects to a higher potential than the source electrode and a control voltage above the threshold voltage is applied to the gate electrode. This forms a current path that passes through the drain electrode, n-type drain layer, n-type base layer, the inversion layer of the p-type base layer surface, the n-type source layer, and the source electrode in this order. If a control voltage is not applied to the gate electrode, then the inversion layer will not be formed, and the current path will be blocked. The p-n junction between the p-type base layer and the p-type top columnar region integrated therewith and the n-type base layer forms a parasitic diode. This parasitic diode is in an ON-state when forward voltage is applied, and is in an off-state when reverse voltage is applied. When the parasitic diode is turned OFF, reverse recovery occurs in which the carriers (holes) in the p-type base layer and the top columnar region are attracted to the source electrode and the carriers (electrons) in the n-type base layer and the n-type drain layer are attracted to the drain electrode. The current that flows due to this phenomenon is the reverse recovery current. The depletion layer spreads from the p-n junction and the parasitic diode turns OFF due to the movement of the carriers.

In this example of the present aspect, the p-type columnar regions are respectively separated into top and bottom, and the relatively long bottom columnar regions are electrically floating with respect to the p-type base layer. Accordingly, the operation of the parasitic diode does not contribute to the bottom columnar region, thus suppressing rapid spreading of the depletion layer during reverse recovery. This suppresses the spread of the depletion layer towards the drain electrode, thereby suppressing the speed at which the depletion layer spreads when the parasitic diode is turned OFF. This reduces the speed of change of the reverse recovery current (dir/dt), and thus improves the recovery characteristics. The structure is also simple, as the separated columnar region simply needs to be provided.

Furthermore, although the columnar regions are separated, in the present example the configuration has a superjunction structure in which the p-type columnar regions extend from the p-type base layer towards the n⁺ drain layer. Accordingly, by determining the shape of the top columnar region and the bottom columnar region and the gap therebetween such that the respective depletion layers spreading laterally from the top columnar region and the bottom columnar region merge together, it is possible to achieve the inherent superjunction characteristics of favorable on-resistance and switching speed.

The above-mentioned effects are also attainable if the first conductive type is n and the second conductive type is p.

In one embodiment of the invention of the present aspect, the semiconductor device may further include a second conductive type auxiliary area formed at a location that is laterally separated with a gap from both the top columnar region and the bottom columnar region.

With this configuration, the respective depletion layers spreading laterally from the top columnar regions and the bottom columnar regions can be relayed by the depletion layers spreading from the assist regions of the second conductive type; therefore, the second conductive type assist regions can assist in the merging of the depletion layers.

In one embodiment, it is preferable that the top columnar region and the bottom columnar region are separated by a gap that is less than or equal to 10 μm in a vertical direction. With this configuration, it is possible to make it easy to merge together the respective depletion layers spreading in the lateral direction from the top columnar region and the bottom columnar region.

In one embodiment, at least some of the second conductive type base layers may selectively have a continuous columnar region that continues from the respective second conductive type base layers to a bottom edge of the bottom columnar region. With this configuration, by selectively providing the continuous column sections that are specialized for superjunction characteristics, it is possible to adjust the trade-off between the switching speed and on-resistance of the semiconductor device.

In one embodiment, the semiconductor device of the second aspect may include a second conductive type collector layer partially formed on a rear surface of the first conductive type.

With this configuration, electrons or holes are implanted into the first conductive type base layer from the second conductive type collector layers; therefore, conductivity modulation can be performed in the first conductive type base layer. As a result, in high voltage ranges, the current can be elevated along the current waveform depicted during operation of the IGBT. In other words, when used in a set, it is possible to provide a semiconductor device that has MOSFET characteristics capable of forming a set with excellent efficiency in low voltage ranges and IGBT characteristics capable of generating conductivity modulation in high voltage ranges. Furthermore, the semiconductor device has the columns that are the second conductive type columnar regions separated into top and bottom, thus making it possible to favorably reduce ON-resistance in high voltage ranges as compared to if second conductive type collector layers were provided in a semiconductor device in which all of the second type columnar regions are continuous columnar regions.

In one embodiment, the second conductive type columnar region may be arranged at a prescribed first pitch between the second conductive type base layers that are adjacent, and the second conductive type collector layer may be arranged at a prescribed second pitch larger than the first pitch of the second conductive type columnar region.

The respective areas taken up by the first conductive type drain layer and the second conductive type collector layers with respect to the entire rear surface of the first conductive type drain layer are smaller than in regular MOSFETs and IGBTs in which the entire rear surface is occupied by a single first conductive type area or second conductive type area, for example. Thus, if the area of either the first conductive type drain layer or the second conductive type collector layers is increased, the area of the other will decrease. As a result, the contact resistance of the drain electrode with respect to the relatively narrow layer will increase, and this will weaken the reducing effect of the ON-resistance. In other words, there is a trade-off between the MOSFET characteristics and the IGBT characteristics given to the semiconductor device.

After earnest and diligent research, the inventor of the present invention was able to evenly reduce the on-resistance in low voltage ranges and high voltage ranges, not by matching the pitch of the second conductive type collector layers to the pitch of the second conductive type column sections (first pitch=second pitch), but by making the second pitch larger than the first pitch (second pitch>first pitch). As a result, this semiconductor device can have optimal device characteristics for a variety of applications.

In one embodiment, it is preferable that the second pitch be two times to five times the first pitch.

In one embodiment, it is preferable that the occupancy of the second conductive type collector layer with respect to the entire rear surface of the first conductive type drain layer be 40% to 80%.

In one embodiment, the second conductive type collector layers may be formed so as to face the respective second conductive type columnar regions in a thickness direction of the first conductive type base layer. With this configuration, on-resistance can be greatly reduced in high voltage ranges.

In one embodiment, the second conductive type columnar regions may be formed in a stripe shape in a plan view. In this case, in one embodiment, it is preferable that the second conductive type collector layers be formed in a shape that intersects the respective second conductive type columnar regions and that faces the respective second conductive type columnar regions at this intersection in a plan view. In one embodiment, it is even more preferable that the second conductive type collector layers be formed in a stripe shape in a plan view, and in one embodiment, it is particularly preferable that that the second conductive type collector layers be formed in a stripe shape that is orthogonal to the respective second conductive columnar regions in a plan view. If the second conductive type collector layers are formed in a stripe shape that intersects the respective stripe-shaped second conductive type columnar regions in a plan view, then the second conductive type collector layers may be formed in a polygonal shape or a circular shape in a plan view.

In one embodiment, in other words, if each of the second conductive type collector layers respectively faces one of the second conductive type column sections aligned in a stripe shape, then variation in on-resistance between the cells of the semiconductor device will be reduced. In one embodiment, the second conductive type collector layers may be formed in stripe shapes that intersect the second conductive type columnar regions, the respective second type conductive collector layers may continue across a plurality of the second conductive type columnar regions, and may approximately evenly face all of the respective second conductive columnar regions. Similarly, in one embodiment, second conductive type collector layers may be formed in stripe shapes that are orthogonal to second conductive type columnar regions, and a uniform amount of the second conductive collector layers may be made to reliably face all of the respective second conductive type columnar regions.

In one embodiment, the second conductive type collector layers may be formed in a stripe shape that is parallel to the respective second conductive type columnar regions in a plan view.

In one embodiment, the second conductive type columnar regions may be formed in a polygonal shape or a circular shape in a plan view.

In this case, in one embodiment, the second conductive type collector layers may be formed in a stripe shape in a plan view, and in one embodiment, may be formed in a polygonal or a circular shape in a plan view.

In one embodiment, it is preferable that a ratio of a width of the second conductive type collector layer to a width of the first conductive type drain layer in each second pitch be 1:1.

In one embodiment, it is preferable that the first pitch be 5 µm to 20 µm and that the second pitch be 5 µm to 200 µm.

In one embodiment, it is preferable that the second conductive type collector layers have a width of 2.5 µm to 160 µm.

According to a third aspect of the present invention, the present invention provides a method of manufacturing a semiconductor device, including: forming a first conductive type base layer on a first conductive type drain layer by selectively implanting a second conductive type impurity into a prescribed first horizontal location and then forming a bottom main layer that is of a first conductive type through epitaxial growth for a first period of time in locations other than this prescribed first horizontal location, thereafter forming a first conductive type sub-layer through epitaxial growth on the entirety of this bottom main layer, and then forming a top main layer thereon having the same structure as the bottom main layer through epitaxial growth for a second period of time that is shorter than the first period of time; forming a second conductive type columnar region by annealing the first conductive type base layer having the top main layer and the bottom main layer and then diffusing the second conductive type impurity inside the top main layer and the bottom main layer, the second conductive type columnar region having a top columnar region vertically separated by the sub-layer and a bottom columnar region that is longer than the top columnar region; selectively forming a second conductive type base layer on the surface of the first conductive type base layer, the second conductive type base layer continuing from the second conductive type columnar region; forming a first conductive type source layer on an inner area of the second conductive type base layer such that a gap is present between a periphery of the second conductive type base layer and the first conductive type source region, the first conductive type source layer forming a channel region between this periphery and the second conductive type base layer; forming a gate electrode so as to face the channel region across a gate insulating film; forming a drain electrode that is electrically connected to the first conductive type drain layer; and forming a source electrode that is electrically connected to the first conductive type source layer.

The semiconductor devices described above can be manufactured by this method and similar methods, for example.

In one embodiment, the step of forming the first conductive type base layer may include forming the bottom main layer by epitaxially growing a plurality of layers at a prescribed first thickness, thereafter epitaxially growing a single layer of the sub-layer having the same thickness as the first prescribed thickness, and then forming the top main layer by again epitaxially growing a plurality of the layers having the first prescribed thickness but in a smaller number than the bottom main layer.

With this method, the length of the top columnar region and the bottom columnar region can be adjusted with ease by controlling the number of main layers formed through epitaxial growth.

In one embodiment, the step of forming the sub-layer through epitaxial growth may include forming the sub-layer while implanting the second conductive type impurity at a second horizontal location that is laterally separated from the first horizontal location, and the step of forming the second conductive type columnar region may include forming the second conductive type auxiliary area with gaps from both the top columnar region and the bottom columnar region by diffusing the second conductive type impurity inside the sub-layer through the annealing treatment.

In one embodiment, the step of forming the sub-layer through epitaxial growth may include forming a buffer layer of 5 µm to 30 µm.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1

Below, embodiments of the present invention will be explained in detail with reference to appended drawings. FIG.

Figure 1:
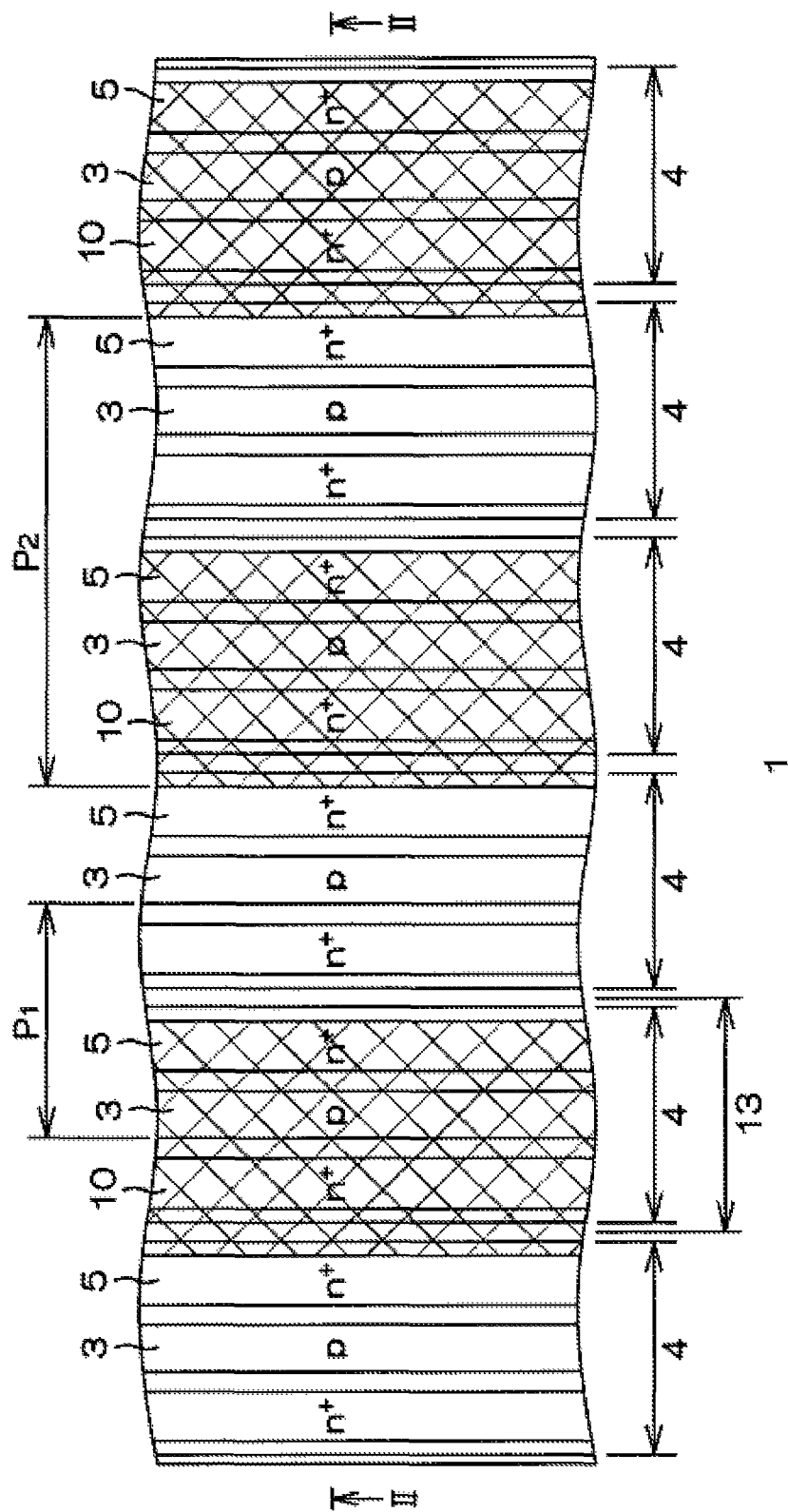
FIG. 1 is a schematic plan view of a semiconductor device according to Embodiment 1 of the present invention.
Figure 2:
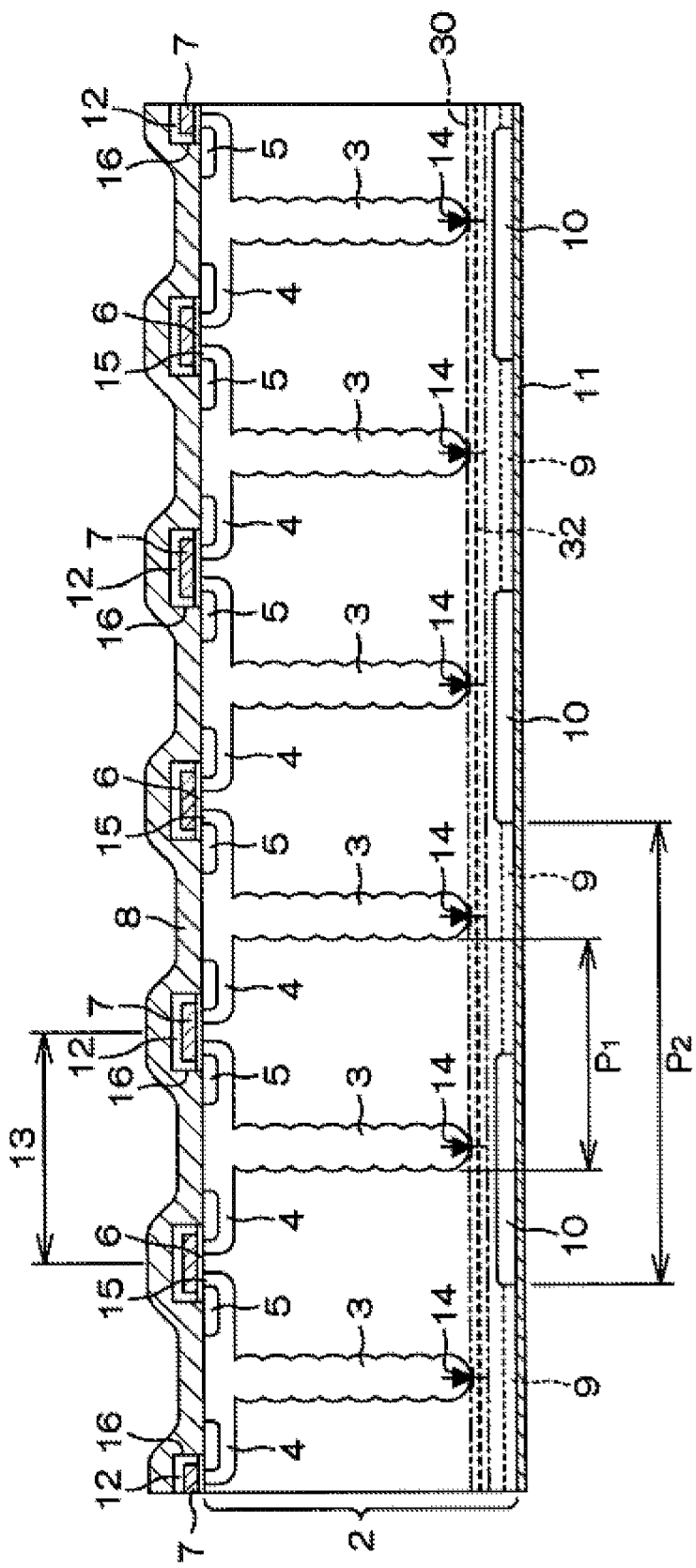
FIG. 2 is a cross-sectional view along the line II-II in FIG. 1.

1 is a schematic cross-sectional view of a semiconductor device 1 according to Embodiment 1 of the present invention. FIG. 2 is a cross-sectional view along the cross-section II-II in FIG. 1. In FIG. 1, only the elements necessary for explanation are shown, and a gate electrode 7, source electrode 8, and the like, for example, are omitted.

The semiconductor device 1 is a superjunction n-channel MOSFET (metal oxide semiconductor field effect transistor). The semiconductor device 1 includes an n⁻ base layer 2, p-type columnar regions 3, p-type base layers 4, n⁺ source layers 5, gate insulating films 6, gate electrodes 7, source electrodes 8, n⁺ contact layers 9, p⁺ collector layers 10, a drain electrode 11, a depletion layer reducing area 30, and a trap level area 32. Interlayer insulating films 12 are arranged on the respective gate electrodes 7.

The n⁻ base layer 2 is a semiconductor layer in which an n-type impurity has been implanted. More specifically, the n⁻ base layer 2 may be an n-type epitaxial layer that is epitaxially grown while implanting an n-type impurity. P (phosphorous), As (arsenic), SB (antimony) or the like can be used as the n-type impurity.

The p-type columnar regions 3 and p-type base layers 4 are semiconductor layers in which a p-type impurity has been implanted. More specifically, the p-type columnar regions 3 and p-type base layers 4 may be semiconductor layers that are respectively formed by the ion implantation of a p-type impurity in the n⁻ base layer 2. B (boron), Al (aluminum), Ga (gallium), or the like can be used as the p-type impurity.

As shown in FIG. 1, the p-type base layers 4 are selectively formed on the surface of the n⁻ base layer 2 in a plurality of areas that are arranged periodically and apart from each other in a plan view seen from a direction normal to the surface of the n⁻ base layer 2 (hereinafter, referred to simply as "a plan view"). In this embodiment, these plurality of p-type base layers 4 are formed in mutually parallel stripe shapes. The width of the respective p-type base layers 4 is 3 μm to 10 μm, for example. The individual p-type base layers 4 and the area including the n-base layer 2 surrounding these form cells 13. In other words, in the layout in FIG. 1, this semiconductor device 1 has a large number of cells 13 arrayed in stripe shapes in a plan view.

The p-type columnar regions 3 are formed in the inner area of the p-type base layer 4 of each of the cells 13 in a plan view. More specifically, in the present embodiment, the p-type columnar regions 3 are respectively formed in stripe shapes in the center area in the widthwise direction of the p-type base layers 4. The p-type columnar regions 3 are formed so as to continue from the respective p-type base layers 4, and extend towards the rear of the n-base layer 2 to a position that is deeper than the p-type base layers 4. Accordingly, the p-type columnar regions 3 are arrayed successively between the adjacent p-type base layers 4. A pitch $P_1$ of the p-type columnar regions 3 (an example of a first pitch in the present invention) is 10 μm to 20 μm. The pitch $P_1$ is a single repeating unit of the p-section columnar region 3 and the n⁻ base layer 2 between the adjacent p-type columnar region 3, and refers to the length in the direction along the surface of the n⁻ base layer 2 of this repeating unit. In this embodiment, the p-type columnar regions 3 are arranged in the middle of the respective p-type base layers 4 in the widthwise direction, and thus, the pitch $P_1$ coincides with the pitch of the cells 13 (cell pitch).

The side faces of the respective p-type columnar regions 3 along the thickness direction of the n⁻ base layer 2 serve as recesses and protrusions with periodic protrusions along this thickness direction. It is preferable that the thickness of the n⁻ base layer 2 from the bottom of the respective p-type columnar regions 3 to the rear surface of the n⁻ base layer 2 be at least 15 μm. If the thickness is at least 15 μm, then it is possible to achieve a breakdown voltage of 600V or above.

The interface of the p-type base layer 4 and p-type columnar region 3 with the n-base layer 2 is the p-n junction area, and this forms a parasitic diode (body diode) 14.

An n⁺ source layer 5 is formed in the inner area of the p-type base layer 4 of the respective cells 13 in a plan view. The n⁺ source layer 5 is selectively formed on the surface of the p-type base layer 4 in this area. The n⁺ source layer 5 may be formed by selective ion implantation of an n-type impurity into the p-type base layer 4. An example of this n-type impurity is as described above. The n⁺ source layer 5 is formed in the p-type base layer 4 so as to be positioned inside at a prescribed distance from the periphery (the interface of the p-type base layer 4 with the n⁻ base layer 2) of the p-type base layer 4. In this manner, the surface of the p-type base layer 4 is interposed between the n⁺ source layer 5 and n⁻ base layer 2 in a surface area of the semiconductor layer that includes the n⁻ base layer 2, p-type base layer 4, and the like. This interposed surface is provided as a channel region 15.

In this embodiment, as shown in FIG. 1, the n⁺ source layers 5 are formed in stripe shapes in a plan view and formed on an area outside the respective side faces of the p-type columnar regions 3. The channel regions 15 have a stripe shape in accordance with the shape of the n⁺ source layers 5.

The gate insulating film 6 may be a silicon oxide film, a silicon nitride film, a silicon oxynitride film, a hafnium oxide film, an alumina film, a tantalum oxide film, or the like, for example. The gate insulating film 6 is formed so as to cover at least the surface of the p-type base layer 4 in the channel region 15. In this embodiment, the gate insulating film 6 is formed so as to cover a portion of the n⁺ source layer 5, the channel region 15, and the surface of the n⁻ base layer 2. More specifically, the gate insulating film 6 has a pattern with openings in the center areas of the p-type base layers 4 of the respective cells 13 and in the inner peripheral area of the n⁺ source layer 5 continuing from this area.

The gate electrode 7 is formed so as to face the channel region 15 across the gate insulating film 6. The gate electrode 7 may be made of polysilicon that has had impurities implanted to lower the resistance thereof, for example. In this embodiment, the gate electrode 7 has approximately the same pattern as the gate insulating film 6 and covers the surface of the gate insulating film 6. In other words, the gate electrode 7 is arranged above a portion of the n⁺ source layer 5, the channel region 15, and the surface of the n⁻ base layer 2. More specifically, the gate electrode 7 has a pattern with openings in the center areas of the p-type base layers 4 of the respective cells 13 and in the inner peripheral area of the n⁺ source layer 5 continuing from this area. In other words, the gate electrodes 7 are formed so as to mutually control a plurality of the cells 13. This forms a planar gate structure.

The interlayer insulating film 12 is made of an insulating material such as a silicon oxide film, a silicon nitride film, or TEOS (tetraethyl orthosilicate), for example. The interlayer insulating film 12 covers the top and side faces of the gate electrode 7 and has contact holes 16 in the center areas of the p-type base layers 4 of the respective cells 13 and the inner periphery areas of the n⁺ source layer 5 continuing from this area.

The source electrode 8 is made of aluminum or another metal. The source electrode 8 covers the surface of the interlayer insulating film 12 and is formed so as to fit into the contact holes 16 in the respective cells 13. This causes the source electrode 8 to be in ohmic contact with the n⁺ source layer 5. Accordingly, the source electrode 8 is connected to the plurality of cells 13 in parallel, and all of the current flowing to the plurality of the cells 13 flows through the source electrode 8. The source electrode 8 is also in ohmic contact with the p-type base layers 4 of the respective cells 13 through the contact holes 16 and stabilizes the potential of the p-type base layers 4.

The $n^+$ contact layer 9 is formed across the entire rear surface of the $n^-$ base layer 2. The $n^+$ contact layer 9 is formed at a depth such that a gap is present between the bottom of the p-type columnar region 3 and the $n^+$ contact layer 9. The $n^-$ base layer 2 is present between the p-type columnar region 3 and the $n^+$ contact layer 9.

The $p^+$ collector layer 10 is selectively formed on the rear surface of the $n^-$ base layer 2, and a plurality of the $p^+$ collector layers 10 are arrayed continuously along this rear surface. In this embodiment, as shown by the cross-hatching in FIG. 1, the $p^+$ collector layers 10 are respectively formed in a stripe shape that is parallel to the p-type columnar regions 3 in a plan view. This causes the $p^+$ collector layers 10 and the $n^+$ contact layers 9 between the adjacent $p^+$ collector layers 10 to be alternately exposed in a stripe shape on the rear surface of the $n^-$ base layer 2.

A pitch $P_2$ of the $p^+$ collector layer 10 (an example of a second pitch of the present invention) is greater than the pitch $P_1$ of the p-type columnar region 3. This allows the semiconductor device 1 to selectively have, in the thickness direction of the $n^-$ base layer 2, p-type columnar regions 3 that face the respective $p^+$ collector layers 10 and p-type columnar regions 3 that face the n-type portion between the adjacent $p^+$ collector layers 10 but not the $p^+$ collector layer 10 itself.

The pitch $P_2$ is a single repeating unit of the $p^+$ collector layer 10 and the $n^+$ contact layer 9 between the adjacent $p^+$ collector layers 10, and refers to the length in the direction along the surface of the $n^-$ base layer 2 of this repeating unit. In this repeating unit, the ratio (of widths) of the $p^+$ collector layer 10 and the $n^+$ contact layer 9 is 1:1 in the present embodiment, but this can be modified as appropriate. In this repeating unit, the ratio (of widths) of the $p^+$ collector layer 10 and $n^+$ contact layer 9 may be set at 50% to 80% of the occupancy of the $p^+$ collector layer 10 with respect to the entire rear surface of the $n^-$ base layer 2.

The pitch $P_2$ of the $p^+$ collector layer 10 has no particular limitations as long as it is larger than the pitch $P_1$, but it is preferable that the pitch $P_2$ be 2 to 5 times that of the pitch $P_1$. This makes it possible to achieve a well-balanced and favorable ON-resistance for low voltage ranges and for high voltage ranges of the semiconductor device 1. In FIGS. 1 and 2, the pitch $P_2$ is shown as two times larger than the pitch $P_1$ due to space constraints in the drawing, but the pitch $P_2$ may be three, four, five, six times larger or more than the pitch $P_1$. Accordingly, in FIGS. 1 and 2, where the pitch $P_2$=2×pitch $P_1$, each of the $p^+$ collector layers 10 faces one p-type columnar region 3 along a direction perpendicular to the p-type columnar region 3, but if the pitch $P_2$>2×pitch $P_1$, then each of the $p^+$ collector layers 10 may face a plurality of the adjacent p-type columnar regions 3 so as to straddle these. The specific size of the pitch $P_2$ is 5 μm to 200 μm if the pitch $P_1$ of the p-type columnar region 3 is 5 μm to 20 μm as described above, for example.

Furthermore, the $p^+$ collector layers 10 have an impurity concentration of $1\times10^{17}$ cm$^{-3}$ to $1\times10^{22}$ cm$^{-3}$. The $p^+$ collector layer 10 is formed so as to penetrate the $n^+$ contact layer 9 in the thickness direction from the rear surface of the $n^-$ base layer 2 and to reach the $n^-$ base layer 2. The $p^+$ collector layer 10 has a depth of 0.2 μm to 3 μm from the rear surface of the $n^-$ base layer 2. The width of the $p^+$ collector layer 10 is 5 μm to 200 μm.

The drain electrode 11 is made of aluminum or another metal. The drain electrode 11 is formed on the rear surface of the $n^-$ base layer 2 so as to contact the $n^+$ contact layers 9 and the $p^+$ collector layers 10. In this manner, the drain electrode 11 is connected to the plurality of cells 13 in parallel, and all of the current flowing to the plurality of the cells 13 flows through the drain electrode 11. In this embodiment, the $n^+$ contact layer 9 is formed on the rear surface of the $n^-$ base layer 2; thus, the drain electrode 11 can be in favorable ohmic contact with the $n^-$ base layer 2.

If a DC power supply is connected between the source electrode 8 and the drain electrode 11 with the drain electrode 11 having a high potential and the source electrode 8 having a low potential, then a reverse-bias will be given to the parasitic diode 14. At this time, if a control voltage that is smaller than the prescribed threshold voltage is applied to the gate electrode 7, then none of the current paths will be formed between the source/drain. In other words, the semiconductor device 1 turns OFF. On the other hand, if a control voltage that is greater than or equal to the threshold voltage is applied to the gate electrode 7, then electrons will be attracted to the surface of the channel region 15 and an inversion layer (channel) will be formed. This results in conduction between the $n^+$ source layer 5 and the $n^-$ base layer 2. In other words, a current path is formed from the source electrode 8 to the drain electrode 11 through the $n^+$ source layer 5, inversion layer of the channel region 15, and the $n^-$ base layer 2, in this order. In other words, the semiconductor device 1 turns ON.

With this configuration, a plurality of the $p^+$ collector layers 10 are selectively formed on the rear surface of the $n^-$ base layer 2; therefore, both the $n^-$ base layer 2 and the $p^+$ collector layer 10 are exposed on this rear surface. This forms the drain electrode 11 on the rear surface of the $n^-$ base layer 2 so as to contact both the exposed $n^-$ base layer 2 and the $p^+$ collector layers 10, thereby making it possible to provide the semiconductor device 1 that has MOSFET characteristics capable of forming a set with excellent efficiency in low voltage ranges and that also has IGBT characteristics capable of generating conductivity modulation in high voltage ranges.

Meanwhile, the respective occupancies of the $n^-$ base layer 2 and the $p^+$ collector layers 10 with respect to the entire rear surface of the $n^-$ base layer 2 are smaller than regular MOSFETs and IGBTs, where the entire rear surface is occupied by only an n-type or p-type area. Therefore, if the area of the $n^-$ base layer 2 or the $p^+$ collector layers 10 is increased, then the area of the other will become smaller. As a result, the contact resistance of the drain electrode 11 to these relatively small layers is increased, and the reducing effect of the on-resistance is weakened. In other words, there is a trade-off between the MOSFET characteristics and the IGBT characteristics given to the semiconductor device 1.

After earnest and diligent research, the inventors of the present invention were able to evenly reduce the ON-resistance in low voltage ranges and high voltage ranges, not by matching the pitch $P_2$ of the $p^+$ collector layer 10 to the pitch $P_1$ of the p-type columnar region 3 (pitch $P_1$=pitch $P_2$), but by making the pitch $P_2$ larger than the pitch $P_1$ (pitch $P_2$>pitch $P_1$). As a result, this semiconductor device 1 can have optimal device characteristics for a variety of applications.

When the semiconductor device 1 is applied to an inverter circuit that drives an inductive load such as in an electric motor, sometimes the source electrode 8 has a higher potential than the drain electrode 11, turning the parasitic diode 14 ON, and causing current to flow through this parasitic diode 14. Thereafter, if the source electrode 8 has a lower potential than the drain electrode 11, then the parasitic diode 14 becomes reverse-biased and turns OFF. When the parasitic diode 14 turns OFF at this time, the depletion layer spreads from the p-n junction thereof, the carriers (holes) in the p-type base layer 4 and p-type columnar region 3 move towards the source electrode 8 and the carriers (electrons) inside the n⁻ base layer 2 move towards the drain electrode 11.

The movement of these carriers causes current to flow in the reverse direction of when the parasitic diode 14 is ON. This current is called the reverse recovery current. The reverse recovery current increases and then decreases. When the forward current of the diode becomes zero, the time it takes for the size of the reverse recovery current to decrease to 10% of the peak value thereof is called the reverse recovery time. When the change in the reverse recovery current (di/dt) is large, sometimes oscillation (ringing) occurs until the current reaches zero. Such a reverse recovery characteristic is referred to as a hard recovery and causes noise and malfunctioning.

The trap level area 32 contributes to shortening the reverse recovery time. The depletion layer reducing area 30 also contributes to reducing hard recovery.

The trap level area 32 is an area formed by irradiating heavy particles from the rear surface side of the n⁻ base layer 2. In the trap level area 32 there are a large number of recombination centers where carriers are trapped and dissipated by being recombined. This makes it possible to quickly dissipate the carriers when the parasitic diode 14 turns OFF, and thus, the reverse recovery time and the reverse recovery current can be reduced.

The trap level area 32 is locally formed so as to thinly spread (at a thickness of approximately 1 μm to 3 μm, for example) from the rear surface of the n⁻ base layer 2 to a prescribed depth in the n⁻ base layer 2. The trap level area 32 may be in contact with the p-type columnar regions 3, or may be positioned between the bottom of the p-type columnar regions 3 and the p⁺ collector layers 10 while not in contact with the p-type columnar regions 3. The trap level area 32 being closer to the bottom of the p-type columnar regions 3 effectively shortens the reverse recovery time, while being further from the bottom of the p-type columnar regions 3 effectively reduces drain/source leakage current. To reduce both the reverse recovery time and the drain/source leakage current, it is preferable that the center position of the trap level area 32 in the thickness direction thereof be located in a 5 μm to 10 μm range from the bottom of the p-type columnar regions 3 towards the p⁺ collector layers 10. This makes it possible to make the reverse recovery time 80 ns or less and to make the drain/source leakage current several μA or less, for example. Accordingly, the parasitic diode 14 can be used as an FRD (fast recovery diode) for the semiconductor device 1 by operating like an IGBT in high voltage ranges. As a result, FRDs are not needed in the semiconductor device 1.

Irradiation with heavy particles such as protons, $^3$He$^{++}$, or $^4$He$^{++}$ can be used for formation of the trap level area 32. Among these, helium nuclei ($^3$He$^{++}$ or $^4$He$^{++}$), which have a large mass, are preferable due to their ability to have a narrowed distribution area in the thickness direction of the recombination centers, and the recombination centers can be locally distributed within a narrow range with respect to this thickness direction. The depletion layer reducing area 30 is an area formed by irradiating heavy particles from the rear surface side of the n⁻ base layer 2 and then turning these heavy particles into donors through heat treatment. The heavy particles that have become donors suppress the spread of the depletion layer, which spreads from the p-n junction of the parasitic diode 14 when the parasitic diode 14 is turned OFF. This reduces the speed at which the depletion layer spreads, and therefore, it is possible to suppress the speed of change of the reverse recovery current and to reduce hard recovery.

The depletion layer reducing area 30 is formed so as to spread thickly (thicker than the trap level area 32; a thickness of approximately 5 μm to 10 μm, for example, for example) from the rear surface of the n⁻ base layer 2 to a prescribed depth in the n⁻ base layer 2. The depletion layer reducing area 30 may be in contact with the p-type columnar regions 3 or may not be in contact with the p-type columnar regions 3. The depletion layer reducing area 30 may have a portion that overlaps with the respective p-type columnar regions 3 or may not have a portion that overlaps with the respective p-type columnar regions 3. The depletion layer reducing area 30 may be entirely positioned between the bottom of the p-type columnar regions 3 and the p⁺ collector layers 10. The depletion layer reducing area 30 includes donors; thus, it is preferable that the areas of the depletion layer reducing area 30 overlapping the respective p-type columnar regions 3 be as few as possible, so as not to damage the functioning of the p-type columnar regions 3. It is preferable that the depletion layer reducing area 30 be close to the p-type columnar regions 3 in order to reduce the spread of the depletion layer. As shown in FIG. 2, it is preferable that the arrangement of the depletion layer reducing area 30 be chosen such that the top edge of the depletion layer reducing area 30 approximately coincides with the bottom of the p-type columnar regions 3.

Irradiation with heavy particles such as protons, $^3$He$^{++}$, or $^4$He$^{++}$ can be used for formation of the depletion layer reducing area 30. Among these, protons, which have a small mass, can be introduced so as to be widely distributed in the thickness direction; therefore, protons are suitable for the formation of the thick depletion layer reducing area 30. Protons can also be turned into donors with heat treatment performed at a relatively low temperature (350° C. to 450° C., for example). Therefore, it is possible to perform irradiation with the protons and to turn the protons into donors (heat treatment) before and after formation of the drain electrode 11 and the like, for example. Accordingly, using protons increases the degree of freedom in the relevant processes. The arrangement of the depletion layer reducing area 30 and the trap level area 32 described above can be combined together as desired.

Figure 3A:
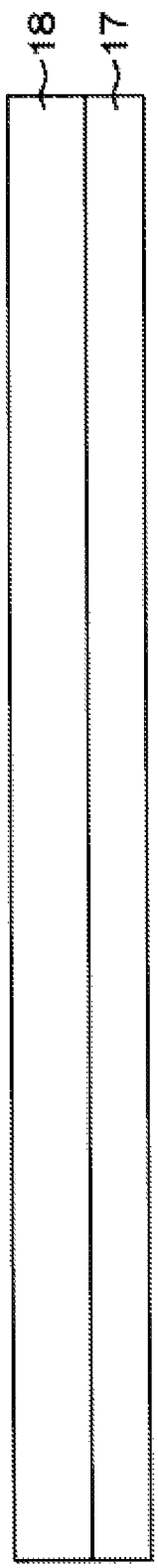
FIG. 3A is a view of a portion of a manufacturing process of the semiconductor device in FIGS. 1 and 2.

FIGS. 3A to 3J shows the sequence of a portion of the steps of manufacturing the semiconductor device 1. First, as shown in FIG. 3A, an initial base layer 18 is epitaxially grown on a substrate 17 while performing injection of an n-type impurity. The parameters for the epitaxial growth are 5.0 Ω·cm and a thickness of 50 μm. The parameters for the epitaxial growth are 5.0 Ω·cm and a thickness of 50 μm. An n-type silicon substrate can be used as the substrate 17, but this substrate 17 will be removed in a subsequent step; thus, there is no need for high-quality material when a cheap substrate can be used.

Figure 3B:
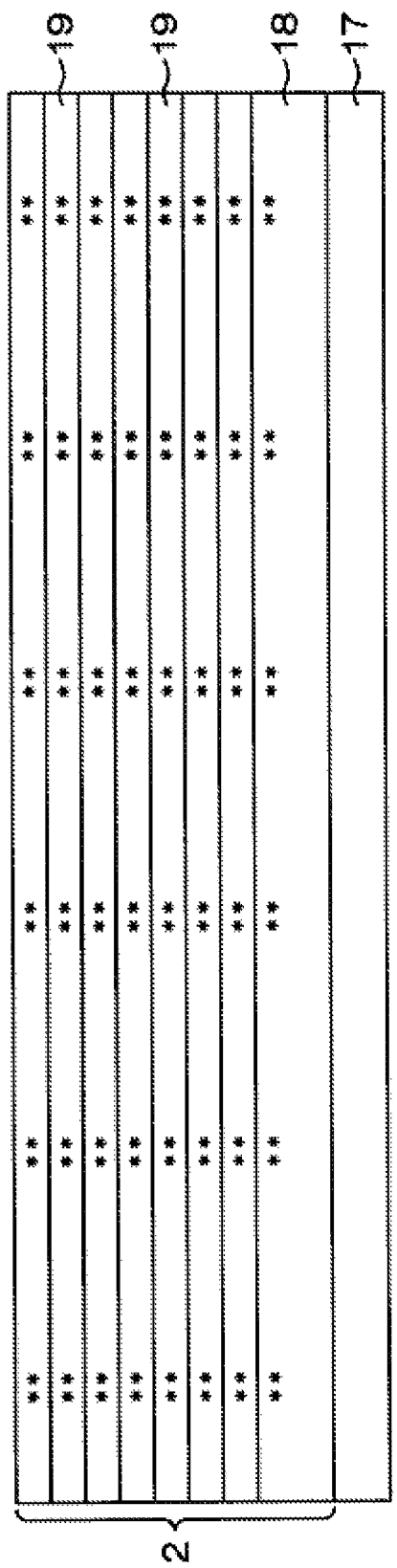
FIG. 3B is a view of the next step after the step in FIG. 3A.

Next, as shown in FIG. 3B, a plurality of n-type semiconductor layers 19 in which the implantation positions of the p-type impurity are vertically overlapping each other are stacked on the initial base layer 18 through multi-epitaxial growth. This multi-epitaxial growth involves repeating a step that forms the thin n-type semiconductor layer 19 at 5 Ω·cm/6 μm while selectively implanting the p-type impurity (B ions at 50 keV, $5.3 \times 10^{13}$ cm$^{-2}$, implantation angle of 0°) into a prescribed horizontal position. This integrates the plurality of n-type semiconductor layers 19 with the initial base layer 18 and forms the n⁻ base layer 2.

Figure 3C:
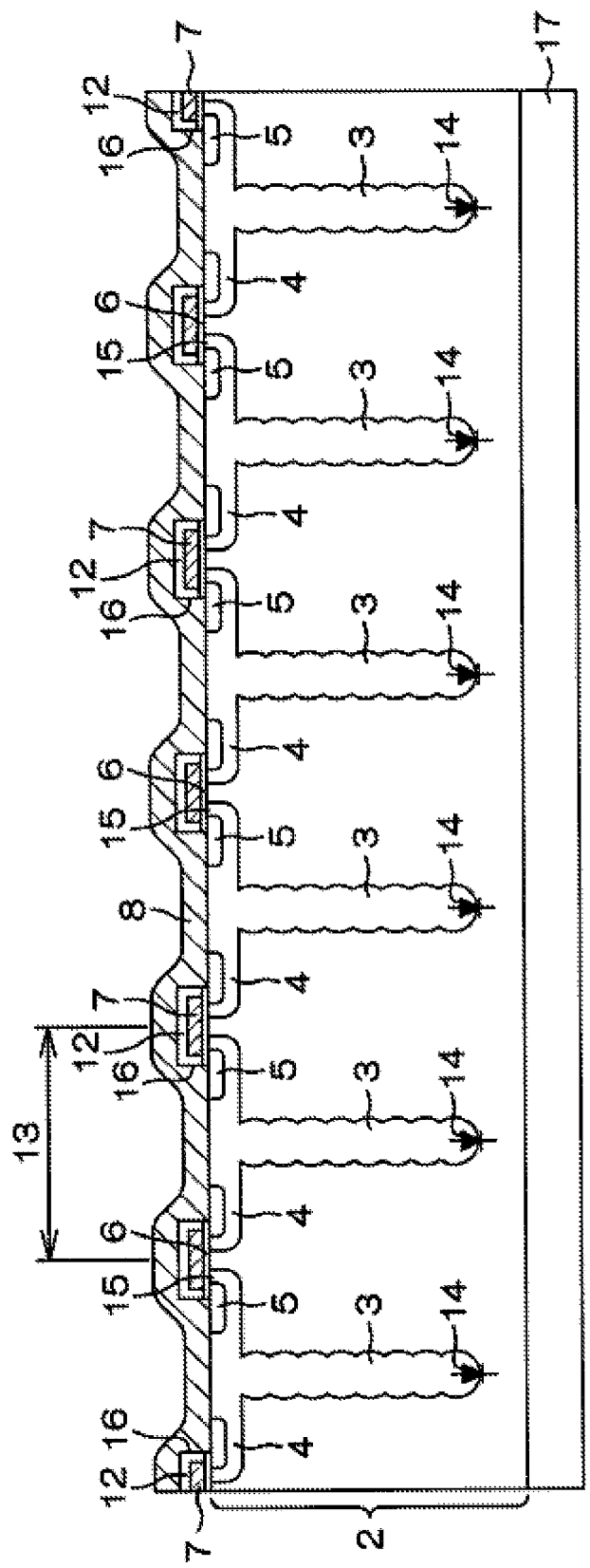
FIG. 3C is a view of the next step after the step in FIG. 3B.

Next, as shown in FIG. 3C, annealing (1000° C. to 1200° C.) is performed for drive diffusion of the p-type impurity of the plurality of the n-type semiconductor layers 19. This forms the p-type columnar regions 3.

Next, the p-type impurity is selectively implanted (B ions at 50 keV, $5.0 \times 10^{15}$ cm$^{-2}$, implantation angle of 7°) at a relatively low energy into the surface of the n⁻ base layer 2 to form the p-type base layers 4. In the p-type base layers 4 in a plan view, an n-type impurity is selectively implanted (P ions at 130 keV, $2.0 \times 10^{15}$ cm$^{-2}$, implantation angle of 7°) into a looped area of a prescribed width that has an outer edge at a position receding a prescribed distance inwards from the outer periphery of the p-type base layer 4. This forms the n⁺ source layer 5.

Next, the gate insulating films 6 are formed so as to respectively cover the n⁻ base layer 2 and the surface (surface of the semiconductor crystal) of the p-type base layers 4. These gate insulating films 6 may be formed by thermal oxidation of the semiconductor crystal surface. The gate electrodes 7 are formed on the respective gate insulating films 6. The gate electrodes 7 may be formed by attaching impurities and forming a low-resistance polysilicon film, and then selectively etching this polysilicon film by photolithography, for example. The gate insulating films 6 may be patterned at the same time as this etching, and the gate electrodes 7 and the gate insulating films 6 may be formed in the same pattern. The interlayer insulating films 12 are formed (at a thickness of 32000 Å, for example) so as to cover the respective gate electrodes 7, and the contact holes 16 are formed in these interlayer insulating films 12 by photolithography. Next, the source electrode 8 is formed on the interlayer insulating films 12, and heat treatment is performed as necessary for formation of an ohmic junction through alloying. The formation of the source electrode 8 may be a step that includes a step of forming a Ti/TiN barrier film (250/1300 Å, for example) and a step of depositing an AlCu film (4.2 μm, for example) on the barrier film. Thereafter, a surface protective film (not shown) is formed (at a thickness of 16000 Å, for example), and a pad opening is formed in this surface protective film that exposes a portion of the source electrode 8 as a pad.

Figure 3D:
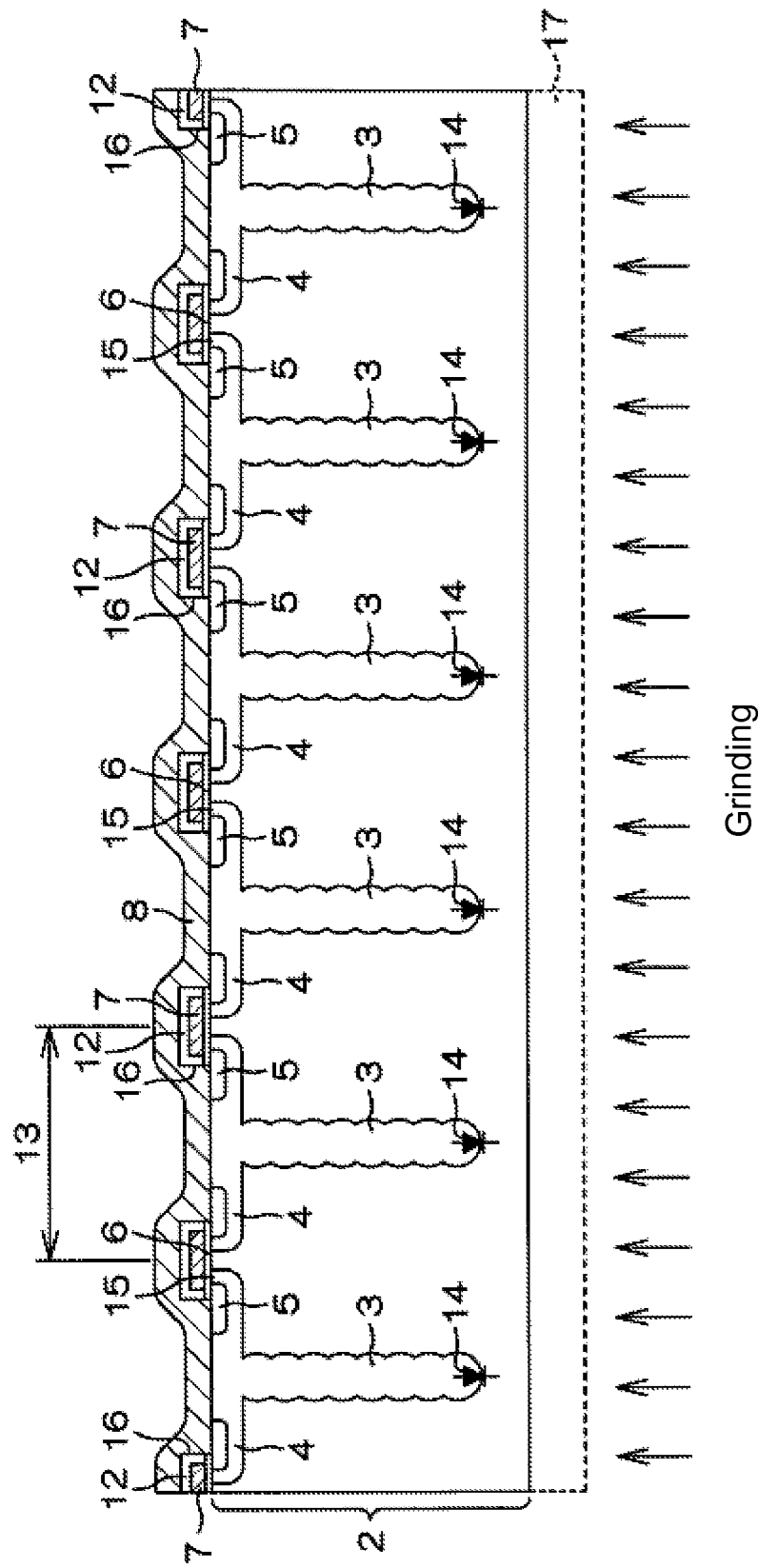
FIG. 3D is a view of the next step after the step in FIG. 3C.

Next, as shown in FIG. 3D, a grinder is used to grind the substrate 17 from the rear surface thereof, for example. This grinding is performed so as to completely remove the substrate 17, expose the rear surface of the n⁻ base layer 2, and to leave the thickness of the n⁻ base layer 2 at at least 30 μm directly below the p-type columnar regions 3. After grinding, the rear surface of the n⁻ base layer 2 is spin etched, which gives the rear surface a mirror finish.

In this manner, the n⁻ base layer 2 is supported by the substrate 17 through several of the manufacturing steps; thus, it is possible to make the transport and handling of the n⁻ base layer 2 easier. It is possible to consecutively perform the grinding of the n⁻ base layer 2 after the grinding of the substrate 17, thus allowing the thickness of the n⁻ base layer 2 directly under the p-type columnar regions 3 to be adjusted with ease.

Figure 3E:
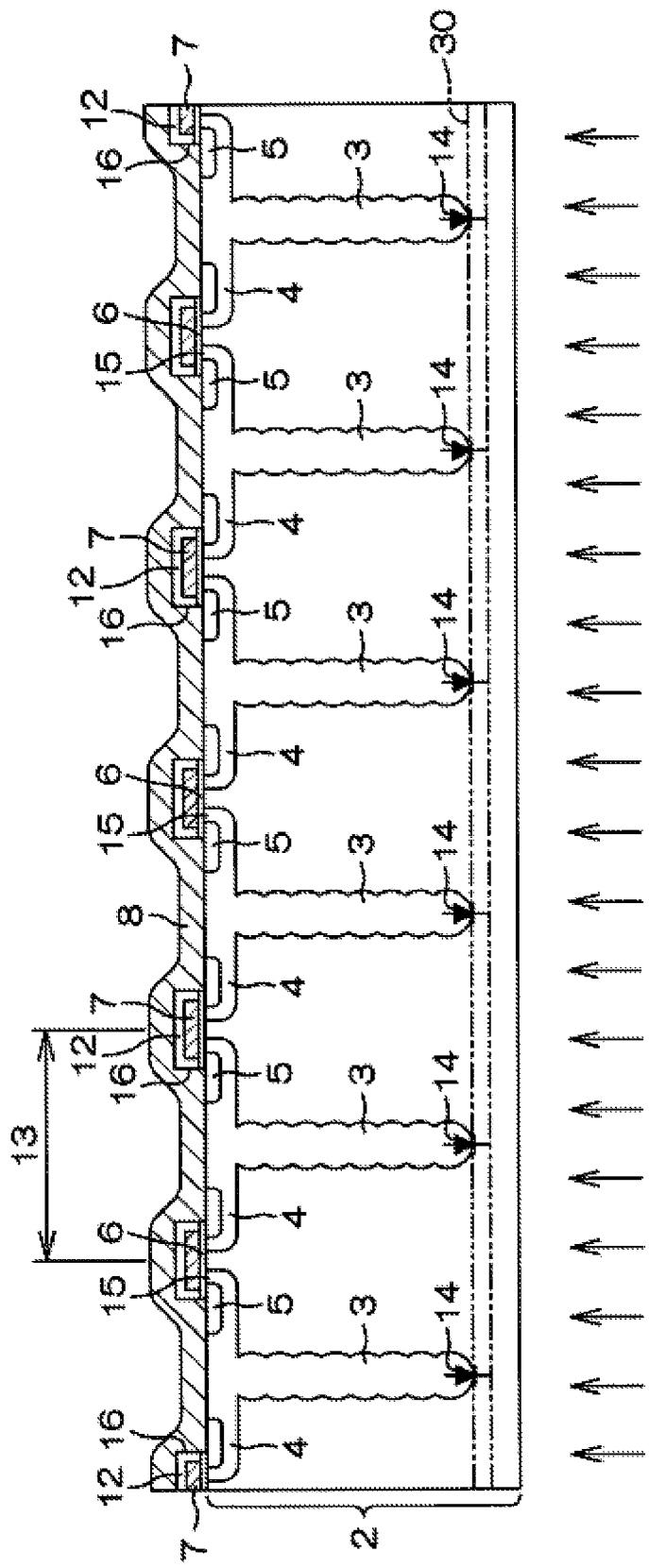
FIG. 3E is a view of the next step after the step in FIG. 3D.

Thereafter, as shown in FIG. 3E, a first heavy particle irradiation is performed from the rear surface of the n⁻ base layer 2. Material with a relatively small mass, such as protons, are used as the heavy particles (first heavy particles) for the irradiation at this time. Thereafter, low-temperature heat treatment (low-temperature annealing) is performed. This turns the heavy particles used for irradiation into donors. When using protons as the heavy particles, it is possible to turn the protons that have been introduced into donors by a heat treatment at 350° C. to 450° C. (360° C., for example) for 30 minutes to 90 minutes (60 minutes, for example).

The depletion layer reducing area 30 is formed in this manner by the first heavy particle irradiation and the following low-temperature heat treatment. If the energy during irradiation with the first heavy particles is increased, then the depth of the first heavy particles will be greater, thus forming the depletion layer reducing area 30 at a location that is far from the rear surface of the n⁻ base layer 2. If the energy is decreased, then the depth of the heavy particles will be less, thus forming the depletion layer reducing area 30 at a location that is close to the rear surface of the n⁻ base layer 2. Therefore, the energy for the first heavy particle irradiation is set in accordance with the placement of the depletion layer reducing area 30. The energy for the first heavy particle irradiation is set such that at least a portion of the depletion layer reducing area 30 is located between the bottom of the p-type columnar regions 3 and the p⁺ collector layers 10 (approximately 8 MeV, for example). The dose of the first heavy particles (protons, for example) may be approximately $5 \times 10^{13}$ ions/cm² to $1 \times 10^{14}$ ions/cm², for example.

Figure 3F:
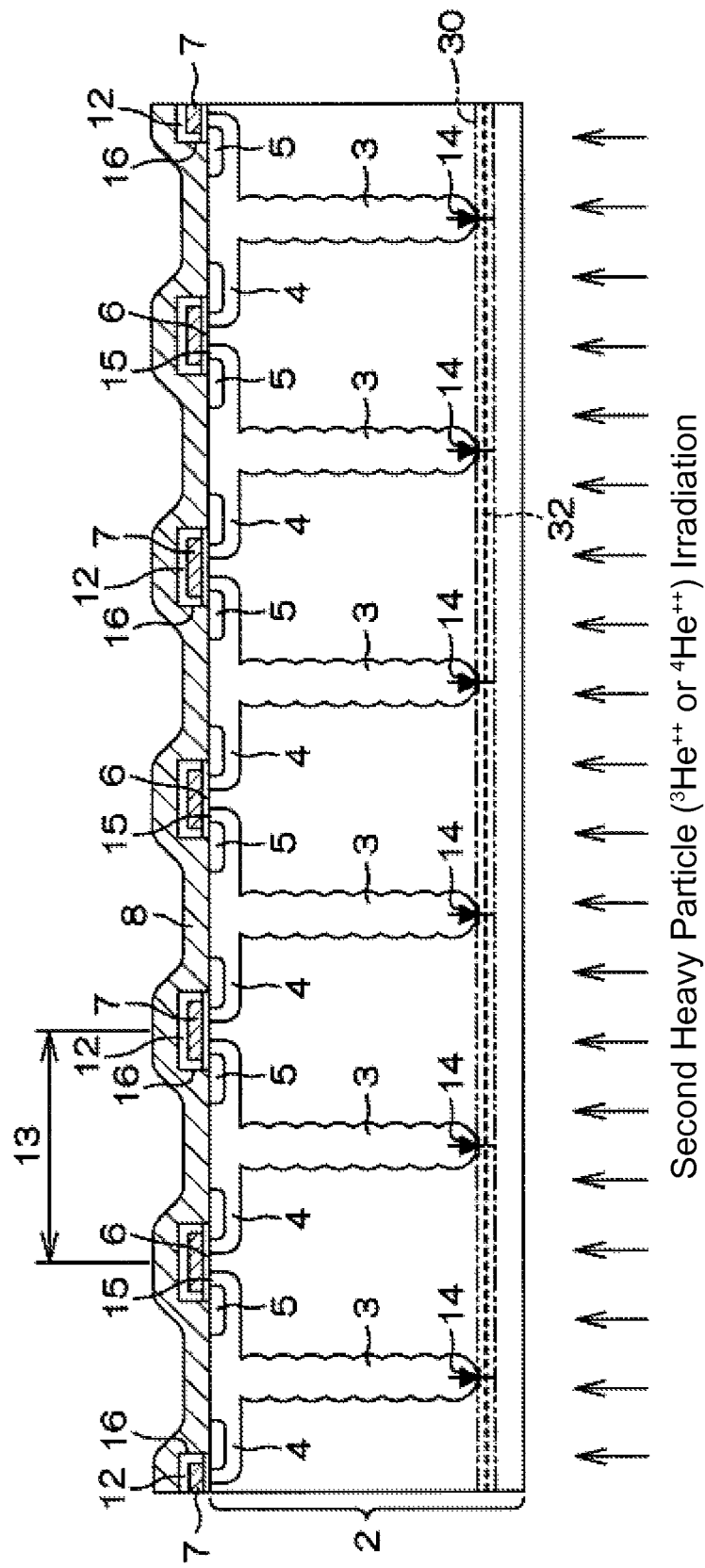
FIG. 3F is a view of the next step after the step in FIG. 3E.

Next, as shown in FIG. 3F, a second heavy particle irradiation is performed from the rear surface of the n⁻ base layer 2. Materials with a relatively large mass, such as helium nuclei ($^3$He$^{++}$ or $^4$He$^{++}$), are used as the heavy particles (second heavy particles) for the irradiation at this time. Thereafter, low-temperature heat treatment (low-temperature annealing) is performed. This activates the second heavy particles used for irradiation. When using helium nuclei ($^3$He$^{++}$ or $^4$He$^{++}$) as the second heavy particles, it is possible to activate the helium nuclei that have been introduced by a heat treatment at 320° C. to 380° C. (350° C., for example) for 30 minutes to 120 minutes (60 minutes, for example).

The trap level area 32 is formed in this manner. If the energy during irradiation with the second heavy particles is made increased, then the depth of the second heavy particles will be greater, thus forming the trap level area 32 at a location that is far from the rear surface of the n⁻ base layer 2. If the energy is decreased, then the depth of the second heavy particles will be less, thus forming the trap level area 32 at a location that is close to the rear surface of the n⁻ base layer 2. Therefore, the energy for irradiation of the second heavy particles is set in accordance with the placement of the trap level area 32. The energy for the second heavy particle irradiation is set such that the trap level area 32 is located between the bottom of the p-type columnar regions 3 and the p⁺ collector layers 10 (approximately 23 MeV, for example). The dose of the heavy particles may be approximately $5 \times 10^{10}$ ions/cm² to $5 \times 10^{12}$ ions/cm², for example.

Figure 3G:
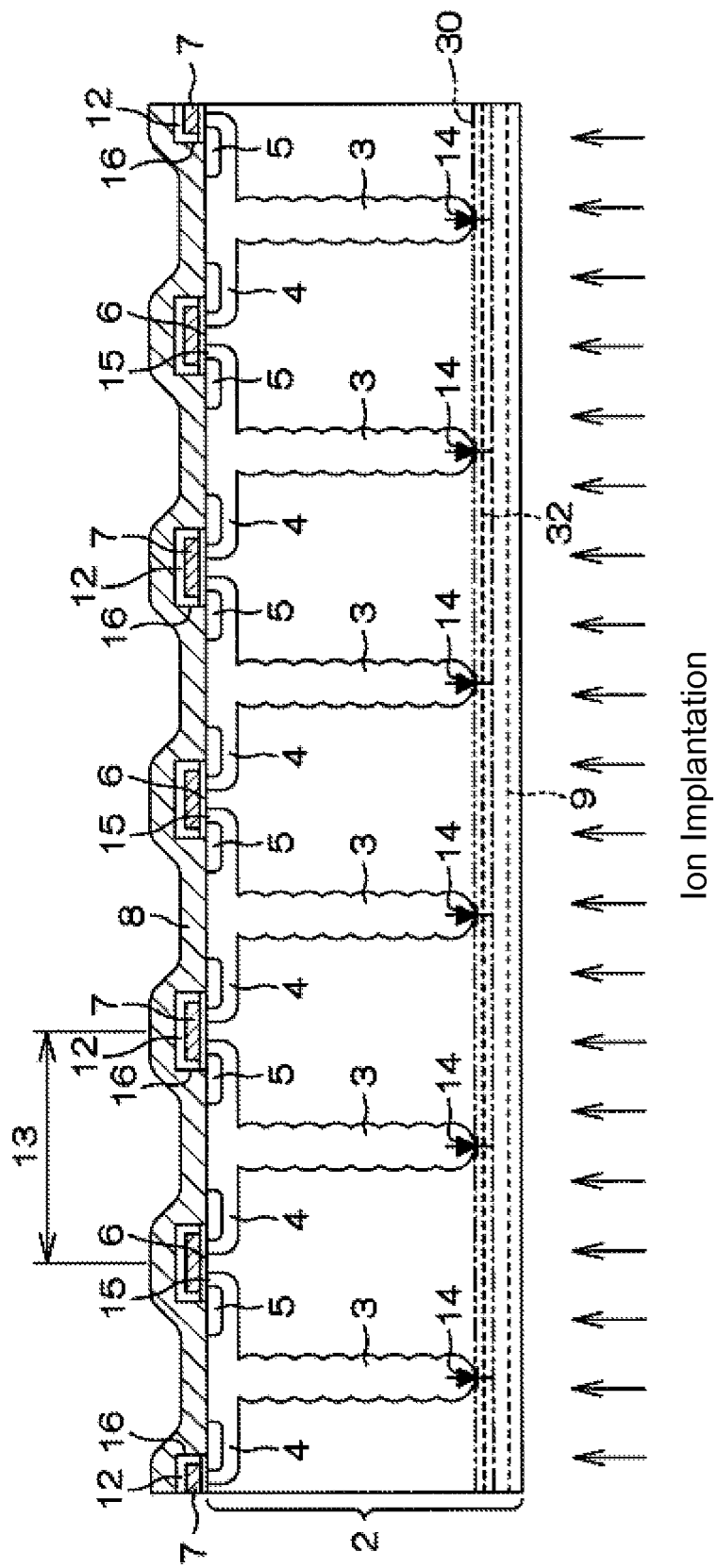
FIG. 3G is a view of the next step after the step in FIG. 3F.

Next, as shown in FIG. 3G, the n⁺ contact layer 9 is formed by implanting an n-type impurity (As ions at 30 keV, $1.0 \times 10^{15}$ cm$^{-2}$, implantation at 0°) in the entire rear surface of the n⁻ base layer 2 and then performing an annealing treatment.

Figure 3H:
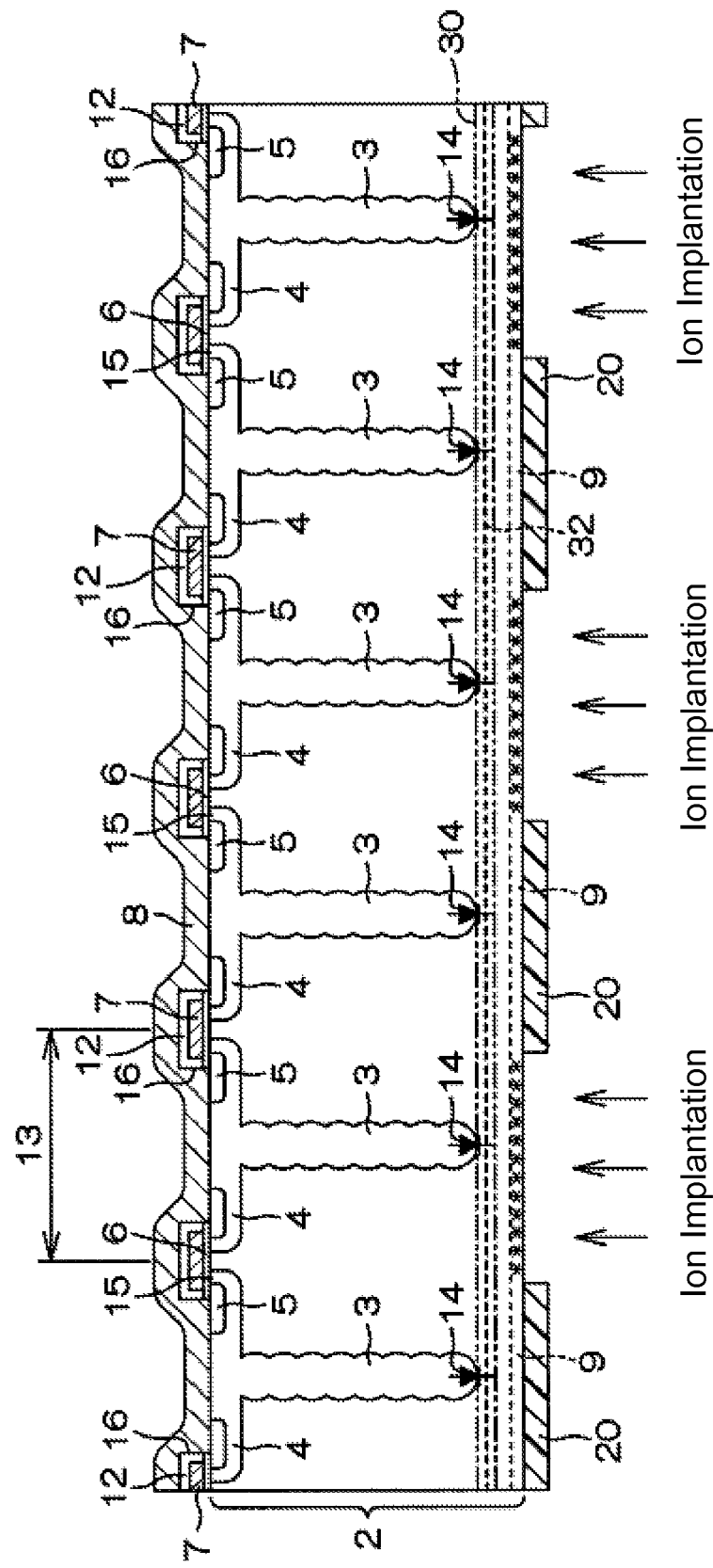
FIG. 3H is a view of the next step after the step in FIG. 3G.

Next, as shown in FIG. 3H, a photoresist 20 is formed by selectively exposing the rear surface of the n⁻ base layer 2. First, B ions are implanted through this photoresist 20 at 100 keV, $1.0 \times 10^{15}$ cm$^{-2}$ at a 7° tilt angle. Next, BF$_2$ ions are implanted at an energy that is less than in the step of implanting the B ions, or more specifically, at 30 keV, $1.0 \times 10^{15}$ cm$^{-2}$, 7° (same tilt angle). During this time, it is possible to avoid channeling in which the ions deeply penetrate the n⁻ base layer 2 by the B ions and BF$_2$ ions being implanted at an incline with a prescribed tilt angle, rather than implanting perpendicular to the rear surface of the n⁻ base layer 2. Thereafter, the photoresist 20 is removed by ashing, for example.

Figure 3I:
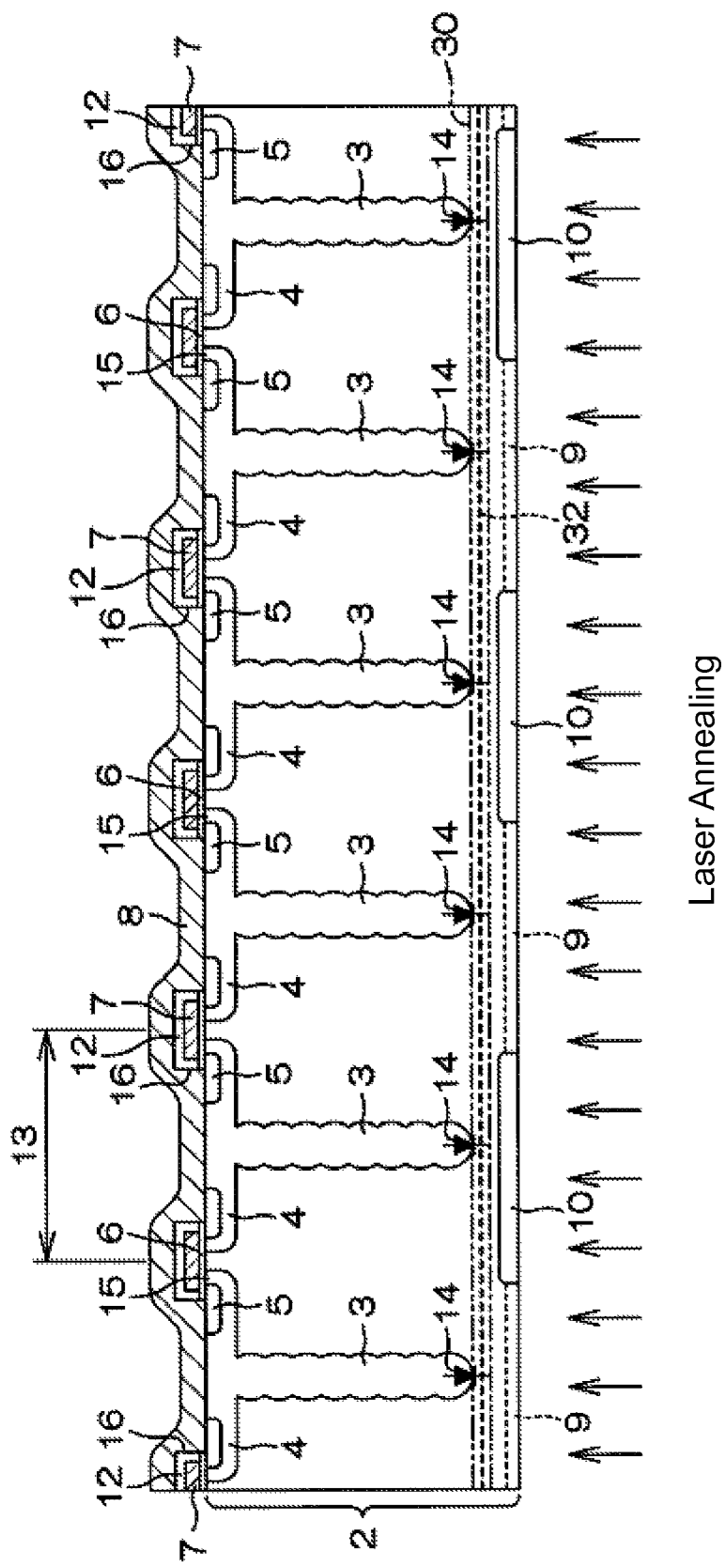
FIG. 3I is a view of the next step after the step in FIG. 3H.

Next, as shown in FIG. 3I, the B ions and BF$_2$ ions implanted in the previous step are activated by performing a laser annealing treatment on the n⁻ base layer 2. This changes some of the conductivity types of the n⁺ contact layer 9 from n-type to p-type and forms the p⁺ collector layers 10.

At this time, high-temperature (approximately 1500° C., for example) annealing is not performed, thus making it possible to prevent the source electrode 8 from melting. In other words, metal parts such as the source electrode 8 that melt easily in a high temperature environment can be made before this annealing treatment. Therefore, a large portion or all of the structure on the surface side of the n⁻ base layer 2 can be made before the annealing treatment. As a result, the front and rear surface of the n⁻ base layer 2 do not have to be reversed multiple times, thereby making it possible to improve manufacturing efficiency.

Figure 3J:
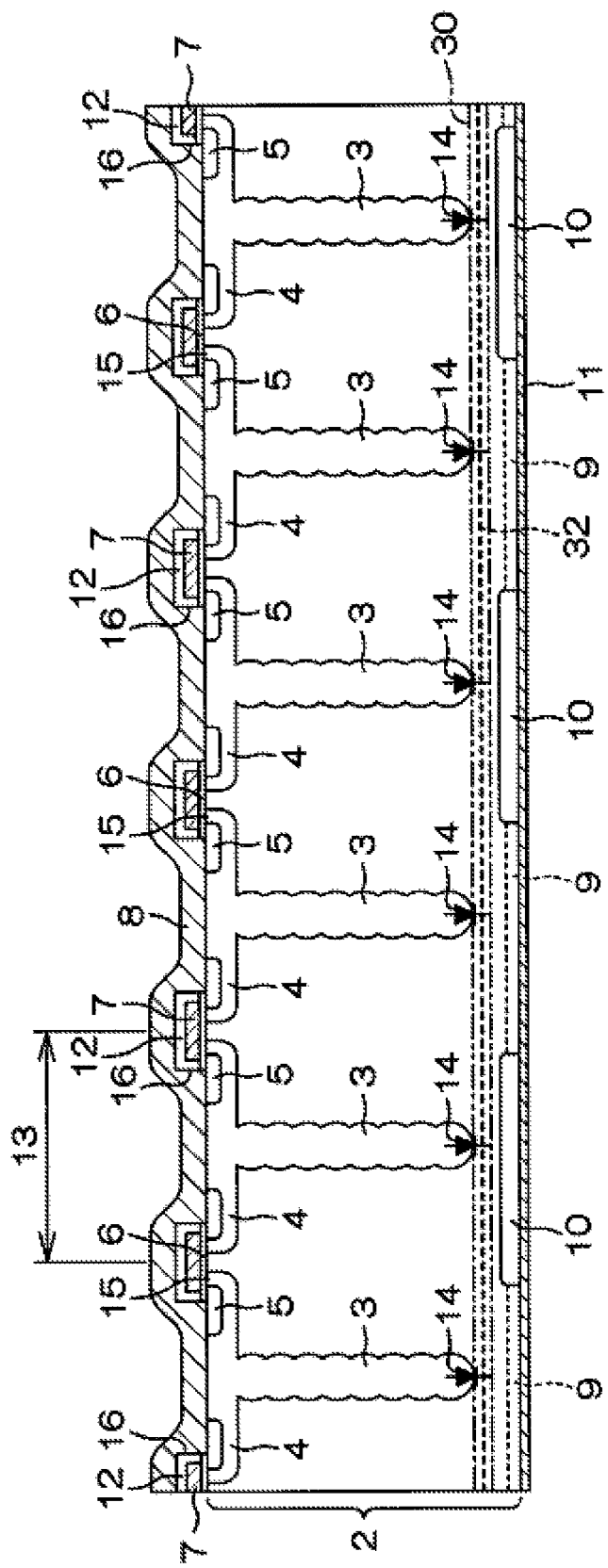
FIG. 3J is a view of the next step after the step in FIG. 3I.

Next, as shown in FIG. 3J, the drain electrode 11 is formed on the rear surface of the n⁻ base layer 2 and a heat treatment for forming an ohmic junction through alloying is performed as necessary. The forming of the drain electrode 11 may be a step of sputtering Ti, Ni, Au, and Ag in this order.

The semiconductor device 1 in FIGS. 1 and 2 can be obtained through the steps described above.

<Modification Examples of Layout of p-Type Columnar Regions 3 and p⁺ Collector Layers 10>

Next, modification examples of the layout of the p-type columnar regions 3 and p⁺ collector layers 10 will be described with reference to FIGS. 4 to 7. First, in FIGS. 4 and 5, a modification example of the layout of the p⁺ collector layers 10 in relation to the striped p-type columnar regions 3 is shown.

Figure 4:
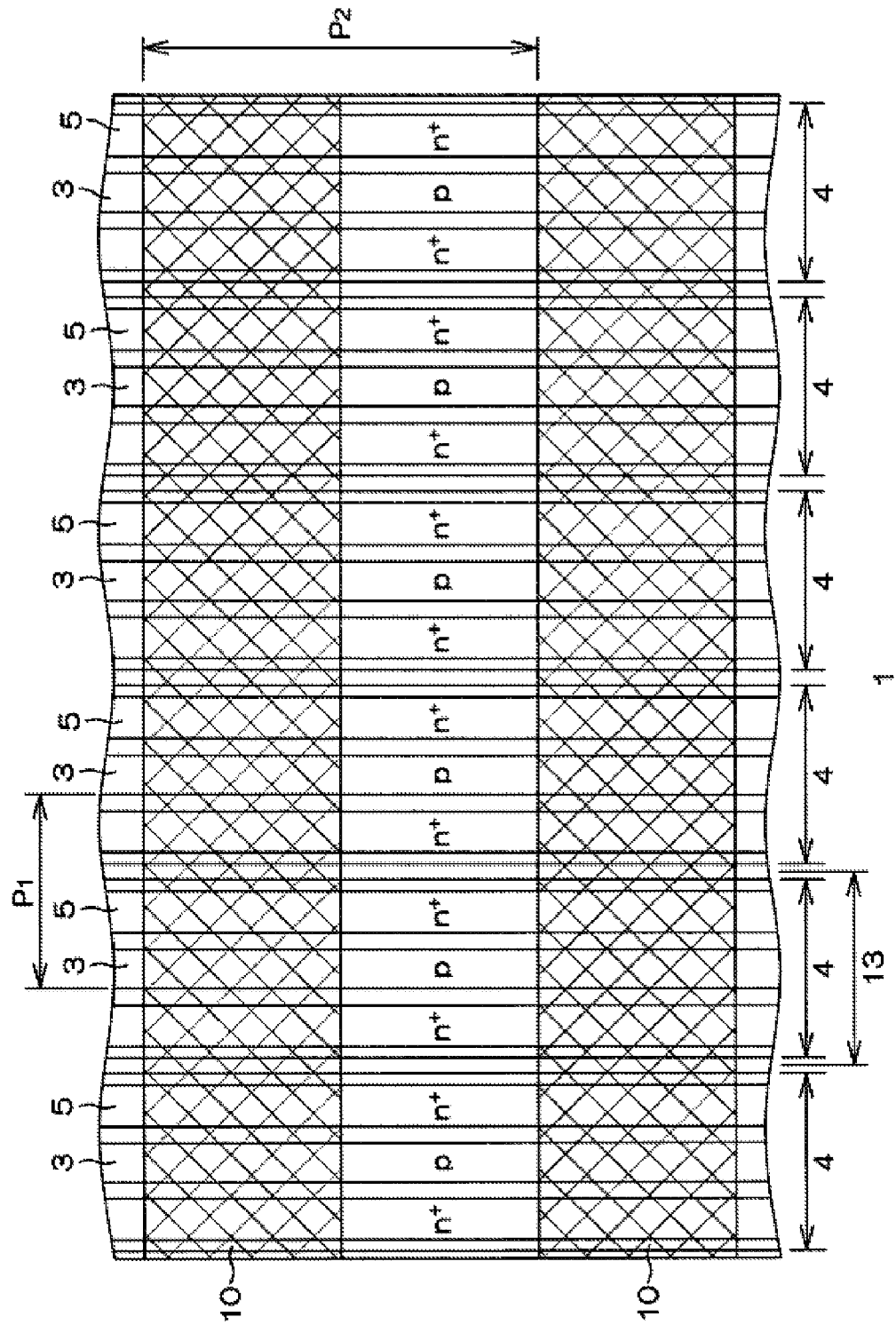
FIG. 4 is a modification example of the layout of the p-type columnar regions and $p^+$ collector layers.

Specifically, in FIG. 4, the p⁺ collector layers 10 are formed in stripes that intersect the stripe shaped p-type columnar regions 3 in a plan view. More specifically, the p⁺ collector layers 10 are formed in stripe shapes orthogonal to the p-type columnar regions 3. With this configuration in FIG. 4, the respective p⁺ collector layers 10 are formed in a continuous manner across the stripe-shaped p-type columnar regions 3 and evenly face all of the p-type columnar regions 3. As a result, it is possible to eliminate variation in area of the p⁺ collector layers 10 between the cells 13; therefore, variation in on-resistance between the cells 13 can be minimized. In FIG. 4, these p-type columnar regions 3 and p⁺ collector layers 10 are shown as being orthogonal to each other as an example of the stripe-shaped p⁺ collector layers 10 intersecting the p-type columnar regions 3, but the p⁺ collector layers 10 may intersect the p-type columnar regions 3 at a tilted angle such as an acute angle or an obtuse angle.

Figure 5:
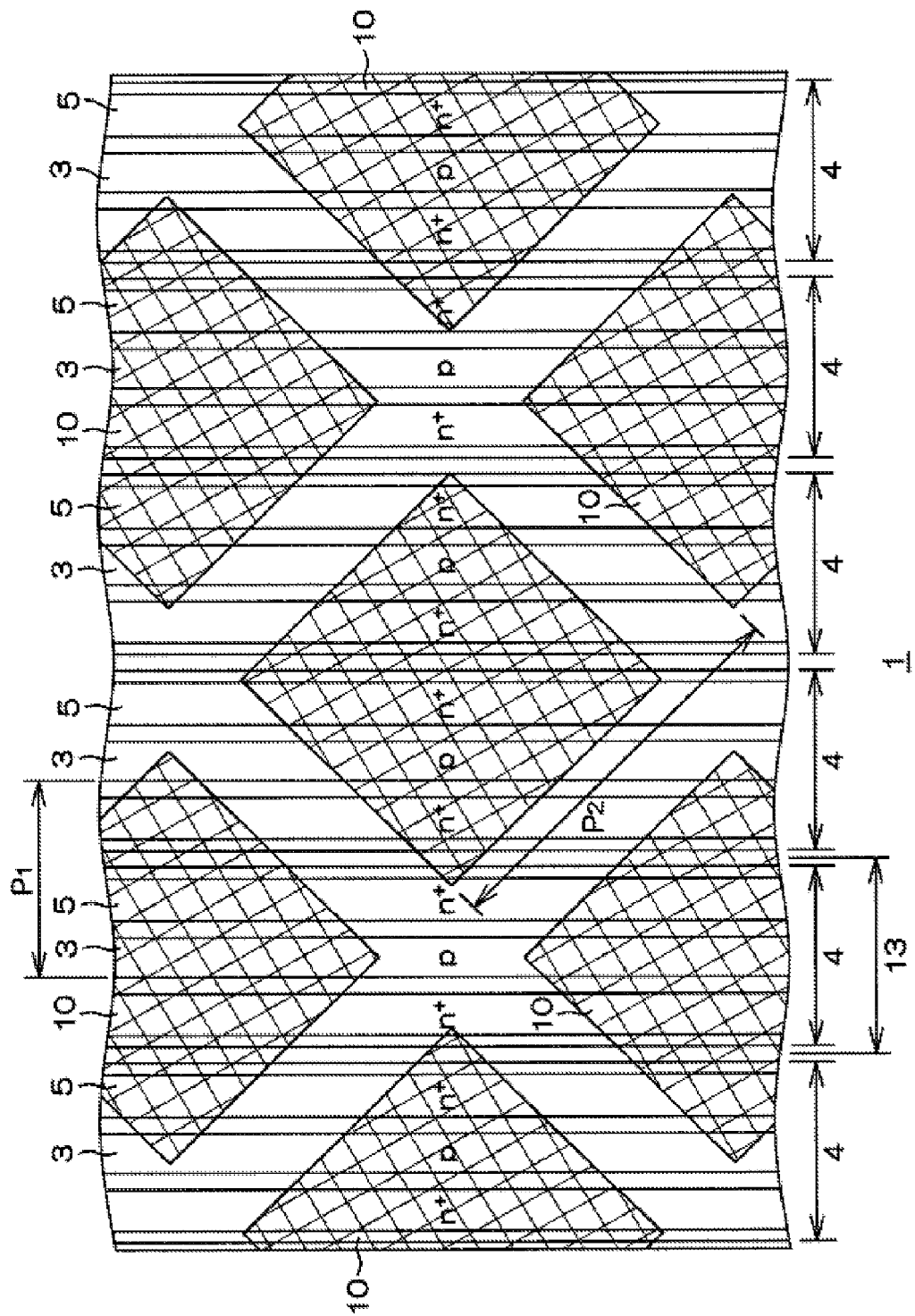
FIG. 5 is a modification example of the layout of the p-type columnar regions and $p^+$ collector layers.

In FIG. 5, the p⁺ collector layers 10 are arranged apart from each other in a grid shape in a plan view, and the respective p⁺ collector layers 10 are formed in diamond shapes that intersect (go across) the p-type columnar regions 3 so as to straddle a plurality of the adjacent p-type columnar regions 3. The shape of the respective p⁺ collector layers 10 may be a diamond shape as shown in FIG. 5, or may be another polygonal or circular shape. With this configuration in FIG. 5, the p⁺ collector layers 10 are not formed in a continuous manner across the stripe shaped p-type columnar regions 3 as in the configuration in FIG. 4 but are arrayed in a periodic grid shape, thus making it possible to equally face all of the p-type columnar regions 3 in a manner similar to the configuration in FIG. 4. As a result, it is possible to eliminate variation in area of the p⁺ collector layers 10 between the cells 13; therefore, variation in on-resistance between the cells 13 can be reduced.

Figure 6:
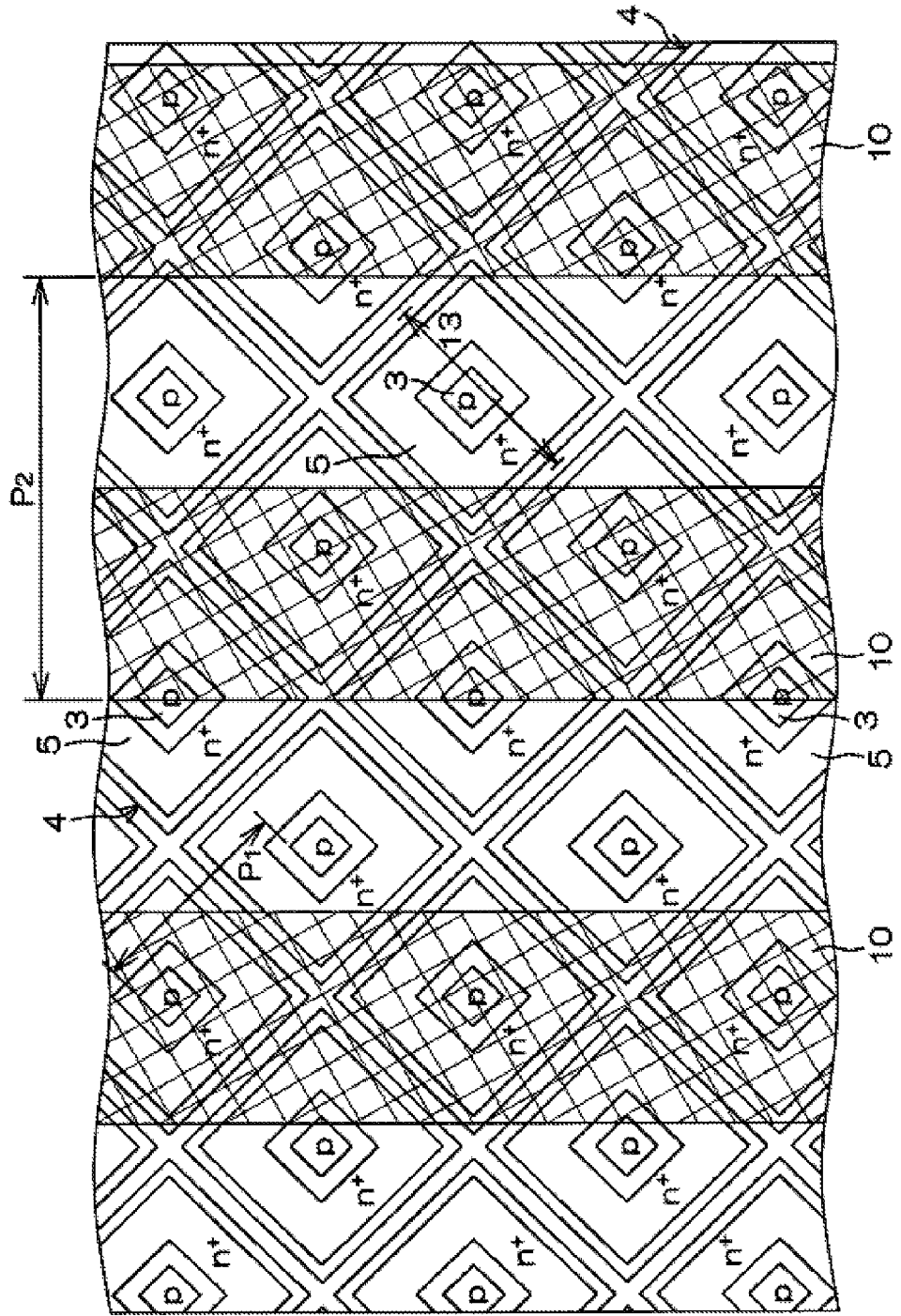
FIG. 6 is a modification example of the layout of the p-type columnar regions and $p^+$ collector layers.
Figure 7:
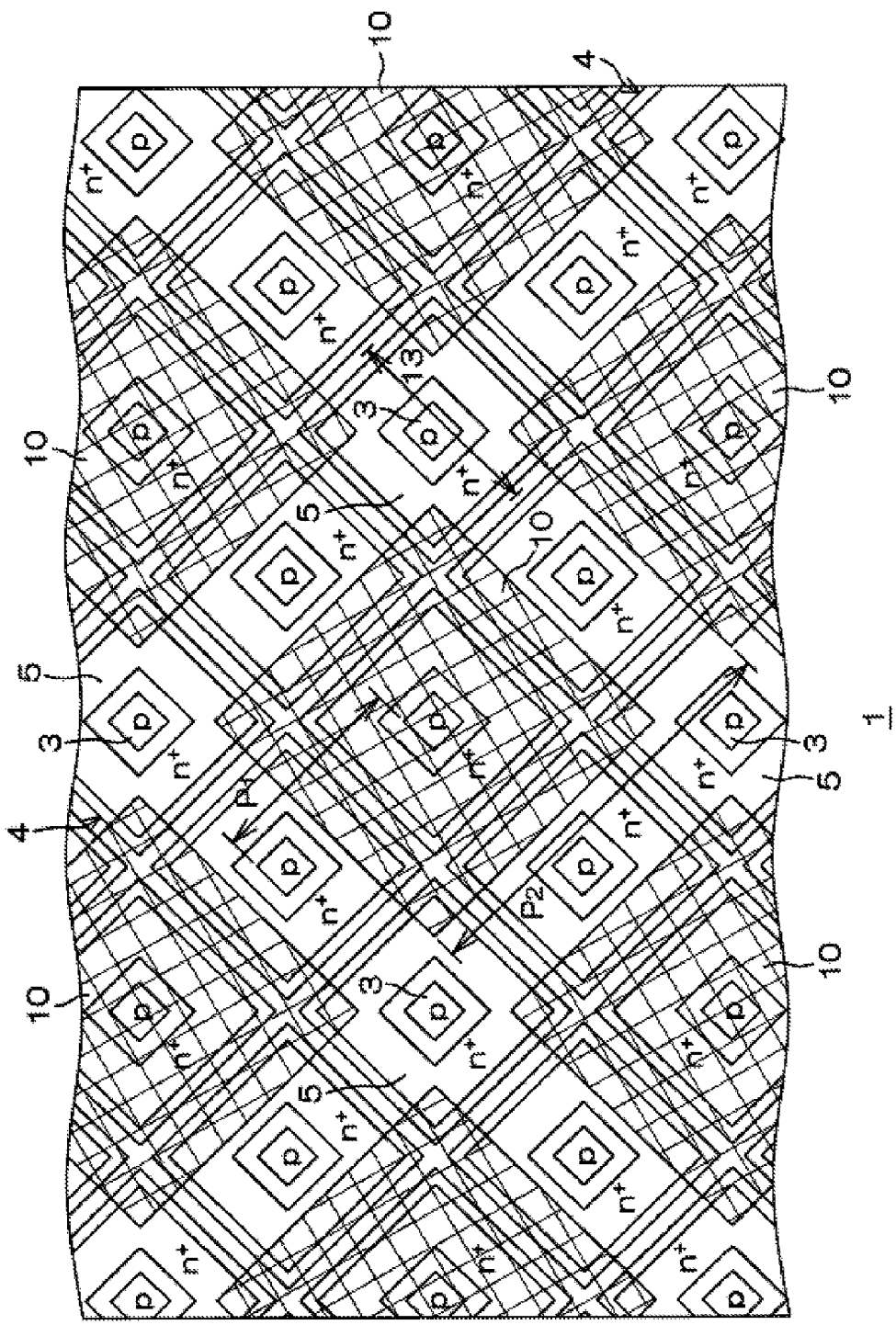
FIG. 7 is a modification example of the layout of the p-type columnar regions and $p^+$ collector layers.

Next, in FIGS. 6 and 7, a modification example is shown of the layout of the p⁺ collector layers 10 in relation to diamond-shaped p-type columnar regions 3. In other words, in FIGS. 6 and 7, the p-type columnar regions 3 are formed in the inner areas of the respective p-type base layers 4 that are arranged apart from each other in a grid shape on the surface of the n⁻ base layer 2. The n⁺ source layers 5 are formed so as to encompass the respective p-type columnar regions 3. The shape of the respective p-type base layers 4 may be a diamond shape as shown in FIGS. 6 and 7, or may be another polygonal or circular shape. The shape of the p-type columnar regions 3 may also be a diamond shape in accordance with the respective p-type base layers 4, or may be another polygonal or circular shape.

The p⁺ collector layers 10 are formed in stripe shapes parallel to each other in FIG. 6, and in FIG. 7 are formed in diamond shapes larger than the p-type base layers 4. In FIG. 7, the p⁺ collector layers 10 are arranged apart from each other in a grid shape in a plan view.

The modification examples shown in FIGS. 4 to 7 are merely examples, and the layout of the p-type columnar regions 3 and p⁺ collector layers 10 can be modified as appropriate within the scope of the present invention.

<Modification Examples of Manufacturing Steps of p-Type Columnar Regions 3>

Next, modification examples of manufacturing steps of the p-type columnar regions 3 will be described with reference to FIGS. 8A to 8D. In the previous explanations, as shown in FIGS. 3A to 3C, the p-type columnar regions 3 are formed by an annealing treatment after the plurality of n-type semiconductor layers 19 has been formed by multi-epitaxial growth while implanting a p-type impurity, which is after the initial base layer 18 is formed. The p-type columnar regions 3, however, may be formed by the steps in FIGS. 8A to 8D, for example.

Figure 8A:
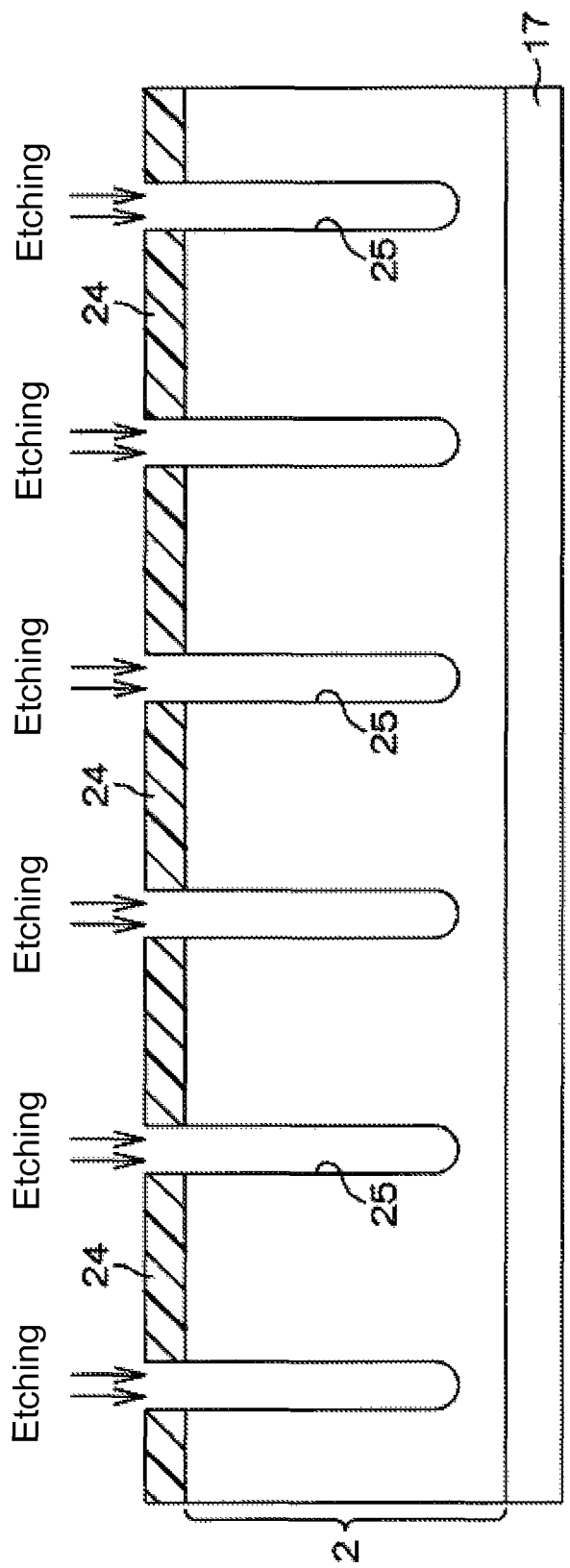
FIG. 8A is a modification example of a manufacturing step of the p-type columnar regions in FIG. 2.

Specifically, first the n⁻ base layer 2 is epitaxially grown on the substrate 17. Next, as shown in FIG. 8A, a hard mask 24 is formed on the n⁻ base layer 2. After the hard mask 24 is patterned, the n⁻ base layer 2 is dry etched through this hard mask 24. This forms trenches 25 in the n⁻ base layer 2.

Figure 8B:
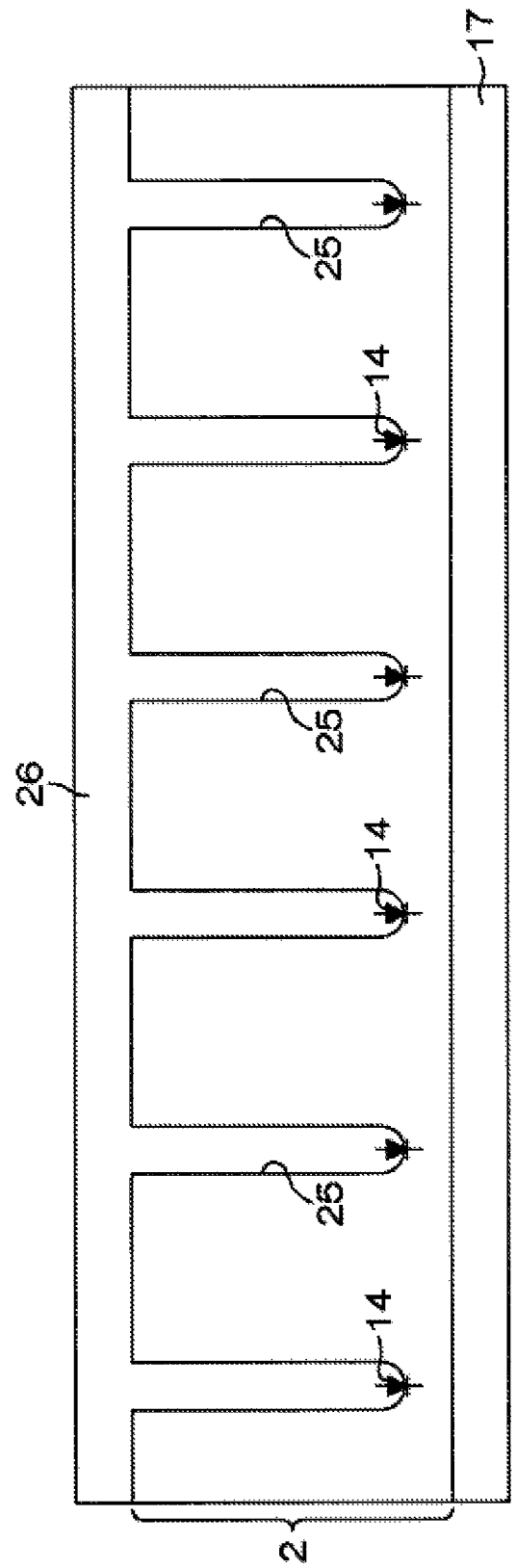
FIG. 8B is a view of the next step after the step in FIG. 8A.

Next, as shown in FIG. 8B, the hard mask 24 is removed, and thereafter the p-type semiconductor layer 26 is epitaxially grown from the inside of the trenches 25 until the surface of the n⁻ base layer 2 is covered.

Figure 8C:
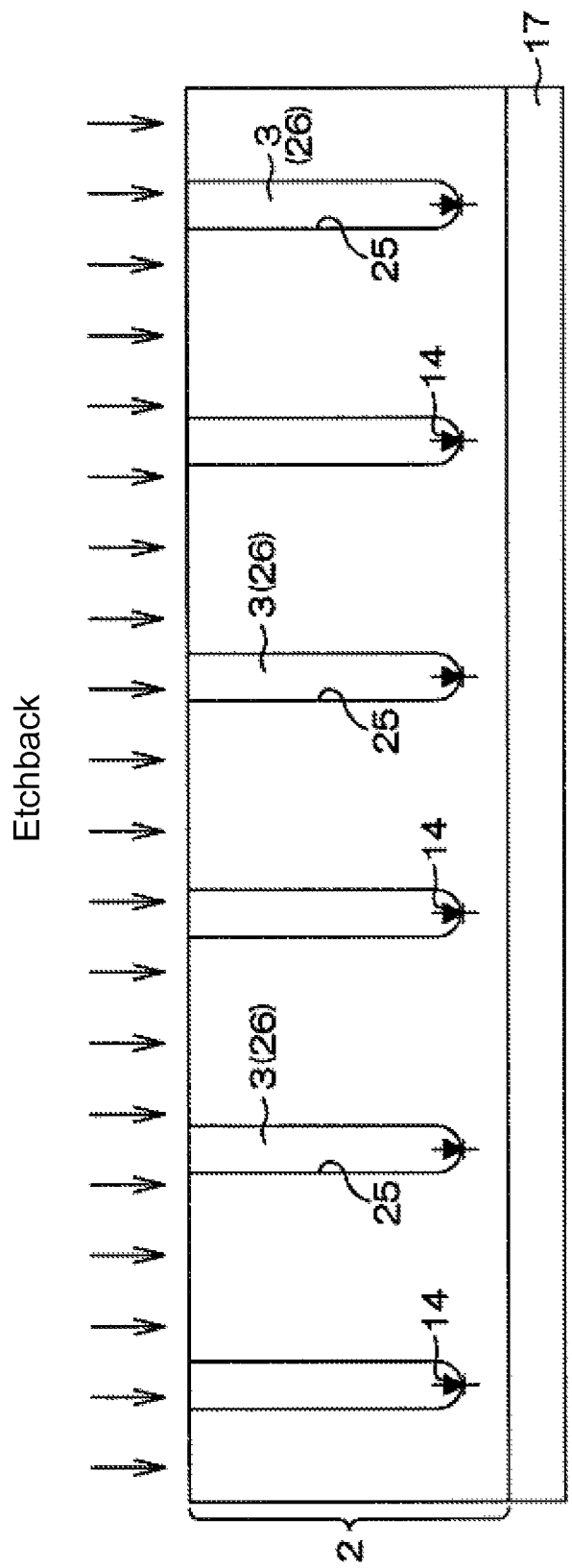
FIG. 8C is a view of the next step after the step in FIG. 8B.

Next, as shown in FIG. 8C, the p-type semiconductor layer 26 outside the trenches 25 covering the surface of the n⁻ base layer 2 is removed by etchback, for example. This forms the p-type columnar regions 3, which are embedded in the trenches 25.

Figure 8D:
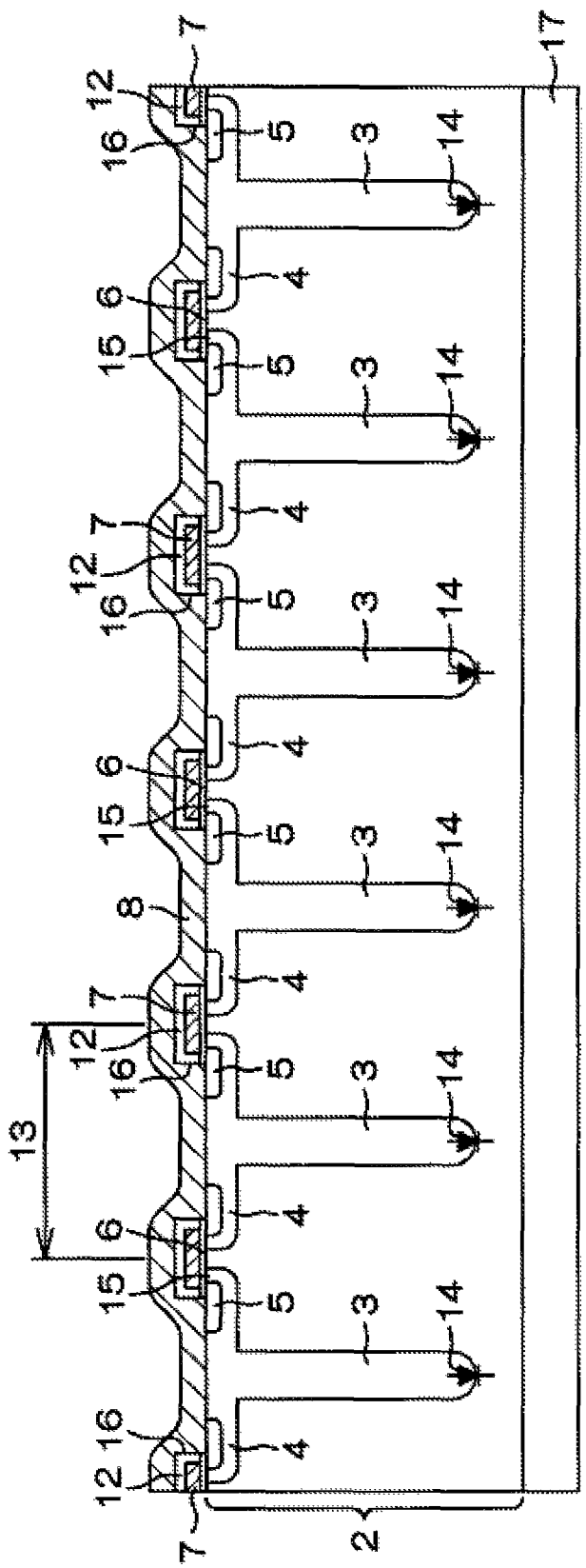
FIG. 8D is a view of the next step after the step in FIG. 8C.

Thereafter, as shown in FIG. 8D, steps similar to FIG. 3C and steps similar to FIGS. 3D to 3J may be performed.

With this method, the p-type columnar regions 3 are formed by embedding the p-type semiconductor layer 26 in the trenches 25, thus allowing the side faces of the respective p-type columnar regions 3 along the thickness direction of the n⁻ base layer 2 to be made flat along the same direction.

Embodiment 2

Figure 9:
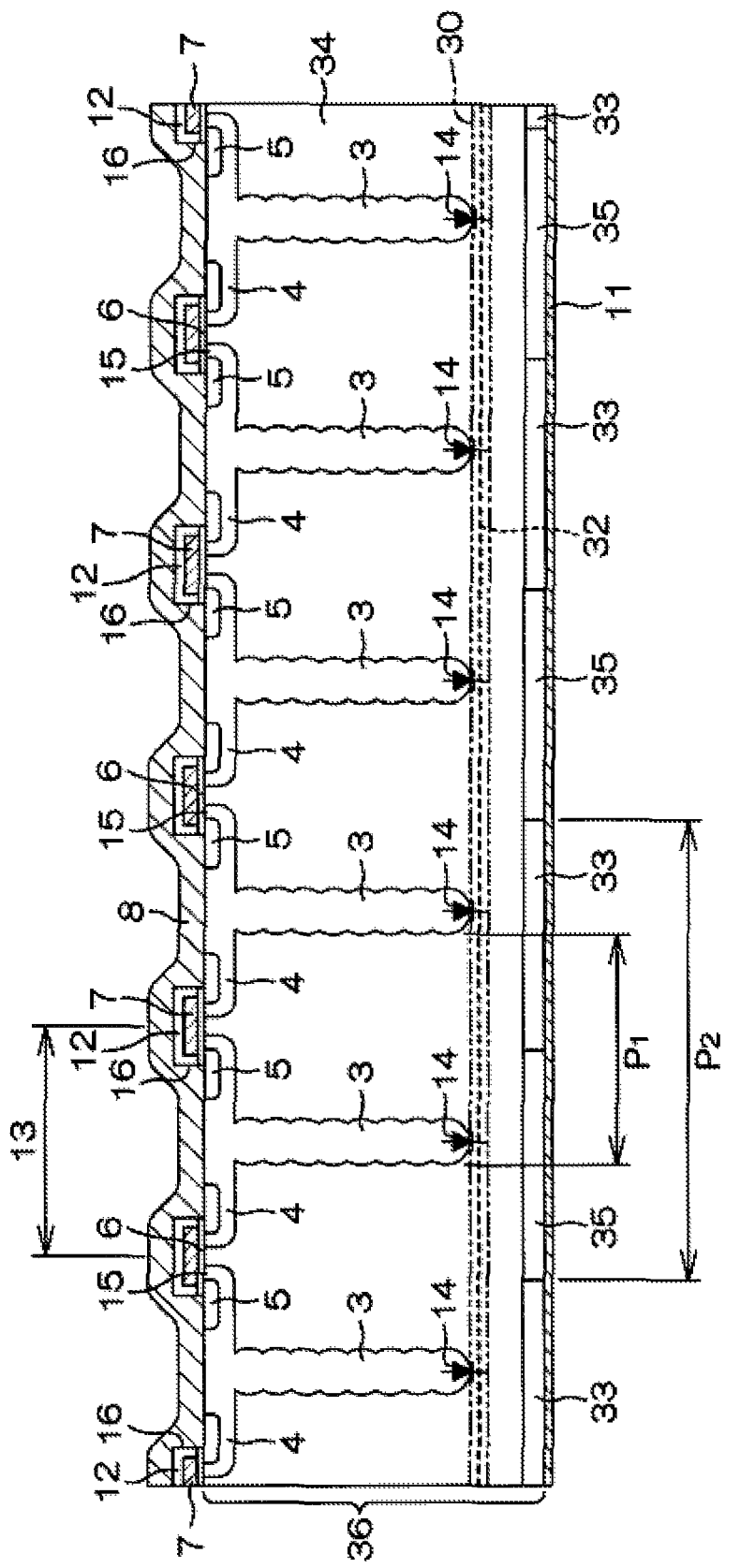
FIG. 9 is a schematic plan view of a semiconductor device according to Embodiment 2 of the present invention.

FIG. 9 is a schematic cross-sectional view of a semiconductor device 31 according to Embodiment 2 of the present invention. In FIG. 9, portions corresponding to the portions in FIG. 2 are assigned the same reference characters and descriptions thereof will be omitted.

The semiconductor device 31 in FIG. 9 includes an n-type base layer 36 instead of an n⁻ base layer 2 made of a single layer. This n-type base layer 36 is made of a multilayer structure of n⁺ substrate 33 and an n⁻ drift layer 34 formed on the n⁺ substrate 33. In the n-type base layer 36, the n⁻ drift layer 34 has a relatively low impurity concentration, and the n⁺ substrate 33 has a relatively high impurity concentration. In this manner, the n⁺ substrate 33 both supports the n⁻ drift layer 34 and acts as the n⁺ contact layer 9 described above.

p⁺ collector layers 35 are formed so as to reach the rear surface of the n⁻ drift layer 34 by penetrating the respective n⁺ substrate 33 in the thickness direction from the rear surface of the n⁺ substrate 33. This exposes the p⁺ collector layers 35 to the rear surface of the n⁺ substrate 33. The p⁺ collector layers 35 are similar to the above-mentioned p⁺ collector layers in terms of a pitch P₂, impurity concentration, shape, and the like.

FIGS. 10A to 10E show the sequence of a portion of the steps of manufacturing the semiconductor device 31 in FIG. 9.

Figure 10A:
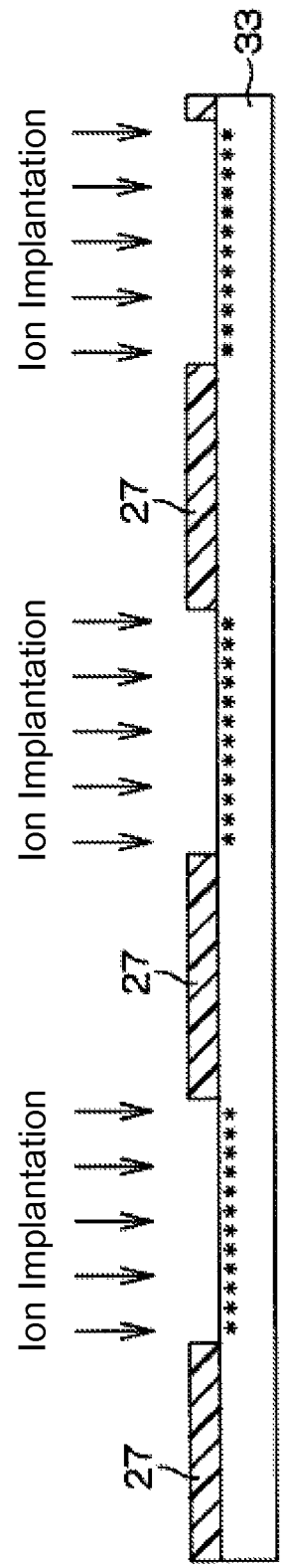
FIG. 10A is a view of a part of a manufacturing step of the semiconductor device in FIG. 9.

To manufacture this semiconductor device 31, as shown in FIG. 10A, first a photoresist 27 selectively exposing the surface of the n⁺ substrate 33 is formed on the n⁺ substrate 33 (an n⁺ silicon substrate, for example). Ion implantation of a p-type impurity is performed through this photoresist 27. The ion implantation may be performed according to the step in FIG. 3H. After ion implantation, the photoresist 27 is removed by ashing, for example.

Figure 10B:
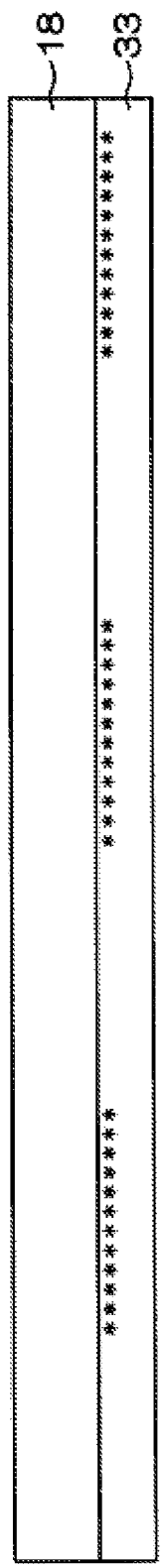
FIG. 10B is a view of the next step after the step in FIG. 10A.
Figure 10C:
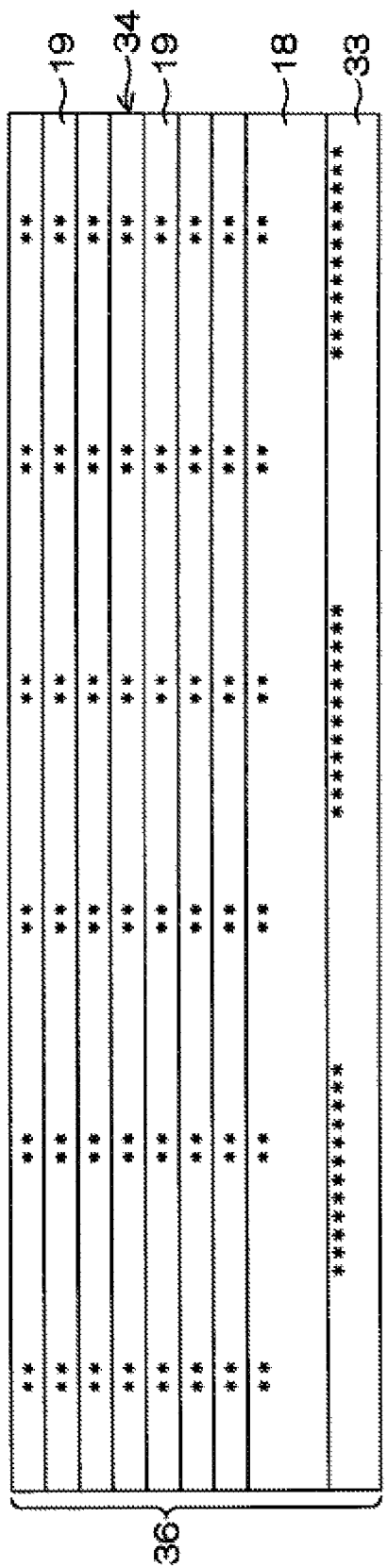
FIG. 10C is a view of the next step after the step in FIG. 10B.

Next, as shown in FIGS. 10B and 10C, an initial base layer 18 is formed on the n⁺ substrate 33 in a manner similar to the steps in FIGS. 3A and 3B, and thereafter a plurality of n-type semiconductor layers 19 are stacked to form the n⁻ drift layer 34. This forms the n-type base layer 36, which is made of the n⁺ substrate 33 and the n⁻ drift layer 34.

Figure 10D:
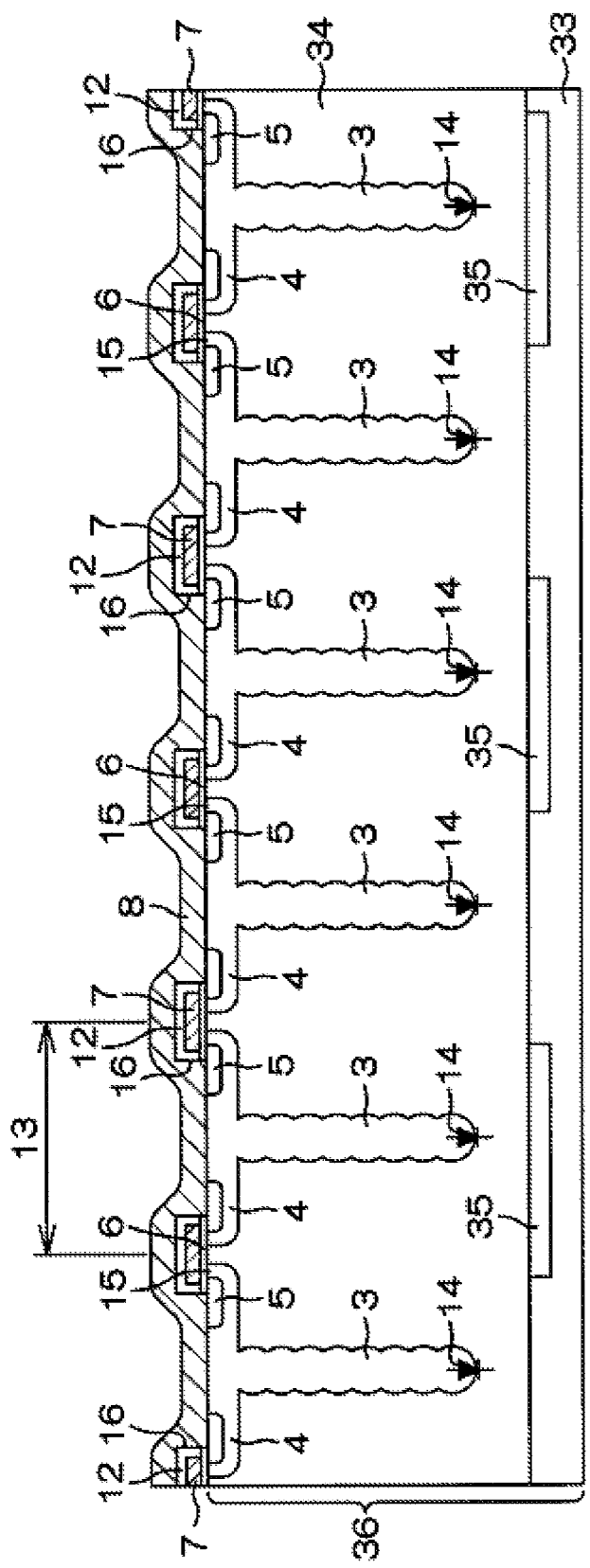
FIG. 10D is a view of the next step after the step in FIG. 10C.

Next, as shown in FIG. 10D, an annealing treatment (1000° C. to 1200° C.) is performed for drive diffusion of the p-type impurity in the plurality of n-type semiconductor layers 19 and the p-type impurity implanted into the n⁺ substrate 33. This forms p-type columnar regions 3 and the p⁺ collector layers 35 at the same time. Next, p-type base layers 4, n⁺ source layers 5, gate insulating films 6, gate electrodes 7, and the like are formed in a manner similar to the step in FIG. 3C.

Figure 10E:
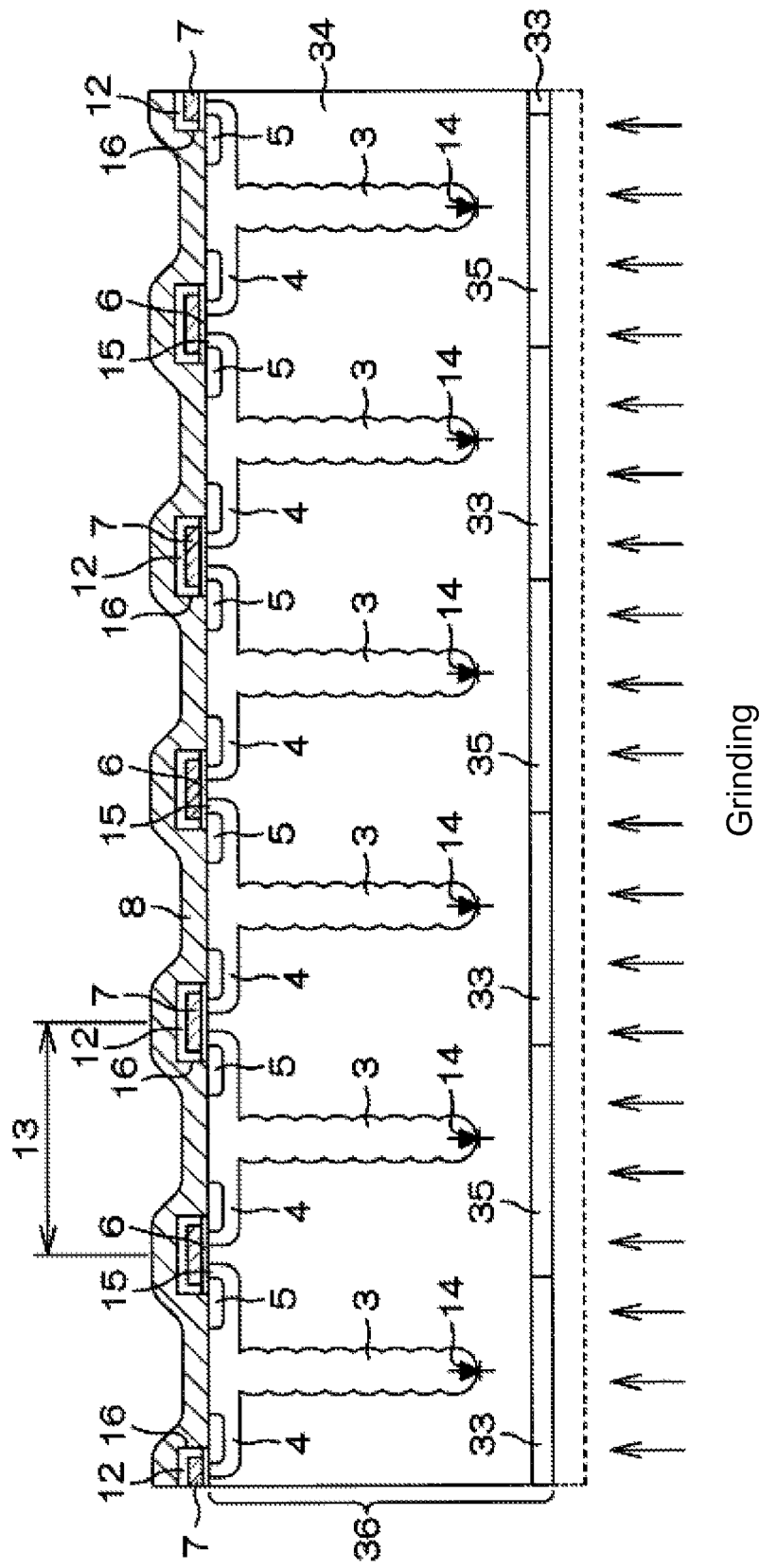
FIG. 10E is a view of the next step after the step in FIG. 10D.

Next, as shown in FIG. 10E, grinding is performed on the n⁺ substrate 33 from the rear surface side thereof using a grinder, for example, in a manner similar to the step in FIG. 3D. This grinding is continued until the p⁺ collector layers 35 are exposed from the rear surface of the n⁺ substrate 33. After grinding, the rear surface of the n⁺ substrate 33 is spin etched, which gives the rear surface of the n⁺ substrate 33 a mirror finish.

Thereafter, the semiconductor device 31 is obtained by performing steps similar to those in FIGS. 3E to 3J (leaving out the steps in FIGS. 3G to 3I).

With this method, the n-type base layer 36 is formed by the multilayer structure of the n⁺ substrate 33 and the n⁻ drift layer 34. Therefore, the n⁻ drift layer 34 is supported by the n⁺ substrate 33 until completion of the semiconductor device 31, thereby allowing greater ease in transporting and handling of the n-type base layer 36.

Furthermore, the n⁺ substrate 33, which serves as the base layer of the n-type base layer 36, can be used as the n⁺ contact layer 9 in Embodiment 1 described above; thus, it is possible to omit the ion implantation step as shown in FIG. 3G. This allows for the manufacturing steps to be simplified.

Embodiment 3

Figure 11:
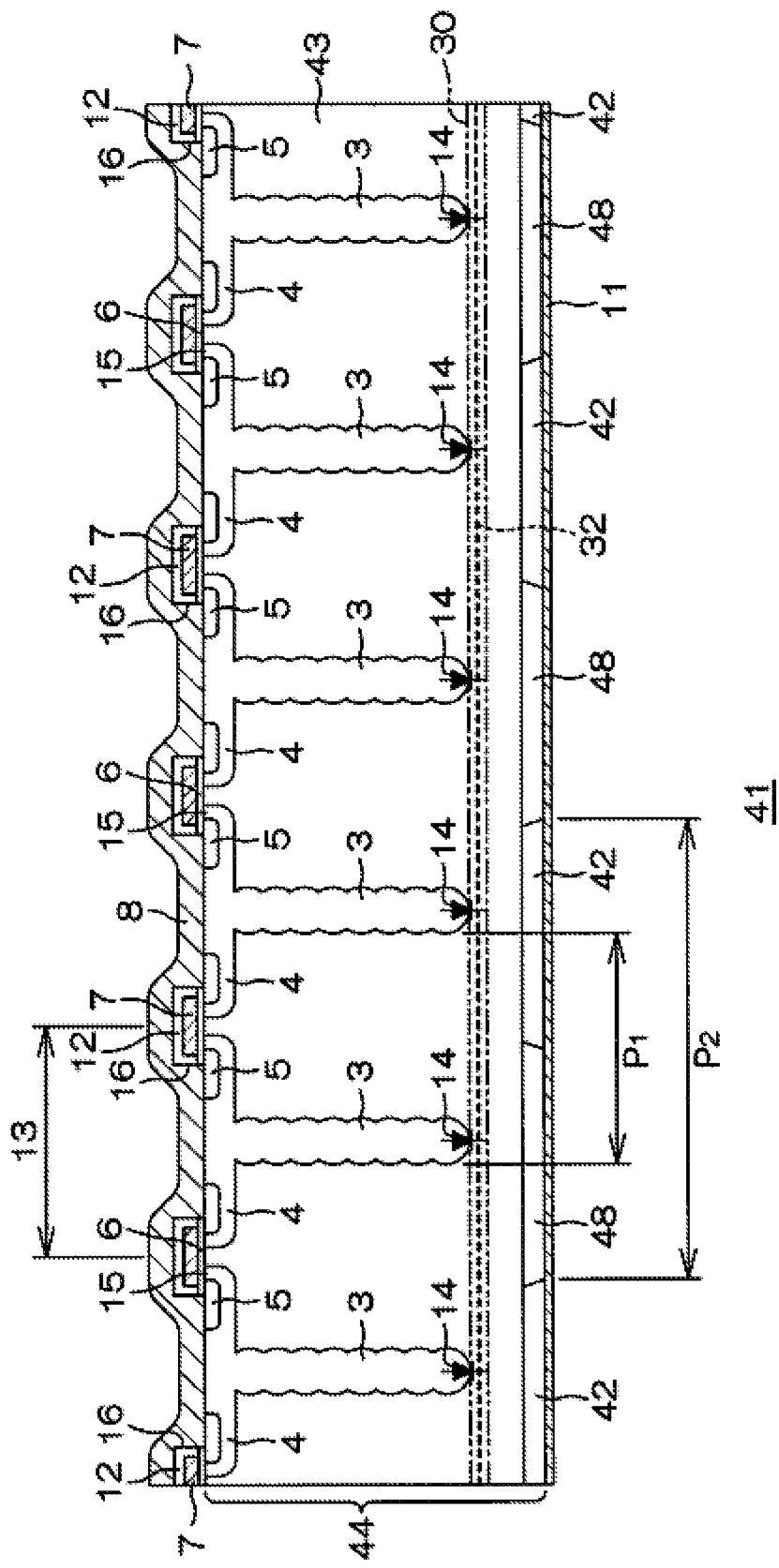
FIG. 11 is a schematic cross-sectional view of a semiconductor device of Embodiment 3 of the present invention.

FIG. 11 is a schematic cross-sectional view of a semiconductor device 41 of Embodiment 3 of the present invention. In FIG. 11, portions corresponding to the portions in FIG. 1 are assigned the same reference characters and descriptions thereof will be omitted.

Instead of an n⁻ base layer 2 made from a single layer, the semiconductor device 41 in FIG. 11 includes an n-type base layer 44 made from a multilayer structure of an n⁺ substrate 42 and an n⁻ drift layer 43 formed on this n⁺ substrate 42. In the n-type base layer 44, the n⁻ drift layer 43 has a relatively low impurity concentration, and the n⁺ substrate 42 has a relatively high impurity concentration. In this manner, the n⁺ substrate 42 both supports the n⁻ drift layer 43 and acts as the n⁺ contact layer 9 described above.

The p⁺ collector layers 48 are formed so as to penetrate the n⁺ substrate 42 in the thickness direction from the rear surface of the n⁺ substrate 42 and to reach the rear surface of the n⁻ drift layer 43, in a manner similar to the p⁺ collector layers 35 in Embodiment 2 described above. The p⁺ collector layers 48 are exposed to the rear surface of the n⁺ substrate 42, but differ from the p⁺ collector layers 35 in that the p⁺ collector layers 48 have a tapered shape where the width thereof becomes smaller from the rear surface of the n⁻ drift layer 43 towards the rear surface of the n⁺ substrate 42. In other words, the width of the portion of the p⁺ collector layers 48 exposed to the rear surface of the n⁺ substrate 42 has a tapered shape that becomes less than the width of the portion of the respective p⁺ collector layers 48 in contact with the rear surface of the n⁻ drift layer 43.

FIGS. 12A to 12F show the sequence of a portion of the steps of manufacturing the semiconductor device 41 in FIG. 11.

Figure 12A:
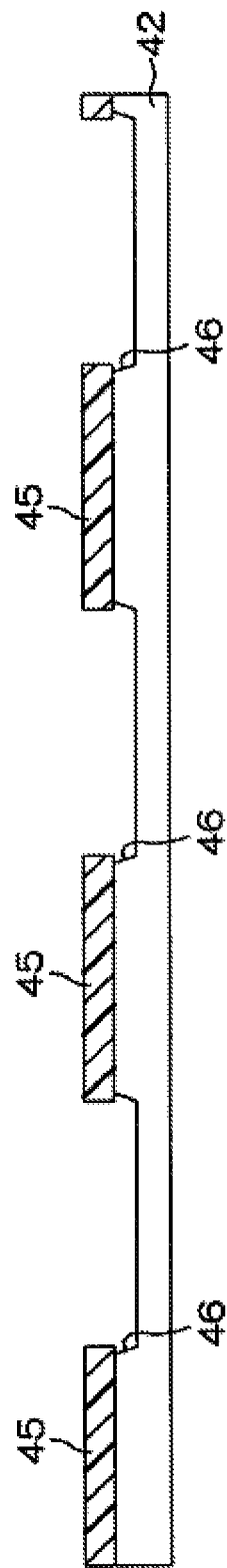
FIG. 12A is a view of a portion of a manufacturing process of the semiconductor device in FIG. 11.

To manufacture this semiconductor device 41, as shown in FIG. 12A, first a photoresist 45 selectively exposing the surface of the n⁺ substrate 42 is formed on the n⁺ substrate 42 (an n⁺ silicon substrate, for example). The n+ substrate 42 is dry etched through this photoresist 45. The dry etching is performed isotropically from the surface of the n⁺ substrate 42 towards the rear surface. This forms trenches 46 that have a tapered shape from the opening edge towards the bottom in areas where the p⁺ collector layers 48 are to be formed.

Figure 12B:
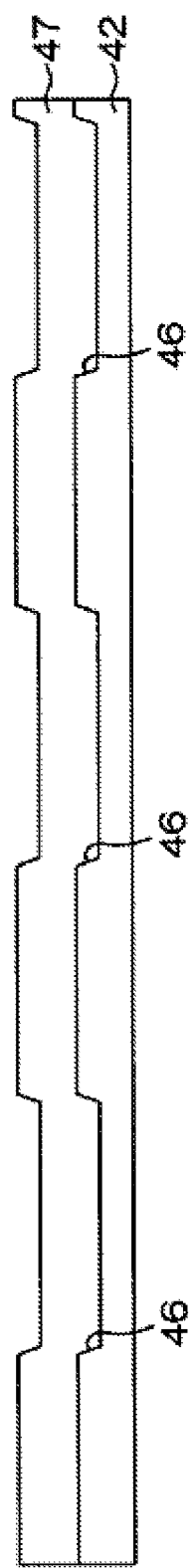
FIG. 12B is a view of the next step after the step in FIG. 12A.

Next, as shown in FIG. 12B, a p⁺ semiconductor layer 47 is epitaxially grown on the n⁺ substrate 42 while implanting a p-type impurity. The growth of the p⁺ semiconductor layer 47 is continued until at least the trenches 46 are filled and the surface of the n⁺ substrate 42 is hidden.

Figure 12C:
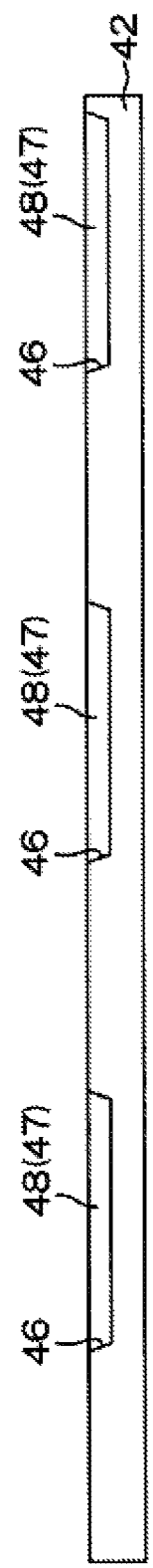
FIG. 12C is a view of the next step after the step in FIG. 12B.

Next, as shown in FIG. 12C, the p⁺ semiconductor layer 47 is polished by CMP. This forms the p⁺ collector layers 48, which are made from the p⁺ semiconductor layer 47 left in the trenches 46.

Figure 12D:
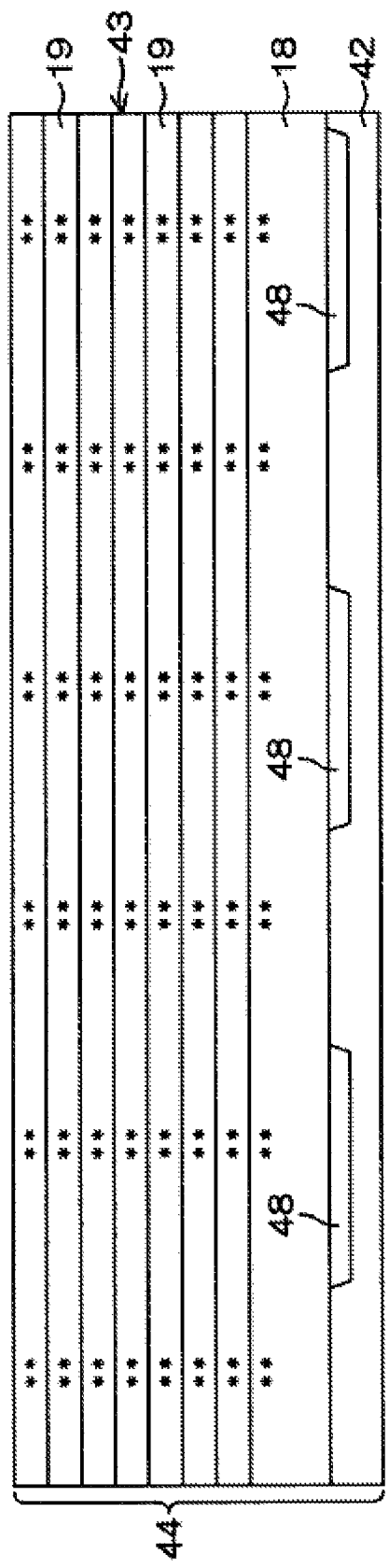
FIG. 12D is a view of the next step after the step in FIG. 12C.

Next, as shown in FIG. 12D, an initial base layer 18 is formed on the n⁺ substrate 42 and thereafter a plurality of n-type semiconductor layers 19 are stacked together in order to form an n⁻ drift layer 43, in a manner similar to the steps in FIGS. 3A and 3B. This forms the n-type base layer 44, which is made of the n⁺ substrate 42 and the n⁻ drift layer 43.

Figure 12E:
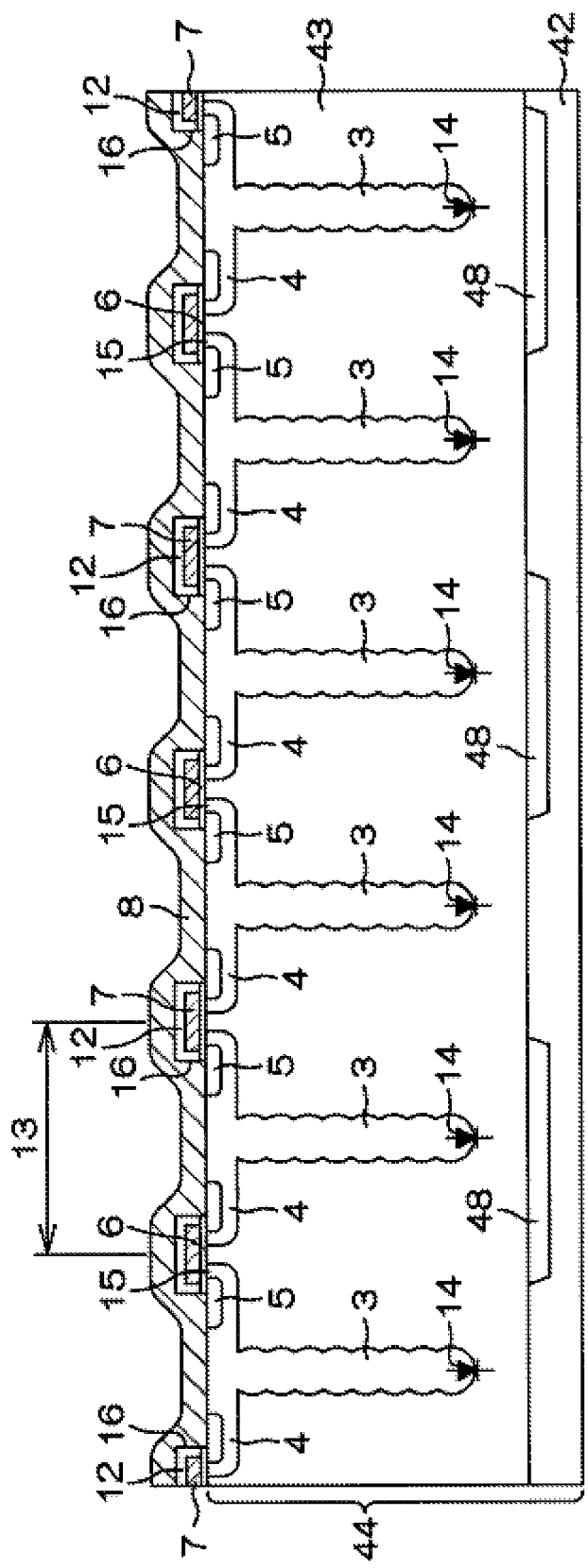
FIG. 12E is a view of the next step after the step in FIG. 12D.

Next, as shown in FIG. 12E, an annealing treatment (1000° C. to 1200° C.) is performed for drive diffusion of the p-type impurity in the plurality of the n-type semiconductor layers 19. This forms p-type columnar regions 3. Next, p-type base layers 4, n⁺ source layers 5, gate insulating films 6, gate electrodes 7, and the like are formed in a manner similar to the step in FIG. 3C.

Figure 12F:
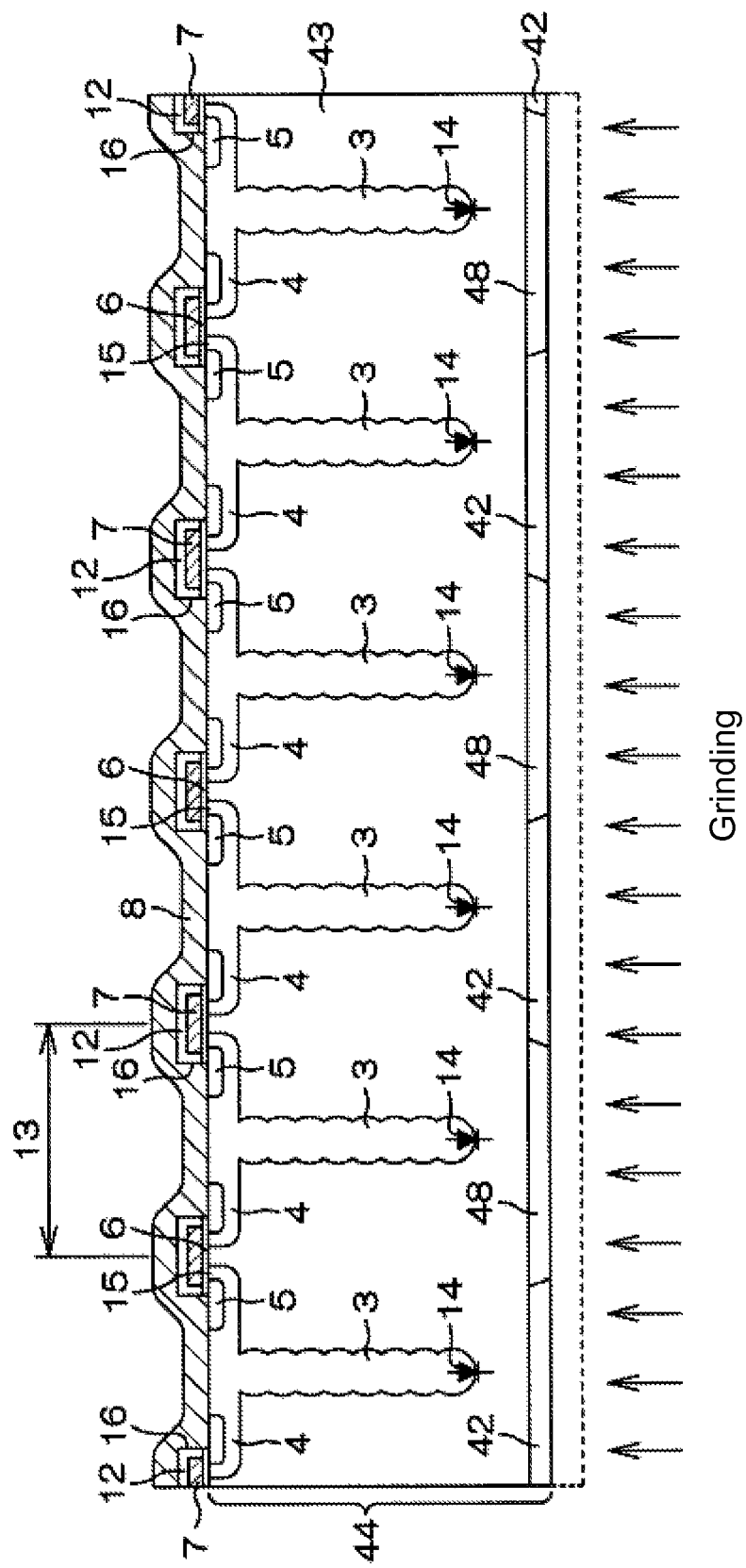
FIG. 12F is a view of the next step after the step in FIG. 12E.

Next, as shown in FIG. 12F, grinding is performed on the n⁺ substrate 42 from the rear surface side thereof using a grinder, for example, in a manner similar to the step in FIG. 3D. This grinding is continued until the p⁺ collector layers 48 are exposed from the rear surface of the n⁺ substrate 42. After grinding, the rear surface of the n⁺ substrate 42 is spin etched, which gives the rear surface of the n⁺ substrate 42 a mirror finish.

Thereafter, the semiconductor device 41 is obtained by performing steps similar to those in FIGS. 3E to 3J (leaving out the steps in FIGS. 3G to 3I).

With this method, the n-type base layer 44 is formed from a multilayer structure of the n⁺ substrate 42 and the n⁻ drift layer 43, in a manner similar to Embodiment 2 described above. Therefore, the n⁻ drift layer 43 is supported by the n⁺ substrate 42 until completion of the semiconductor device 41, thereby allowing for greater ease in transporting and handling of the n-type base layer 44.

Furthermore, the n+ substrate 42, which serves as the base layer of the n-type base layer 44, can be used as the n+ contact layer 9 in Embodiment 1 described above; thus, it is possible to omit the ion implantation step as shown in FIG. 3G. This allows for the manufacturing steps to be simplified. Furthermore, the p+ collector layers 48 are grown by epitaxial growth, thus making it possible for the impurity concentration of the p+ collector layers 48 to be uniform across the entirety thereof.

The present invention can be implemented in other embodiments than those described above.

Figure 13:
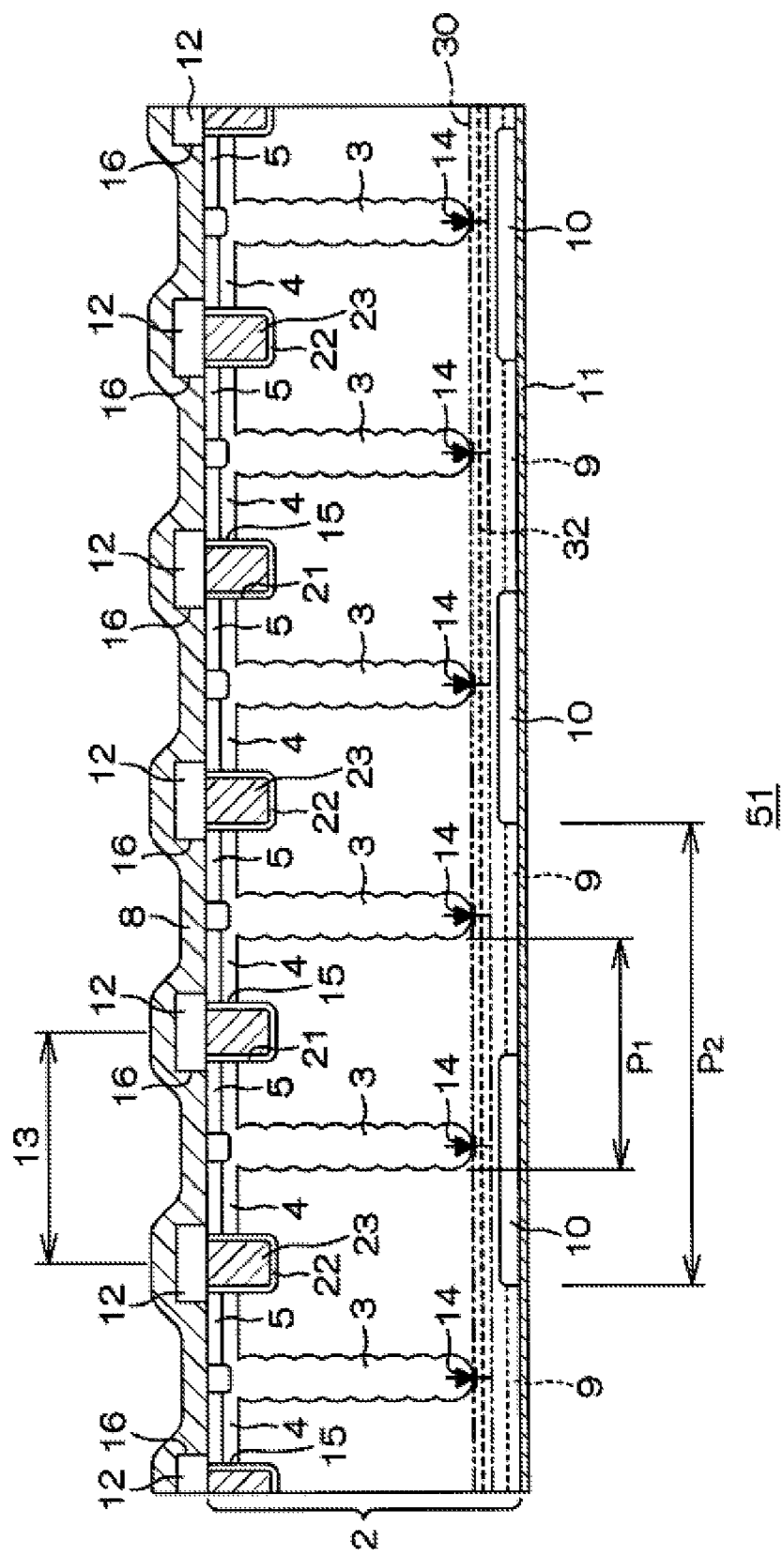
FIG. 13 is a view of a modification example of the gate structure in FIG. 2.

The semiconductor device may have a trench gate structure, such as a semiconductor device 51 in FIG. 13, for example. Specifically, the semiconductor device may have a gate structure in which gate trenches 21 that penetrate n+ source layers 5 and p-type base layers 4 from the surface of an n− base layer 2 are formed, and gate electrodes 23 are filled in through a gate insulating film 22 into these gate trenches 21.

One or both of the above-mentioned depletion layer reducing area 30 and trap level area 32 may be omitted.

A configuration may be used in which the conductivity type of the respective semiconductor portions of the semiconductor devices 1, 31, 41, and 51 are reversed. In the semiconductor device 1, the p-type parts may be n-type and the n-type parts may be p-type, for example. Besides these, various modifications in design can be made within the scope of the claims.

Next, descriptions are given for simulations performed to certify several effects of aspects of the present invention described above.

Simulation Example 1

In Simulation Example 1, the manner in which the respective on-resistances of the low voltage ranges and high voltage ranges change in response to change of the pitch $P_2$ of the p+ collector layers 10 was confirmed. In Simulation Example 1, the structure of the semiconductor device 1 in FIG. 2 is used, and the parameters of the simulation are configured as: occupancy of p+ collector layers 10=64%; and ratio of width of p+ collector layers 10 to n+ contact layer 9=1:1.

Figure 14A:
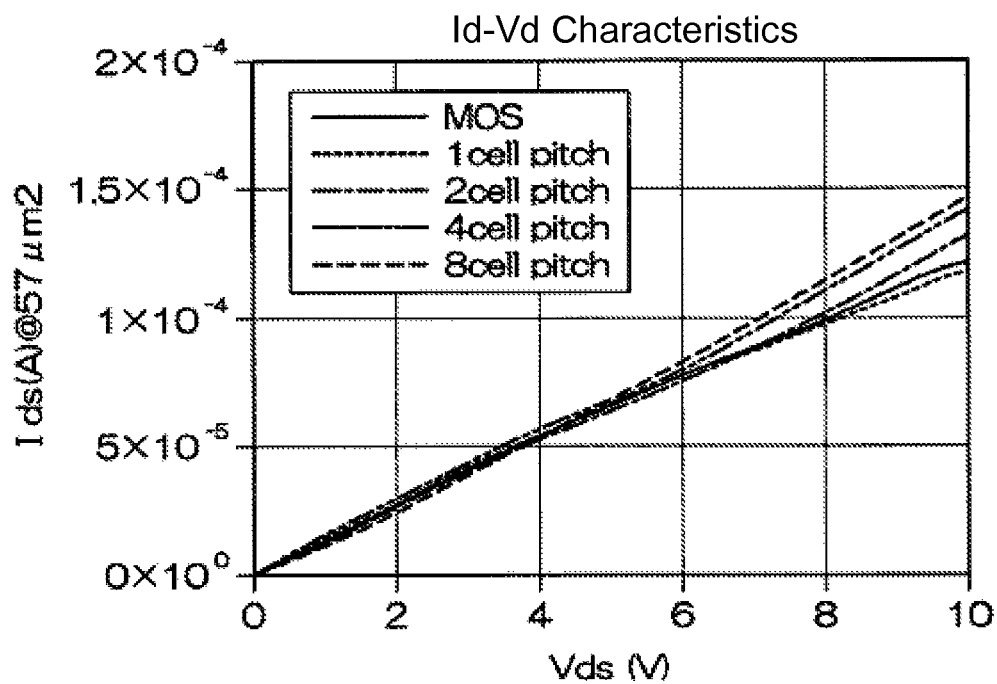
FIG. 14A is a graph that shows the Id-Vd characteristics of the semiconductor device for each pitch of the $p^+$ collector layers.
Figure 14B:
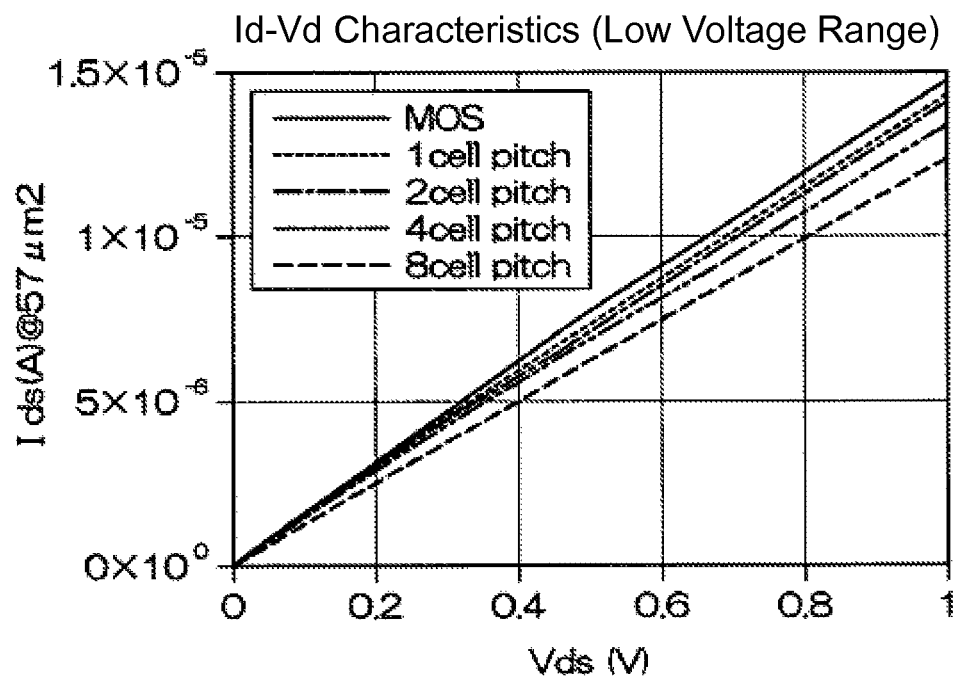
FIG. 14B is a graph in which the characteristics in the low voltage range of FIG. 14A have been magnified.

The respective Id-Vd characteristics were investigated with the pitch $P_2$ of the p+ collector layers 10 configured as: the same size as the pitch $P_1$ of the p-type columnar regions 3 (1 cell pitch); two times the pitch $P_1$ (2 cell pitch); four times the pitch $P_1$ (4 cell pitch); and eight times the pitch $P_1$ (8 cell pitch). The results are shown in FIGS. 14A and 14B. In FIGS. 14A and 14B, the Id-Vd characteristics of an ordinary MOSFET with no p+ collector layers 10 is also shown for reference.

As seen in FIG. 14A, the ON current in the high voltage ranges increases as the pitch $P_2$ of the p+ collector layers 10 becomes larger with the 2 cell pitch, 4 cell pitch, and 8 cell pitch. The amount of increase between the 4 cell pitch and the 8 cell pitch, however, is not as much as the amount of increase between the 2 cell pitch and the 4 cell pitch. This means that the ON current in the high voltage ranges has an effective increase until approximately 4 or 5 times the pitch $P_1$, as compared to if the pitch $P_2$ of the p+ collector layers 10 were the same as the pitch $P_1$ of the p-type columnar regions 3. This increase, however, reaches saturation at around 4 times the pitch $P_1$.

As seen in FIG. 14B, the ON current in the low voltage ranges decreases as the pitch $P_2$ of the p+ collector layers 10 becomes larger with the 2 cell pitch, 4 cell pitch, and 8 cell pitch. It is shown that the decrease between the 4 cell pitch and the 8 cell pitch is greater than the decrease between the 2 cell pitch and the 4 cell pitch. Accordingly, it was found to be preferable for the pitch $P_2$ of the p+ collector layers 10 to be approximately 4 times or 5 times the pitch $P_1$ of the p-type columnar regions 3, from the viewpoint of having a relatively high current in the low voltage ranges.

In summary, the results in FIGS. 14A and 14B above show that the pitch $P_2$ of the p+ collector layers 10 can be made larger than the pitch $P_1$ of the p-type columnar regions 3 (pitch $P_2$>pitch $P_1$), but in terms of evenly reducing the on-resistance in the low voltage ranges and the high voltage ranges, greater effects can be achieved by making the pitch $P_2$ two times to five times larger than the pitch $P_1$.

Simulation Example 2

In Simulation Example 2, it was confirmed how the on-resistance between the cells 13 change in response to changes in the layout of the p+ collector layers 10. In Simulation Example 2, the parameters of the simulation are configured as: occupancy of p+ collector layers 10 on rear surface of n− base layer 2=72%; pitch $P_1$ of p-type columnar regions 3=14.25 μm; ratio of width of p+ collector layers 10 to n+ contact layer 9=1:1.

Figure 15:
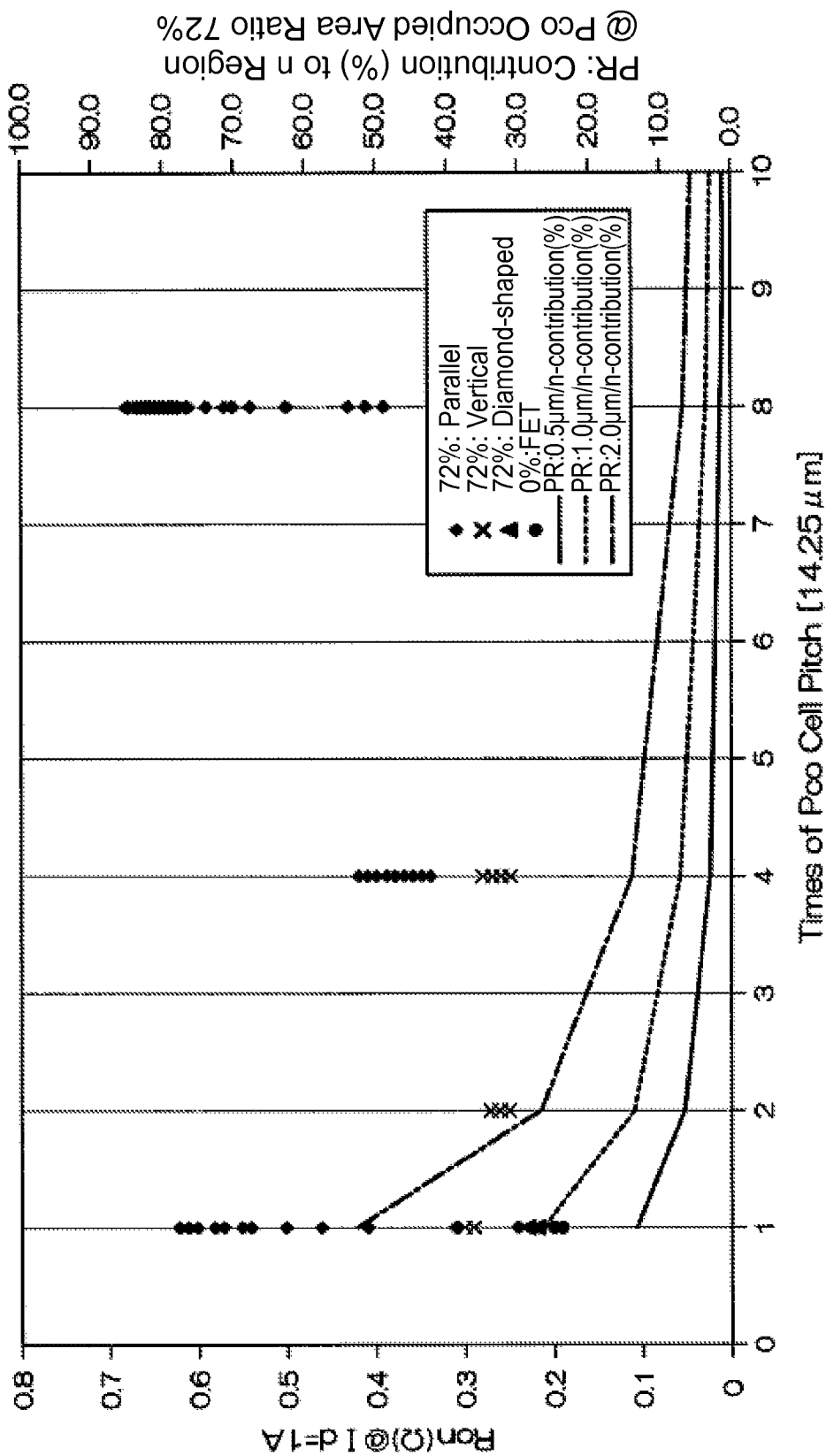
FIG. 15 is a graph that shows variation in ON-resistance between the cells of the semiconductor device for each layout of the $p^+$ collector layers.

The ON-resistance (Ron) of the respective cells 13 when 1A drain current was flowing was investigated with the pitch $P_2$ of the p+ collector layers 10 configured as: the same size as the pitch $P_1$ of the p-type columnar regions 3 (1 cell pitch); two times the pitch $P_1$ (2 cell pitch); four times the pitch $P_1$ (4 cell pitch); and eight times the pitch $P_1$ (8 cell pitch) This results are shown in FIG. 15. In FIG. 15, the simulation results of an ordinary MOSFET (0%:FET) with no p+ collector layers 10 are also shown for reference. The solid line, dashed line, and dashed-dotted line show to what extent lateral deviations in photolithography when forming the p+ collector layers 10 contributed to n sections (n+ contact layer 9) on the rear surface of the n− base layer 2. The dashed-dotted line PR:0.5 μm/n-contribution (%) means that if a 0.5 μm photolithography deviation occurs in 1 cell pitch, then the formation position of the n portion will have an approximately 50% deviation from the design position.

As understood by FIG. 15, if the p+ collector layers 10 have a vertical layout (the layout in FIG. 4), then there will be hardly any variation in on-resistance between the cells 13 regardless of the size of the pitch $P_2$ between the p+ collector layers 10 and the size of photolithography deviation.

On the other hand, if the p+ collector layers 10 have a parallel layout (the layout in FIG. 1) or a diamond-shaped layout (the layout in 5), then a slight variation can be seen when compared to the vertical layout. It is possible that this variation is due to the p+ collector layers 10 not equally facing all of the p-type columnar regions 3 or deviations in photolithography. The variations in the parallel layout and diamond-shaped layout are large when using the vertical layout as a reference, and pose no issues affecting implementation.

Embodiment 4

Figure 16:
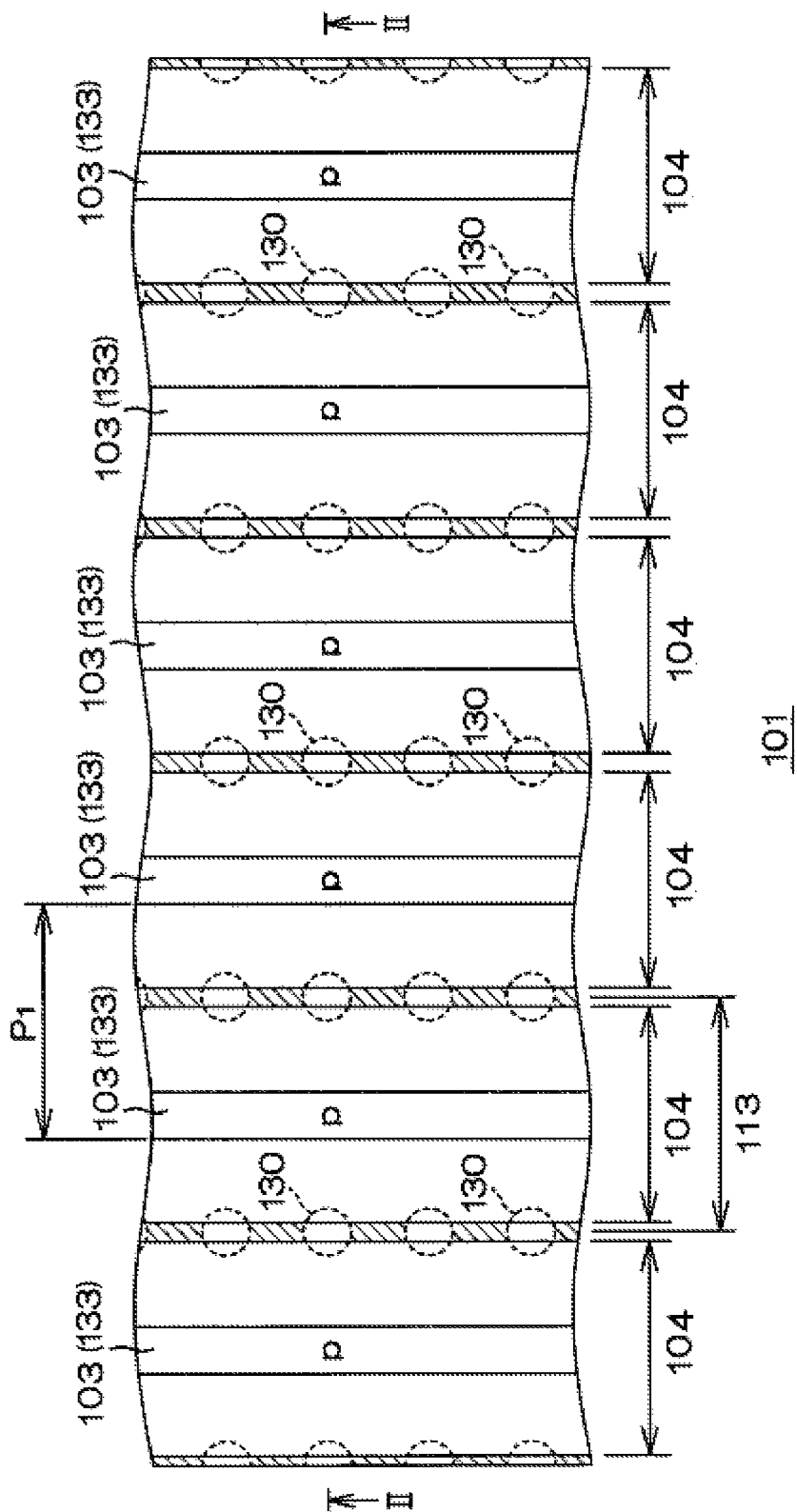
FIG. 16 is a schematic plan view of a semiconductor device of Embodiment 4 of the present invention.
Figure 17:
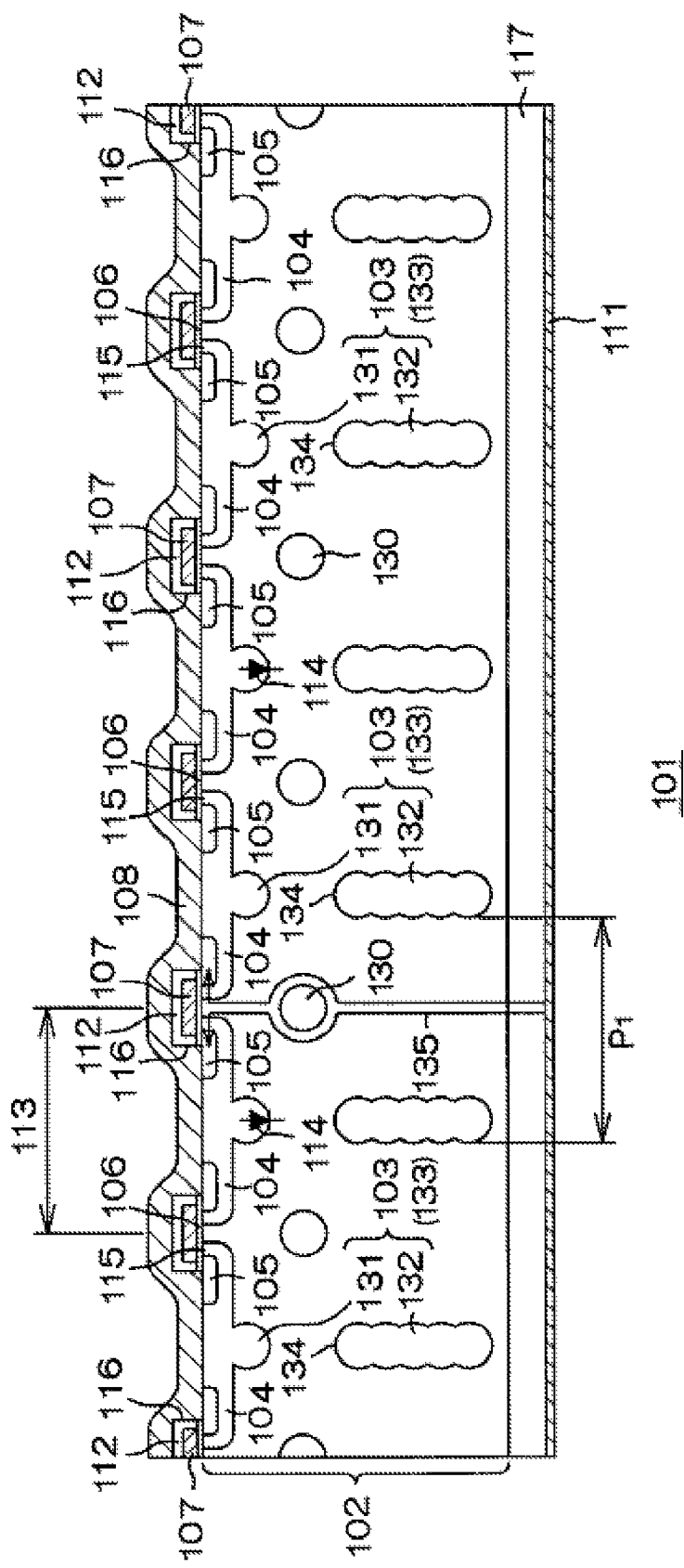
FIG. 17 is a cross-sectional view along the line II-II in FIG. 16.

FIG. 16 is a schematic plan view of a semiconductor device 101 of Embodiment 4 of the present invention. FIG. 17 is a cross-sectional view along the line II-II in FIG. 16. In FIG. 16, only the elements necessary for explanation are shown, and a n+ source layer 105, a gate electrode 107, a source electrode 108, and the like, for example, are omitted.

The semiconductor device 101 is a superjunction n-channel MOSFET (metal oxide semiconductor field effect transistor).

The semiconductor device 101 includes an n+ drain layer 117, an n− base layer 102, p-type columnar regions 103, p-type base layers 104, p-type assist regions 130, n+ source layers 105, gate insulating films 106, gate electrodes 107, a source electrode 108, and a drain electrode 111. Interlayer insulating films 112 are arranged on the respective gate electrodes 107.

The n+ drain layer 117 may be made of an n+ semiconductor substrate (a silicon substrate, for example). The n+ semiconductor substrate may be a semiconductor substrate that has undergone crystal growth while being doped with an n-type impurity. P (phosphorous), As (arsenic), SB (antimony) or the like can be used as the n-type impurity.

The n− base layer 102 is a semiconductor layer in which an n-type impurity has been implanted. More specifically, the n-base layer 102 may be an n-type epitaxial layer that is epitaxially grown while implanting the n-type impurity. The previously described material can be used as the n-type impurity.

The p-type columnar regions 103 and p-type base layers 104 are semiconductor layers in which a p-type impurity has been implanted. More specifically, the p-type columnar regions 103 and p-type base layers 104 may be semiconductor layers that are respectively formed by the ion implantation of a p-type impurity in the n-base layer 102. B (boron), Al (aluminum), Ga (gallium), or the like can be used as the p-type impurity.

As shown in FIG. 16, the p-type base layers 104 are selectively formed on the surface of the n− base layer 102 in a plurality of areas that are arranged periodically and apart from each other in a plan view seen from a direction normal to the surface of the n− base layer 102 (hereinafter, referred to as just "a plan view"). In this embodiment, this plurality of p-type base layers 104 are formed in mutually parallel stripe shapes. The width of the respective p-type base layers 104 is 3 µm to 10 µm, for example. The individual p-type base layers 104 and the area including the n− base layer 102 surrounding these form cells 113. In other words, in the layout in FIG. 16, this semiconductor device 101 has a large number of cells 113 arrayed in stripe shapes in a plan view.

The p-type columnar regions 103 are formed in the inner area of the p-type base layer 104 of each of the cells 113 in a plan view. More specifically, in the present embodiment, the p-type columnar regions 103 are respectively formed in stripe shapes in the center area in the widthwise direction of the p-type base layers 104. The p-type columnar regions 103 are formed so as to continue from the respective p-type base layers 104 and extend towards the n+ drain layer 117 in the n− base layer 102 to a position that is deeper than the p-type base layers 104. Accordingly, the p-type columnar regions 103 are arrayed continuously between the adjacent p-type base layers 104. A pitch $P_1$ (an example of a first pitch in the present invention) of the p-type columnar regions 103 is 5 µm to 20 µm. The pitch $P_1$ includes the p-section columnar region 103 and the n− base layer 102 between the adjacent p-type columnar regions 103 serving as a single repeating unit, and refers to the length in the direction along the surface of the n− base layer 102 of this repeating unit. In this embodiment, the p-type columnar regions 103 are arranged in the middle of the respective p-type base layers 104 in the widthwise direction, and thus, the pitch $P_1$ coincides with the pitch of the cells (cell pitch) 113.

The p-type columnar regions 103 are each separated into top and bottom by an area 134 that is a part of the n− base layer 102 interposed in the middle of the thickness direction of the p-type columnar region 103. The p-type columnar regions 103 each have a column 133 that includes a top columnar region 131 and a bottom columnar region 132 that is formed lengthwise in the depth direction of the n− base layer 102 further than the top columnar region 131. In other words, the separated columns 133 each have a shape that appears as though the respective p-type columnar regions 103 have been separated at the area 134 above the center of the depth direction of the p-type columnar region 103. The side faces of the respective columnar regions 131 and 132 along the depth direction of the n− base layer 102 serve as recesses and protrusions with periodic protrusions along the depth direction. The number of these recesses and protrusions normally match the number of n-type semiconductor layers 119 (FIG. 18A) described later, but for sake of clarity the number of recesses and protrusions is less than the number of layers in FIG. 17.

The top columnar region 131 is formed integrally with the p-type base layer 104, and a parasitic diode (body diode) 114 is formed at each interface (p-n junction) of the respective p-type base layers 104 and the n− base layer 102. The bottom columnar region 132 is separated from the p-type base layer 104 by the area 134 and is electrically floating.

It is preferable that the length of the bottom columnar region 132 be two times to ten times that of the top columnar region 131, for example. Specifically, it is preferable that the length of the top columnar region 131 be 1 µm to 5 µm and that the length of the bottom columnar region 132 be 2 µm to 20 µm. The length of the bottom columnar region 132 may be configured such that the thickness of the n− base layer 102 from the bottom of the bottom columnar region 132 to the rear of the n− base layer 102 is at least 5 µm. If the thickness is at least 5 µm, then it is possible to achieve a breakdown voltage of 600V or above.

If the p-type assist regions 130 are provided as in the present embodiment, then the gap of the respective areas 134 (the distance from the bottom edge of the top columnar region 131 to the top edge of the bottom columnar region 132) may be 0.5 µm to 10 µm.

In the present embodiment, all of the p-type columnar regions 103 are separated columns 133.

The respective p-type assist regions 130 are formed with a gap from the top columnar region 131 and the bottom columnar region 132 in a position that is separated from the respective areas 134 in the horizontal direction along the surface of the n− base layer 102. In the present embodiment, the p-type assist regions 130 are respectively formed directly below the area between the adjacent p-type base layers 104 (in other words, the boundary regions between the cells 113). A plurality of these p-type assist regions 130 are formed with gaps therebetween along the stripe direction of the respective p-type base layers 104 in the above-mentioned areas. The planar shape of the p-type assist regions 130 may be the dot shape shown in FIG. 16, a rectangular shape, or the like. By scattering these p-type assist regions 130 around in a plan view, the areas between the adjacent p-type assist regions 130 (the shaded portions in FIG. 16) can be efficiently used as MOSFET current paths. The p-type assist regions 130 may be formed in a stripe shape in these areas. In this case, current that is flowing from the drain electrode 111 to the source electrode 108 will be able to avoid the p-type assist regions 130, as shown by a current path 135 in FIG. 17. The p-type assist regions 130 may be semiconductor layers that are respectively formed by the ion implantation of a p-type impurity in the n− base layer 102. An example of this p-type impurity is as given above.

The n⁺ source layer 105 is formed in the inner area of the p-type base layer 104 of the respective cells 113 in a plan view. The n⁺ source layer 105 is selectively formed on the surface of the p-type base layer 104 in this area. The n⁺ source layers 105 may be formed by selective ion implantation of an n-type impurity into the p-type base layer 104. An example of this n-type impurity is as described above. The n⁺ source layers 105 are formed in the respective p-type base layer 104 so as to be positioned inside at a prescribed distance from the periphery (the interface of the p-type base layer 104 with the n⁻ base layer 102) of the p-type base layers 104. This causes the surface of the p-type base layer 104 to be interposed between the n⁺ source layer 105 and the n⁻ base layer 102 in the surface area of the semiconductor layer including the n⁻ base layer 102, p-type base layer 104, and the like. This interposed surface provides a channel region 115.

In this embodiment, the n⁺ source layers 105 are formed in stripe shapes in a plan view and formed on an area outside the respective side faces of the p-type columnar regions 103. The channel regions 115 have a stripe shape in accordance with the shape of the n⁺ source layers 105.

The gate insulating film 106 may be a silicon oxide film, a silicon nitride film, a silicon oxynitride film, a hafnium oxide film, an alumina film, a tantalum oxide film, or the like, for example. The gate insulating film 106 is formed so as to cover at least the surface of the respective p-type base layers 104 in the channel region 115. In this embodiment, the gate insulating films 106 are formed so as to each cover a portion of the n⁺ source layer 105, the channel region 115, and the surface of the n⁻ base layer 102. More specifically, the gate insulating film 106 has a pattern with an opening in the center area of the p-type base layers 104 of the respective cells 113 and in the inner peripheral area of the n⁺ source layer 105 continuing from this area.

The gate electrode 107 is formed so as to face the channel region 115 across the gate insulating film 106. The gate electrode 107 may be made of polysilicon that has had impurities implanted to lower the resistance thereof, for example. In this embodiment, the gate electrode 107 has approximately the same pattern as the gate insulating film 106 and covers the surface of the gate insulating film 106. In other words, the gate electrode 107 is arranged above a portion of the n⁺ source layer 105, the channel region 115, and the surface of the n⁻ base layer 102. More specifically, the gate electrode 107 has a pattern with an opening in the center area of the p-type base layers 104 of the respective cells 113 and in the inner peripheral area of the n⁺ source layer 105 continuing from this area. In other words, the gate electrodes 107 are formed so as to mutually control a plurality of the cells 113. This forms a planar gate structure.

The interlayer insulating film 112 is made of an insulating material such as a silicon oxide film, a silicon nitride film, or TEOS (tetraethyl orthosilicate), for example. The interlayer insulating film 112 covers the top and side faces of the gate electrode 107 and has contact holes 116 in the center area of the p-type base layers 104 of the respective cells 113 and the inner periphery areas of the n⁺ source layer 105 continuing from this area.

The source electrode 108 is made of aluminum or another metal. The source electrode 108 covers the surface of the interlayer insulating film 112 and is formed so as to fit into the contact holes 116 in the respective cells 113. This causes the source electrode 108 to be in ohmic contact with the n⁺ source layer 105. Accordingly, the source electrode 108 is connected to the plurality of cells 113 in parallel, and all of the current flowing to the plurality of the cells 113 flows through the source electrode 108. The source electrode 108 is also in ohmic contact with the p-type base layers 104 of the respective cells 113 through the contact holes 116 and stabilizes the potential of the p-type base layers 104.

The drain electrode 111 is made of aluminum or another metal. The drain electrode 111 is formed so as to contact the rear surface of the n⁺ drain layer 117. In this manner, the drain electrode 111 is connected to the plurality of cells 113 in parallel, and all of the current flowing to the plurality of the cells 113 flows through the drain electrode 111.

If a DC power supply is connected between the source electrode 108 and the drain electrode 111 with the drain electrode 111 having a high potential and the source electrode 108 having a low potential, then a reverse-bias will be given to the parasitic diodes 114. At this time, if a control voltage that is smaller than the prescribed threshold voltage is applied to the gate electrode 107, then none of the current paths will be formed between the source/drain. In other words, the semiconductor device 101 turns OFF. On the other hand, if a control voltage that is greater than or equal to the threshold voltage is applied to the gate electrode 107, then electrons will be attracted to the surface of the channel region 115 and an inversion layer (channel) will be formed. This connects the n⁺ source layer 105 and the n⁻ base layer 102. In other words, the current path 135 is formed from the source electrode 108 to the drain electrode 111 through the n⁺ source layer 105, the inversion layer of the channel region 115, and the n⁻ base layer 102, in this order. In other words, the semiconductor device 101 turns ON.

When the semiconductor device 101 is applied to an inverter circuit that drives an inductive load such as in an electric motor, sometimes the source electrode 108 has a higher potential than the drain electrode 111, turning the parasitic diodes 114 ON, and causing current to flow through these parasitic diodes 114. If the source electrode 108 has a lower potential than the drain electrode 111 thereafter, then the parasitic diodes 114 become reversed-biased and turn OFF. When the parasitic diodes 114 turn OFF at this time, the depletion layer spreads from the p-n junction thereof, the carriers (holes) in the p-type base layers 104 and p-type columnar regions 103 move towards the source electrode 108 and the carriers (electrons) inside the n-base layer 102 move towards the drain electrode 111.

The movement of these carriers causes current to flow in the reverse direction of when the parasitic diodes 114 are ON. This current is called the reverse recovery current. The reverse recovery current increases and then decreases. When the forward current of the diode becomes zero, the time it takes for the size of the reverse recovery current to decrease to 10% of the peak value thereof is called the reverse recovery time. When the change in the reverse recovery current (dir/dt) is large, sometimes oscillation (ringing) occurs until the current reaches zero. Such a reverse recovery characteristic is referred to as a hard recovery and causes noise and malfunctioning.

In this semiconductor device 101, there are the columns 133 where the respective p-type columnar regions 103 have been separated into top and bottom, and the relatively long bottom columns 132 of the separated columns 133 are electrically floating with respect to the p-type base layers 104. Accordingly, the bottom columnar region 132 does not contribute to the operation of the parasitic diode 114, and therefore, rapid spreading of the depletion layer during reverse-bias is suppressed. This suppresses the spread of the depletion layer towards the drain electrode 111, thereby suppressing the speed at which the depletion layer spreads when the parasitic diode 114 is turned OFF. This reduces the speed of change of the reverse recovery current (dir/dt), and thus improves the recovery characteristics. Since the configuration is simply the column 133 in which the p-type columnar regions 103 have been separated, the structure is also simple.

Furthermore, although the p-type columnar regions 103 are separated, the configuration has a superjunction structure in which the p-type columnar regions 103 extend from the p-type base layer 104 towards the n⁺ drain layer 117 and the p-type assist regions 130 are provided on the respective sides of the areas 134. Accordingly, depletion layers spreading in the horizontal direction from the respective top columnar regions 131 and bottom columnar regions 132 can be relayed and integrated by the p-type assist regions 130. This also makes it possible to achieve the inherent superjunction characteristics of favorable ON-resistance and switching speed.

Figure 18A:
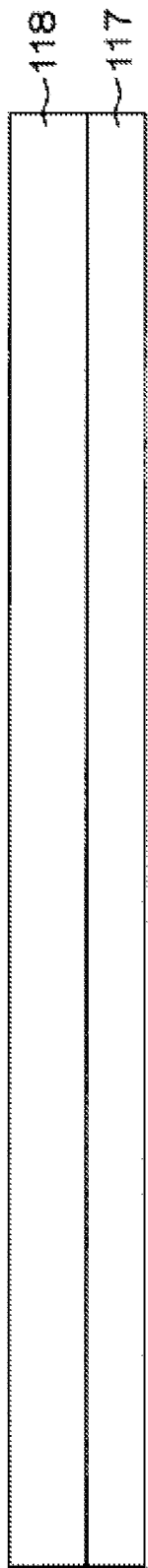
FIG. 18A is a view of a portion of a manufacturing process of the semiconductor device in FIGS. 16 and 17.
Figure 18B:
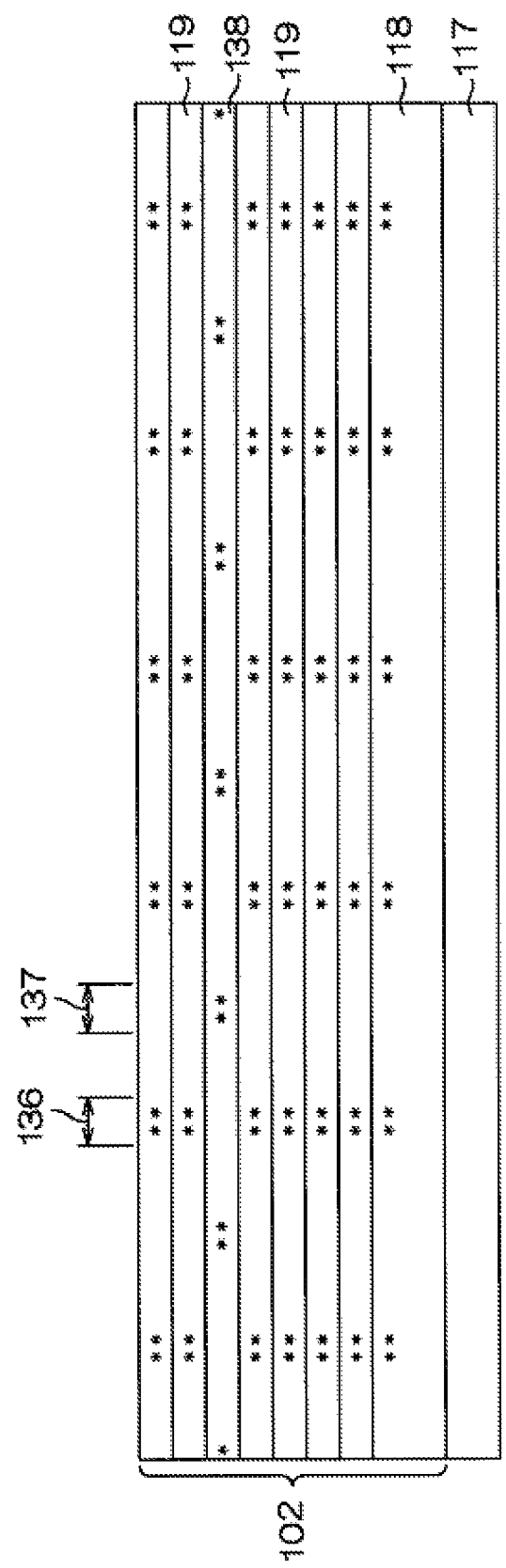
FIG. 18B is a view of the next step after the step in FIG. 18A.
Figure 18C:
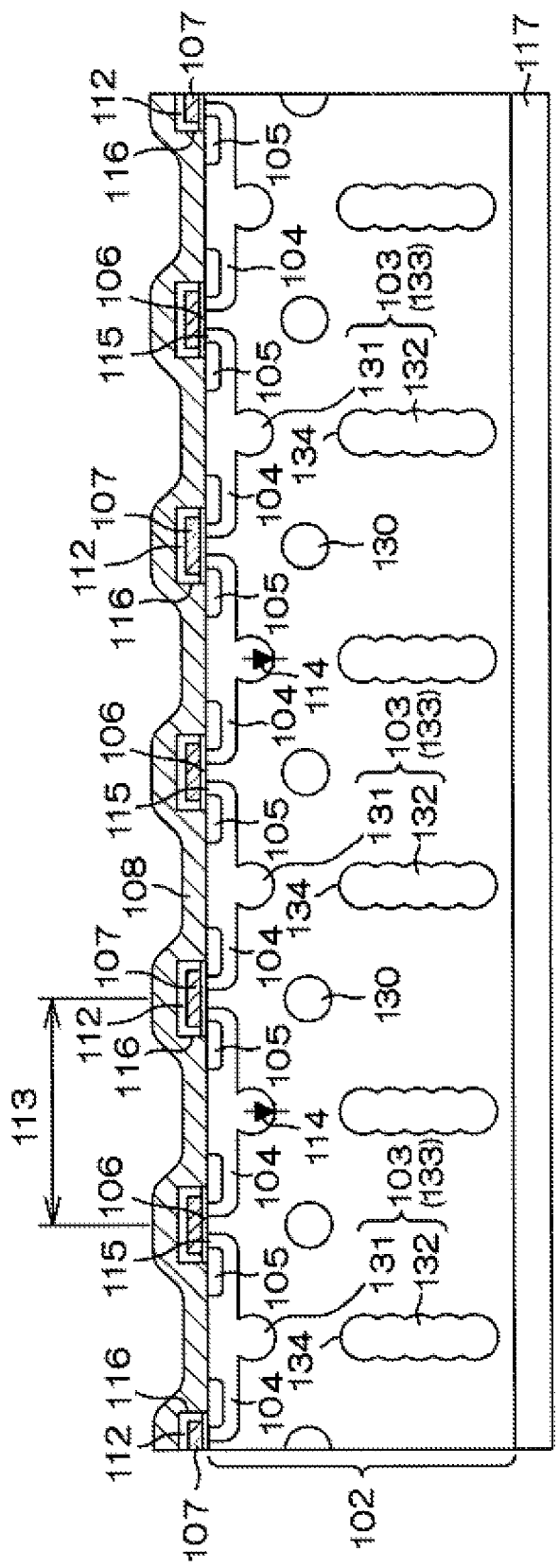
FIG. 18C is a view of the next step after the step in FIG. 18B.

FIGS. 18A to 18C show the sequence of a portion of the steps of manufacturing the semiconductor device 101.

First, as shown in FIG. 18A, an initial base layer 118, which is one example of a main layer of the present invention, is formed on the n⁺ drain layer 117. The parameters for epitaxial growth are 1 Ω·cm to 10 Ω·cm and a thickness of 5 µm to 20 µm, for example.

Next, as shown in FIG. 18B, a plurality of the n-type semiconductor layers 119 are stacked on the initial base layer 118 through multi-epitaxial growth. This multi-epitaxial growth involves repeating a step that forms the thin n-type semiconductor layer 119 (bottom main layer) at 1 Ω·cm to 10 Ω·cm/2 µm to 10 µm while selectively implanting (B ions at 50 keV, $5.3 \times 10^{13}$ cm⁻², implantation angle of 0°) the p-type impurity into a first position 136 where the p-type columnar region 103 will be formed. In the present embodiment, the initial base layer 118 and n-type semiconductor layers 119 are combined to grow five n-type semiconductor layers. Thereafter, an n-type semiconductor layer 138 (buffer layer) with the same resistance and thickness as the n-type semiconductor layers 119 (1 Ω·cm to 10 Ω·cm/2 µm to 10 µm) is grown as a sixth epitaxial layer while implanting a p-type impurity into a second position 137 where the p-type assist region 130 will be formed. This second position 137 is separated from the first position 136 in the horizontal direction. Next, the n-type semiconductor layers 119 are grown again through multi-epitaxial growth in a smaller number of steps than before the forming of the n-type semiconductor layer 138 (two in this embodiment), or in other words, at a lesser thickness. This integrates the plurality of n-type semiconductor layers 119 and 138 with the initial base layer 118 and forms the n⁻ base layer 102.

Next, as shown in FIG. 18C, an annealing treatment (1000° C. to 1200° C.) is performed for drive diffusion of the p-type impurity in the plurality of the n-type semiconductor layers 119 and 138. This forms the p-type columnar regions 103 having the separated columns 133 and the p-type assist regions 130 at the same time. In other words, the p-type impurity diffusion in the n-type semiconductor layers 119 that are the bottom main layers provides the bottom columnar regions 132, the p-type impurity diffusion in the n-type semiconductor layers 119 that are the top main lowers provides the top columnar regions 131, and the p-type impurity diffusion in the n-type impurity layer 138 between these provides the p-type assist regions 130. Accordingly, the first position 136 and the second position 137 where the p-type impurities are implanted are respectively configured in accordance with the formation location of the p-type columnar regions 103 and the p-type assist regions 130.

Next, the p-type impurity is selectively implanted (B ions at 50 keV, $5.0 \times 10^{15}$ cm⁻², implantation angle of 7°) at a relatively low energy into the surface of the n⁻ base layer 102 to form the p-type base layer 104. In the p-type base layer 104 in a plan view, an n-type impurity is selectively implanted (P ions at 130 keV, $2.0 \times 10^{15}$ cm⁻², implantation angle of 7°) into a looped area of a prescribed width that has an outer edge at a position receding a prescribed distance inwards from the outer periphery of the p-type base layer 104. This forms the n⁺ source layer 105.

Next, the gate insulating film 106 is formed so as to cover the n⁻ base layer 102 and the surface (surface of the semiconductor crystal) of the p-type base layer 104. This gate insulating film 106 may be formed by thermal oxidation of the semiconductor crystal surface. The gate electrode 107 is formed on the gate insulating film 106. The gate electrode 107 may be formed by attaching impurities and forming a low-resistance polysilicon film, and then selectively etching this polysilicon film through photolithography, for example. The gate insulating film 106 may be patterned at the same time as this etching, and the gate electrode 107 and the gate insulating film 106 may be formed in the same pattern. The interlayer insulating film 112 is formed (at a thickness of 10000 Å, for example) so as to cover the gate electrode 107, and the contact holes 116 are formed in this interlayer insulating film 112 by photolithography. Next, the source electrode 108 is formed on the interlayer insulating film 112, and heat treatment is performed as necessary for formation of an ohmic junction through alloying. The formation of the source electrode 108 may be a step that includes a step of forming a Ti/TiN barrier film (250/1300 Å, for example) and a step of depositing an AlCu film (4.2 µm, for example) on the barrier film. Thereafter, a surface protective film (not shown) is formed (at a thickness of 16000 Å, for example), and a pad opening is formed in this surface protective film that exposes a portion of the source electrode 108 as a pad.

Thereafter, the drain electrode 111 is formed on the rear surface of the n⁺ drain layer 117, and heat treatment is performed as necessary for formation of an ohmic junction through alloying. The forming of the drain electrode 111 may be a step of sputtering Ti, Ni, Au, and Ag in this order.

The semiconductor device 101 in FIGS. 16 and 17 can be obtained through the steps described above.

Embodiment 5

Figure 19:
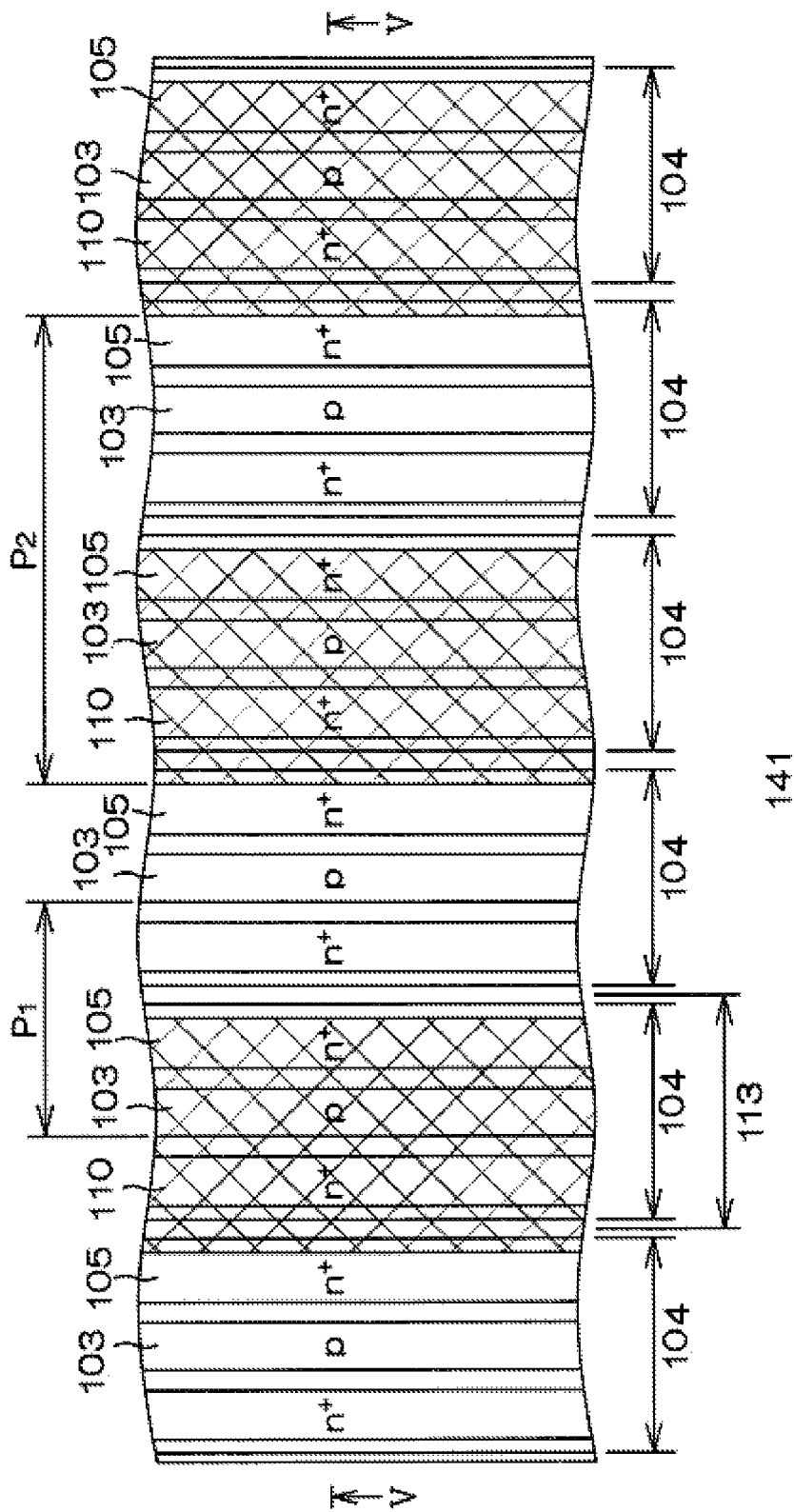
FIG. 19 is a schematic plan view of a semiconductor device of Embodiment 5 of the present invention.
Figure 20:
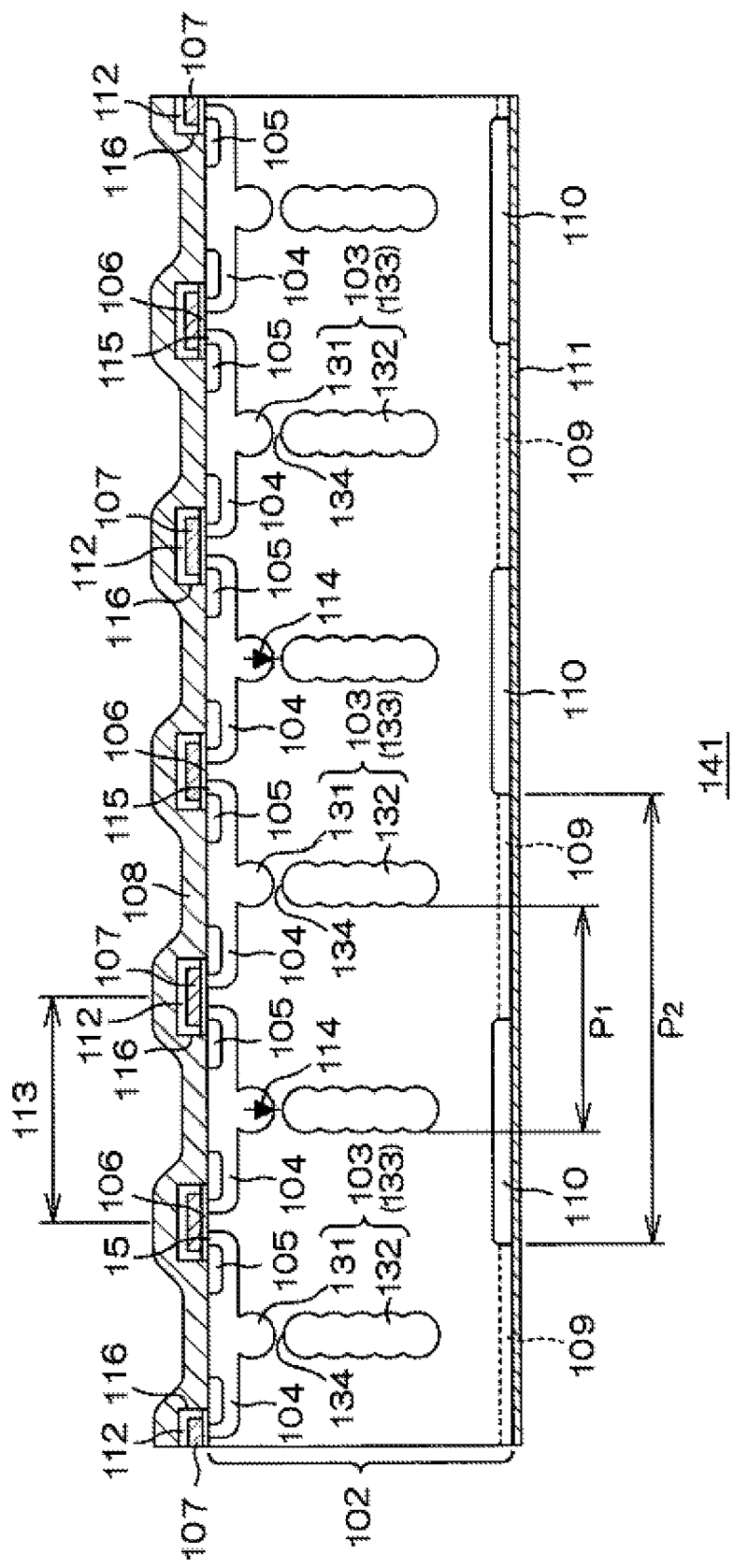
FIG. 20 is a cross-sectional view along the line V-V in FIG. 19.

FIG. 19 is a schematic plan view of a semiconductor device 141 of Embodiment 5 of the present invention. FIG. 20 is a cross-sectional view along the line V-V in FIG. 19. In FIGS. 19 and 20, portions corresponding to the portions in FIGS. 16 and 17 are assigned the same reference characters and descriptions thereof will be omitted.

The semiconductor device 141 differs from the above-mentioned semiconductor device 101 in that the n⁺ drain layer 117 and the p-type assist regions 130 have been omitted.

More specifically, the semiconductor device 141 has an n⁺ contact layer 109 instead of an n⁺ drain layer 117 as a layer for making contact with a drain electrode 111.

The n⁺ contact layer 109 is formed across the entire rear surface of an n⁻ base layer 102. The n⁺ contact layer 109 is formed at a depth such that a gap is present between the bottom of a p-type columnar region 103 and the n⁺ contact layer 109. This causes the n⁻ base layer 102 to be present between the p-type columnar regions 103 and the n⁺ contact layers 109.

The semiconductor device 141 also differs from the above-mentioned semiconductor device 101 in that p⁺ collector layers 110 are selectively formed on the rear surface of the n⁺ contact layers 109.

The p⁺ collector layer 110 is selectively formed on the rear surface of the n⁻ base layer 102, and a plurality of the p⁺ collector layers 110 are arrayed continuously along this rear surface. In this embodiment, as shown by the cross-hatching in FIG. 19, the p+ collector layers 110 are respectively formed in a stripe shape that is parallel to the p-type columnar regions 103 in a plan view. This causes the p+ collector layers 110 and the n+ contact layers 109 between the adjacent p+ collector layers 110 to be alternately exposed in a stripe shape on the rear surface of the n− base layer 102.

A pitch $P_2$ of the p+ collector layer 110 (an example of a second pitch of the present invention) is greater than a pitch $P_1$ of the p-type columnar region 103. This allows the semiconductor device 101 to selectively have, in the thickness direction of the n− base layer 102, p-type columnar regions 103 that face the respective p+ collector layers 110 and p-type columnar regions 103 that face the n-type portion between the adjacent p+ collector layers 110 but not the p+ collector layer 110 itself.

The pitch $P_2$ is the p+ collector layer 110 and the n+ contact layer 109 between the adjacent p+ collector layers 110 serving as a single repeating unit, and refers to the length in the direction along the surface of the n− base layer 102 of this repeating unit. In this repeating unit, the ratio (of widths) of the p+ collector layer 110 and the n+ contact layer 109 is 1:1 in the present embodiment, but this can be modified as appropriate. In this repeating unit, the ratio (of widths) of the p+ collector layer 110 and n+ contact layer 109 may be set at 50% to 80% of the occupancy of the p+ collector layer 110 with respect to the entire rear surface of the n− base layer 102.

The pitch $P_2$ of the p+ collector layer 110 has no particular limitations as long as it is larger than the pitch $P_1$, but it is preferable that the pitch $P_2$ be 2 to 5 times that of the pitch $P_1$. This makes it possible to achieve a well-balanced and favorable on-resistance for low voltage ranges and for high voltage ranges of the semiconductor device 141. In FIGS. 19 and 20, the pitch $P_2$ is shown as two times larger than the pitch $P_1$ due to space constraints in the drawing, but the pitch $P_2$ may be three, four, five, six times larger or more than the pitch $P_1$. Accordingly, in FIGS. 19 and 20, where the pitch $P_2=2\times$the pitch $P_1$, each of the p+ collector layers 110 faces one p-type columnar region 103 along a direction perpendicular to the p-type columnar region 103, but if the pitch $P_2>2\times$the pitch $P_1$, then each of the p+ collector layers 110 may face a plurality of the adjacent p-type columnar regions 103 so as to straddle these. The specific size of the pitch $P_2$ is 5 μm to 200 μm if the pitch $P_1$ of the p-type columnar region 103 is 5 μm to 20 μm as described above, for example.

Furthermore, the p+ collector layer 110 has an impurity concentration of $1\times10^{17}$ cm$^{-3}$ to $1\times10^{22}$ cm$^{-3}$. The p+ collector layer 110 is formed so as to penetrate the n+ contact layer 109 in the thickness direction from the rear surface of the n− base layer 102 and to reach the n− base layer 102. The p+ collector layer 110 has a depth of 0.2 μm to 3 μm from the rear surface of the n base layer 102. The width of the p+ collector layer 110 is 5 μm to 200 μm.

In the semiconductor device 141, the gap (between the bottom edge of a top columnar region 131 and the top edge of a bottom columnar region 132) of an area 13 is narrower than in Embodiment 4 described above due to the omission of the p-type assist regions 130. Specifically, the gap may be 1 μm to 5 μm. This makes it possible for the top columnar region 131 and the bottom columnar region 132 to be close to each other; therefore, the depletion layer spreading horizontally from the top columnar region 131 and the bottom columnar region 132 can be favorably integrated even without the p-type assist regions 130.

According to this semiconductor device 141, a plurality of the p+ collector layers 110 are selectively formed on the rear surface of the n− base layer 102, thereby exposing both the n-base layer 102 and the p+ collector layers 110 on this rear surface. This forms the drain electrode 111 on the rear surface of the n− base layer 102 so as to contact both the exposed n− base layer 102 and the p+ collector layer 110, thereby making it possible to provide the semiconductor device 141 that has MOSFET characteristics capable of forming a set with excellent efficiency in low voltage ranges and that also has IGBT characteristics capable of generating conductivity modulation in high voltage ranges. Furthermore, the semiconductor device 141 has the columns 133 with the separated p-type columnar regions 103, thus making it possible to favorably reduce ON-resistance in high voltage ranges as compared to if p+ collector layers 110 were provided in a semiconductor device in which all of the p-type columnar regions 103 are continuous columnar regions 139 (described later).

Meanwhile, the respective occupancies of the n− base layer 102 and the p+ collector layer 110 with respect to the entire rear surface of the n− base layer 102 are smaller than regular MOSFETs and IGBTs, where the entire rear surface is occupied by only an n-type or p-type area. Therefore, if the area of the n− base layer 102 or the p+ collector layer 110 is increased, then the area of the other will become smaller. As a result, the contact resistance of the drain electrode 111 to the relatively small layer is increased, and the reducing effect of the on-resistance is weakened. In other words, there is a trade-off between the MOSFET characteristics and the IGBT characteristics given to the semiconductor device 141.

After earnest and diligent research, the inventors of the present invention were able to evenly reduce the on-resistance in low voltage ranges and high voltage ranges, not by matching the pitch $P_2$ of the p+ collector layer 110 to the pitch $P_1$ of the p-type columnar region 103 (pitch $P_1$=pitch $P_2$), but by making the pitch $P_2$ larger than the pitch $P_1$ (pitch $P_2$>pitch $P_1$). As a result, this semiconductor device 101 can have optimal device characteristics for a variety of applications. Needless to say, effects similar to those of the semiconductor device 101 described above can also be achieved.

FIGS. 21A to 21G show the sequence of a portion of the steps of manufacturing the semiconductor device 141. In FIGS. 21A to 21G, portions corresponding to the portions in FIGS. 18A to 18C are assigned the same reference characters and descriptions thereof will be omitted.

Figure 21A:
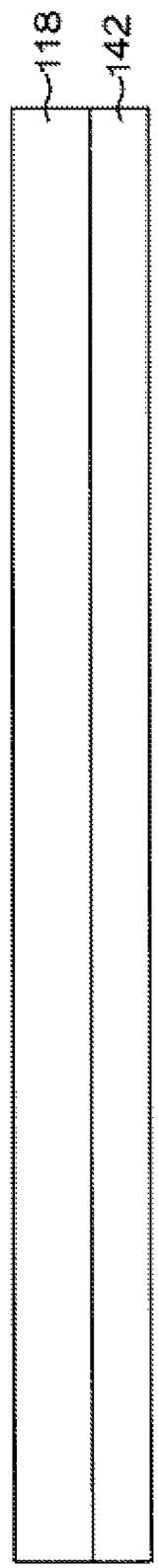
FIG. 21A is a view of a portion of a manufacturing process of the semiconductor device in FIGS. 19 and 20.

First, as shown in FIG. 21A, an initial base layer 118 is epitaxially grown on a substrate 142 while performing injection of an n-type impurity. An n-type silicon substrate can be used as the substrate 142, but this substrate 142 will be removed in a subsequent step; thus, there is no need for high-quality material when a cheap substrate can be used.

Figure 21B:
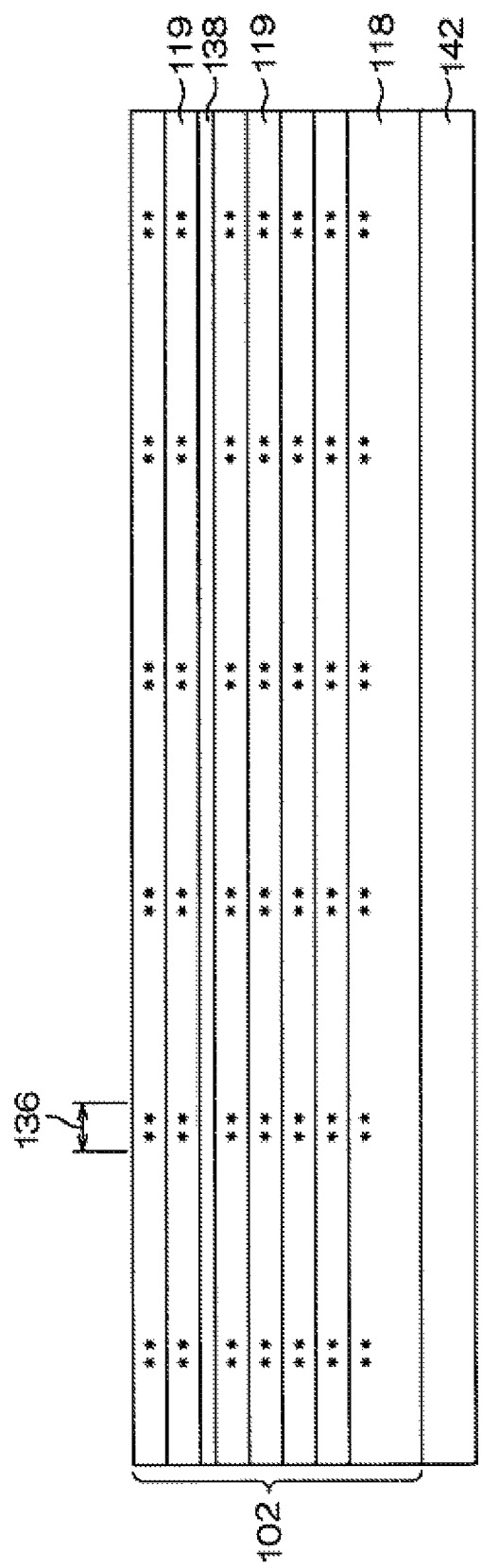
FIG. 21B is a view of the next step after the step in FIG. 21A.

Next, as shown in FIG. 21B, a plurality of the n-type semiconductor layers 119, a single n-type semiconductor layer 138, and a plurality of the n-type semiconductor layers 119 are epitaxially grown in this order on the initial base layer 118. During this time, the n-type semiconductor layer 138 is formed so as to be thinner (1 μm to 5 μm, for example) than the n-type semiconductor layers 119, and the p-type impurity is not implanted into the entire area of the n-type semiconductor layer 138. In other words, the gap between the areas 134 formed later is adjusted by adjusting the thickness of the n-type semiconductor layer 138.

Figure 21C:
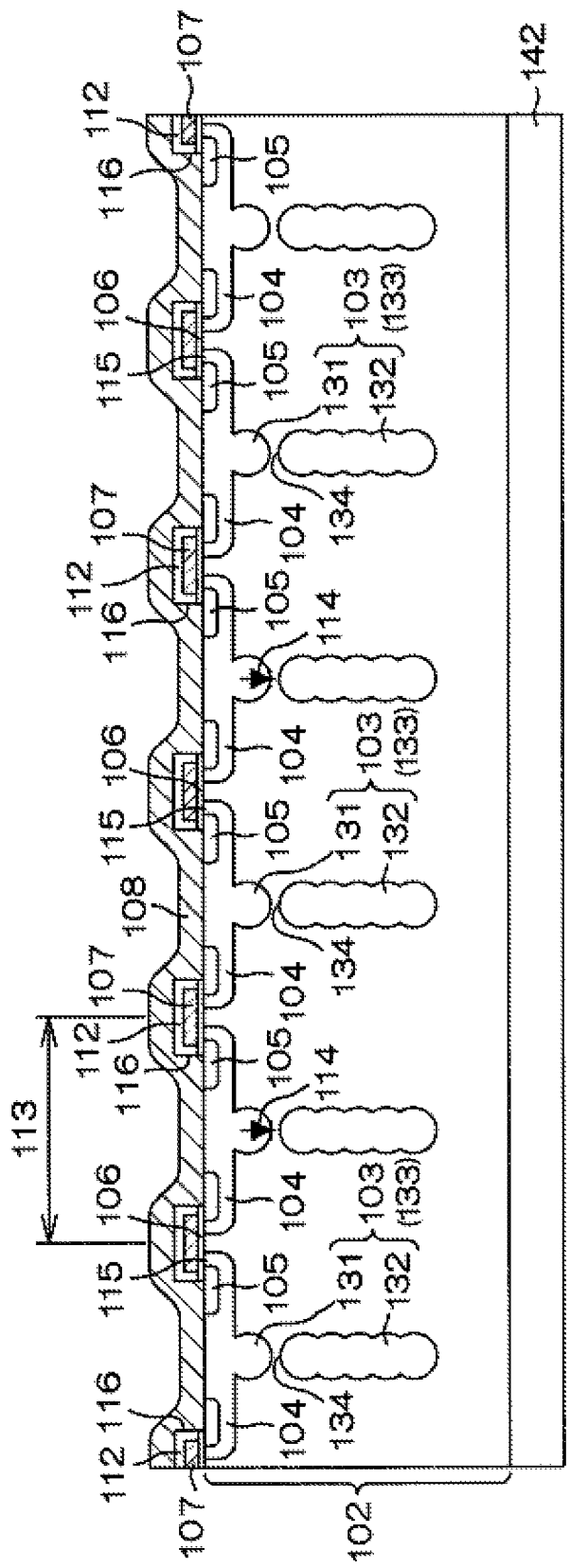
FIG. 21C is a view of the next step after the step in FIG. 21B.

Next, as shown in FIG. 21C, an annealing treatment (1000° C. to 1200° C.) is performed for drive diffusion of the p-type impurity in the plurality of the n-type semiconductor layers 119 and 138. This forms the p-type columnar regions 103 having the separated columns 133. Next, the p-type base layer 104, n+ source layer 105, gate insulating film 106, gate electrode 107, interlayer insulating film 112, and the source electrode 108 are formed using similar methods to those described above.

Figure 21D:
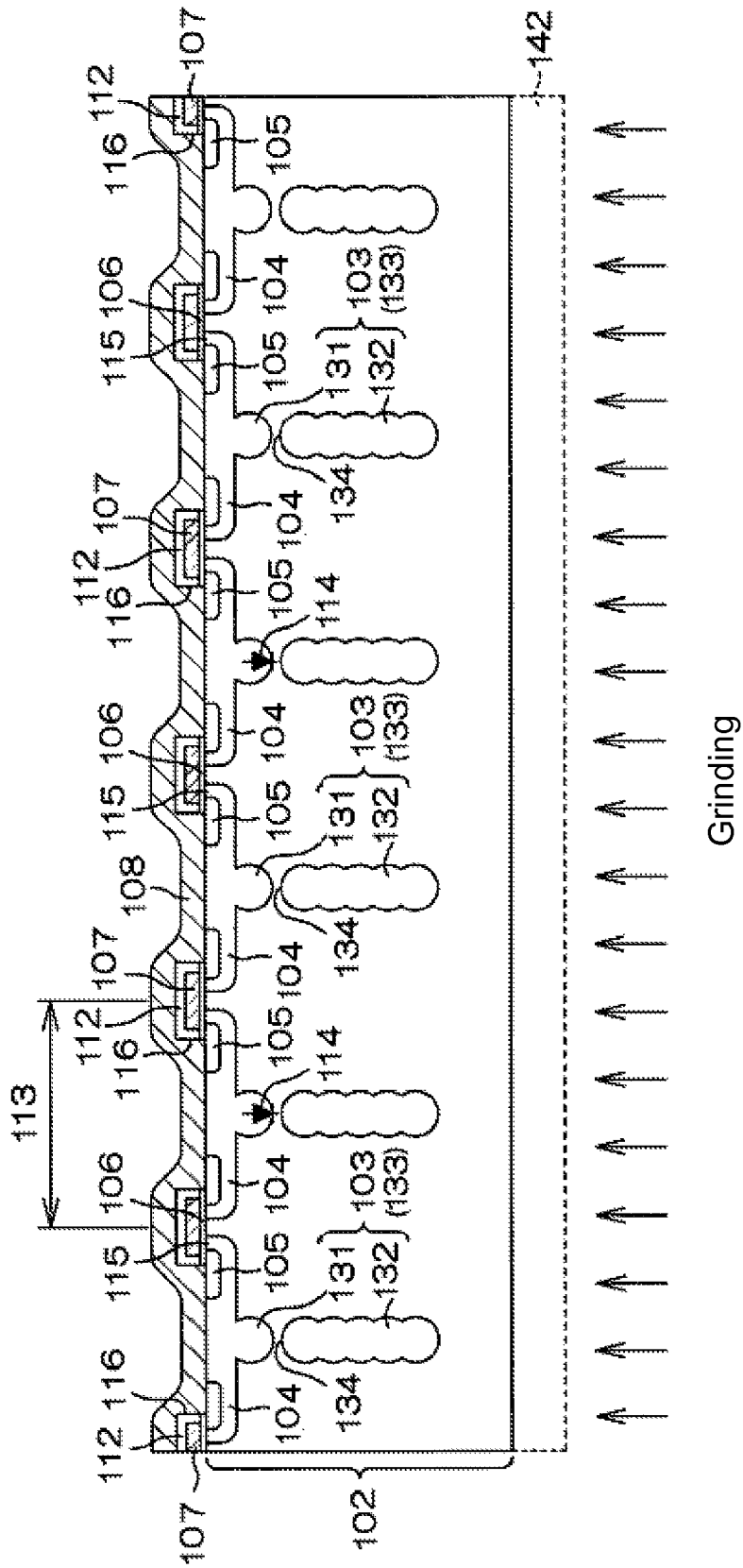
FIG. 21D is a view of the next step after the step in FIG. 21C.

Next, as shown in FIG. 21D, a grinder is used to grind the substrate 142 from the rear surface thereof, for example. This grinding is performed so as to completely remove the substrate 142, expose the rear surface of the n⁻ base layer 102, and to leave the thickness of the n⁻ base layer 102 at least 30 μm directly below the p-type columnar regions 103. After grinding, the rear surface of the n⁻ base layer 102 is spin etched, which gives the rear surface a mirror finish.

In this manner, the n⁻ base layer 102 is supported by the substrate 142 through several of the manufacturing steps; thus, it is possible to make the transport and handling of the n⁻ base layer 102 easier. It is possible to consecutively perform the grinding of the n⁻ base layer 102 after the grinding of the substrate 142, thus allowing the thickness of the n⁻ base layer 102 directly under the p-type columnar regions 103 to be adjusted with ease.

Figure 21E:
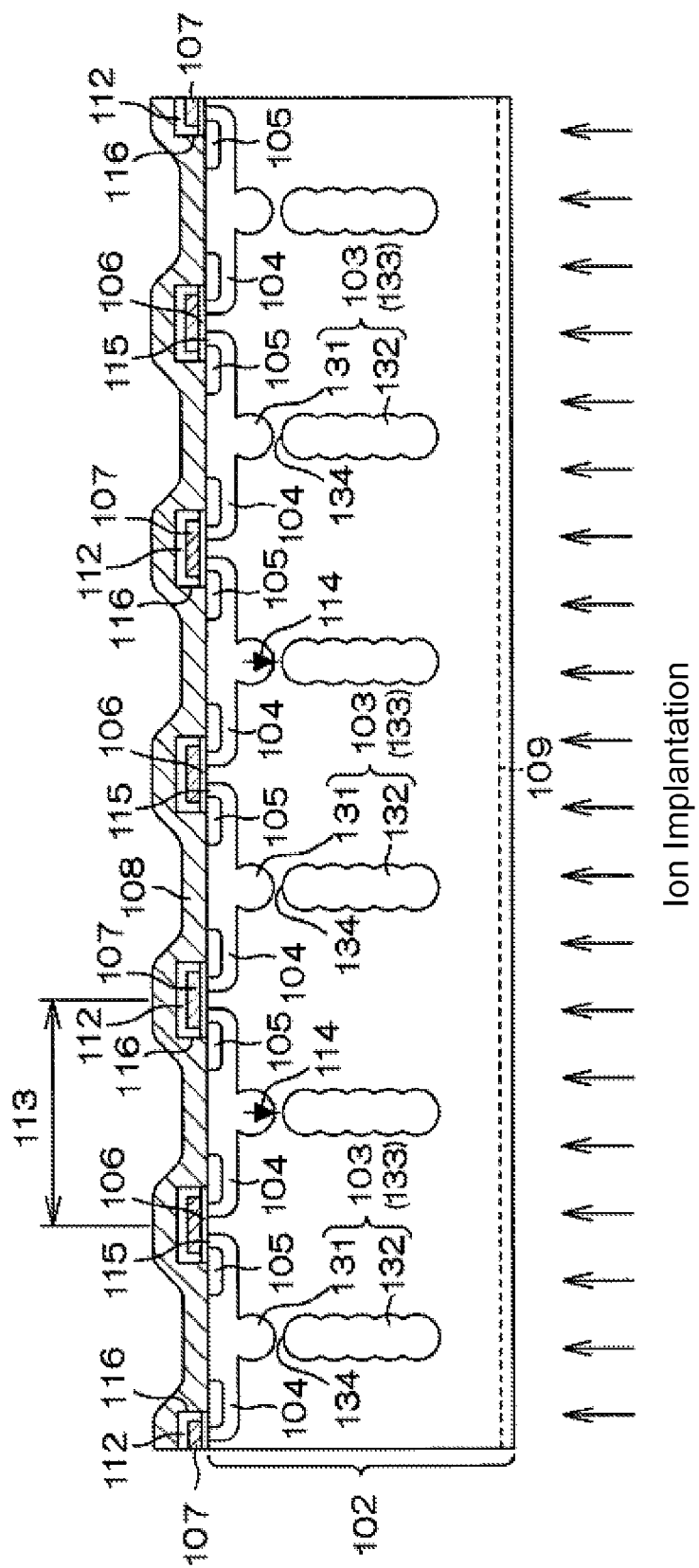
FIG. 21E is a view of the next step after the step in FIG. 21D.

Next, as shown in FIG. 21E, the n⁺ contact layer 109 is formed by implanting an n-type impurity (As ions at 30 keV, $1.0 \times 10^{15}$ cm$^{-2}$, implantation at 0°) in the entire rear surface of the n⁻ base layer 102 and then performing an annealing treatment.

Figure 21F:
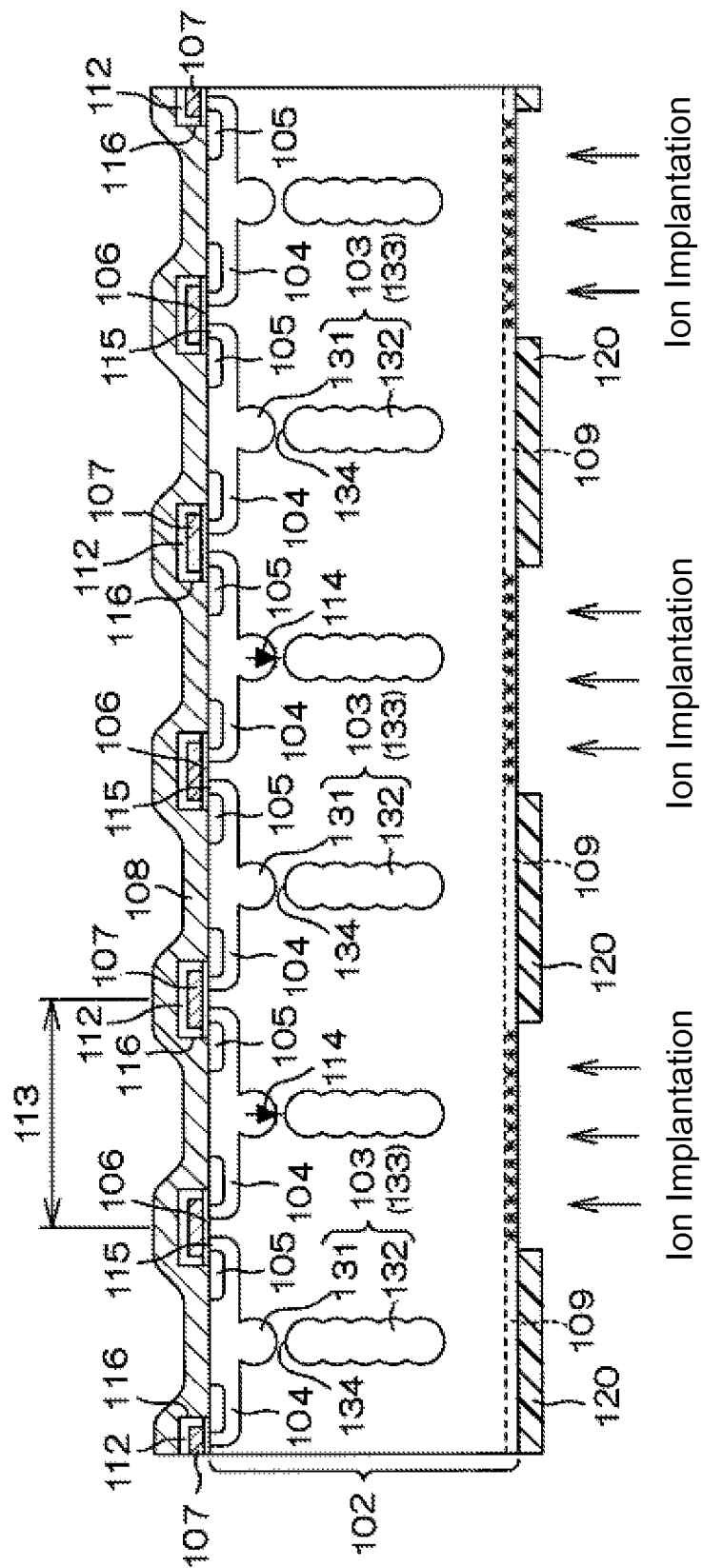
FIG. 21F is a view of the next step after the step in FIG. 21E.

Next, as shown in FIG. 21F, a photoresist 120 is formed by selectively exposing the rear surface of the n⁻ base layer 102. First, B ions are implanted through this photoresist 120 at 100 keV, $1.0 \times 10^{15}$ cm$^{-2}$ at a 7° implantation tilt angle. Next, BF$_2$ ions are implanted at an energy that is less than in the step of implanting the B ions, or more specifically, at 30 keV, $1.0 \times 10^{15}$ cm$^{-2}$, implantation angle of 7° (the same tilt angle). During this time, it is possible to avoid channeling in which the ions deeply penetrate the n⁻ base layer 102 by the B ions and BF$_2$ ions being implanted at an incline with a prescribed tilt angle, rather than implanting perpendicular to the rear surface of the n⁻ base layer 102. Thereafter, the photoresist 120 is removed by ashing, for example.

Figure 21G:
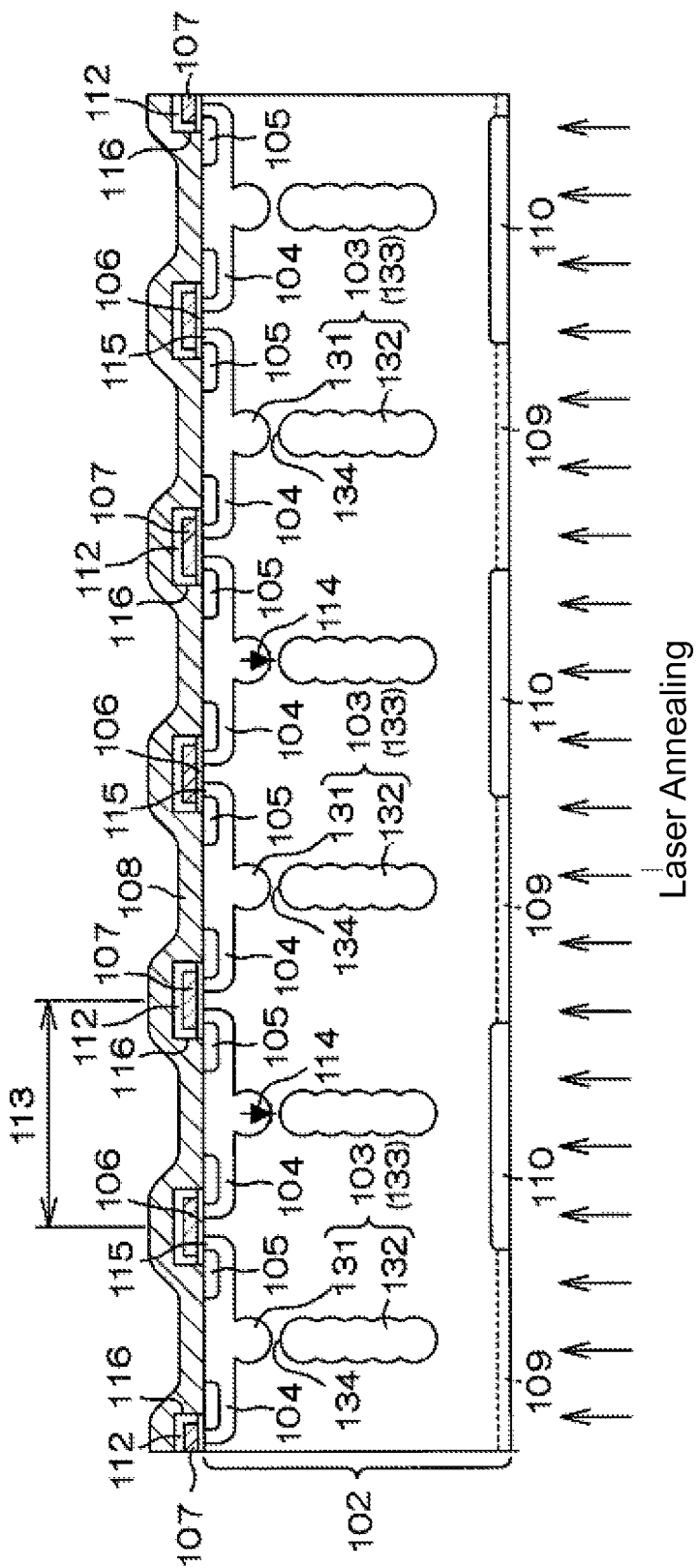
FIG. 21G is a view of the next step after the step in FIG. 21F.

Next, as shown in FIG. 21G, the B ions and BF$_2$ ions implanted in the previous step are activated by performing a laser annealing treatment on the n⁻ base layer 102. This changes some of the conductivity types of the n⁺ contact layer 109 from n-type to p-type and forms the p⁺ collector layers 110.

At this time, high-temperature (approximately 1500° C., for example) annealing is not performed, thus making it possible to prevent the source electrode 108 from melting. In other words, metal parts such as the source electrode 108 that melt easily in a high temperature environment can be made before this annealing treatment. Therefore, a large portion or all of the structure on the surface side of the n⁻ base layer 102 can be made before the annealing treatment. As a result, the front and rear surface of the n⁻ base layer 102 do not have to be reversed multiple times, thereby making it possible to improve manufacturing efficiency.

Thereafter, the drain electrode 111 is formed on the rear surface of the n⁻ base layer 102, and heat treatment is performed as necessary for formation of an ohmic junction through alloying. The forming of the drain electrode 111 may be a step of sputtering Ti, Ni, Au, and Ag in this order.

The semiconductor device 141 in FIGS. 19 and 20 can be obtained through the steps described above <Modification Examples of Layout of p-Type Columnar Regions 103 and p⁺ Collector Layers 110>

Next, modification examples of the layout of the p-type columnar regions 103 and p⁺ collector layers 110 will be described with reference to FIGS. 22 to 25.

Figure 22:
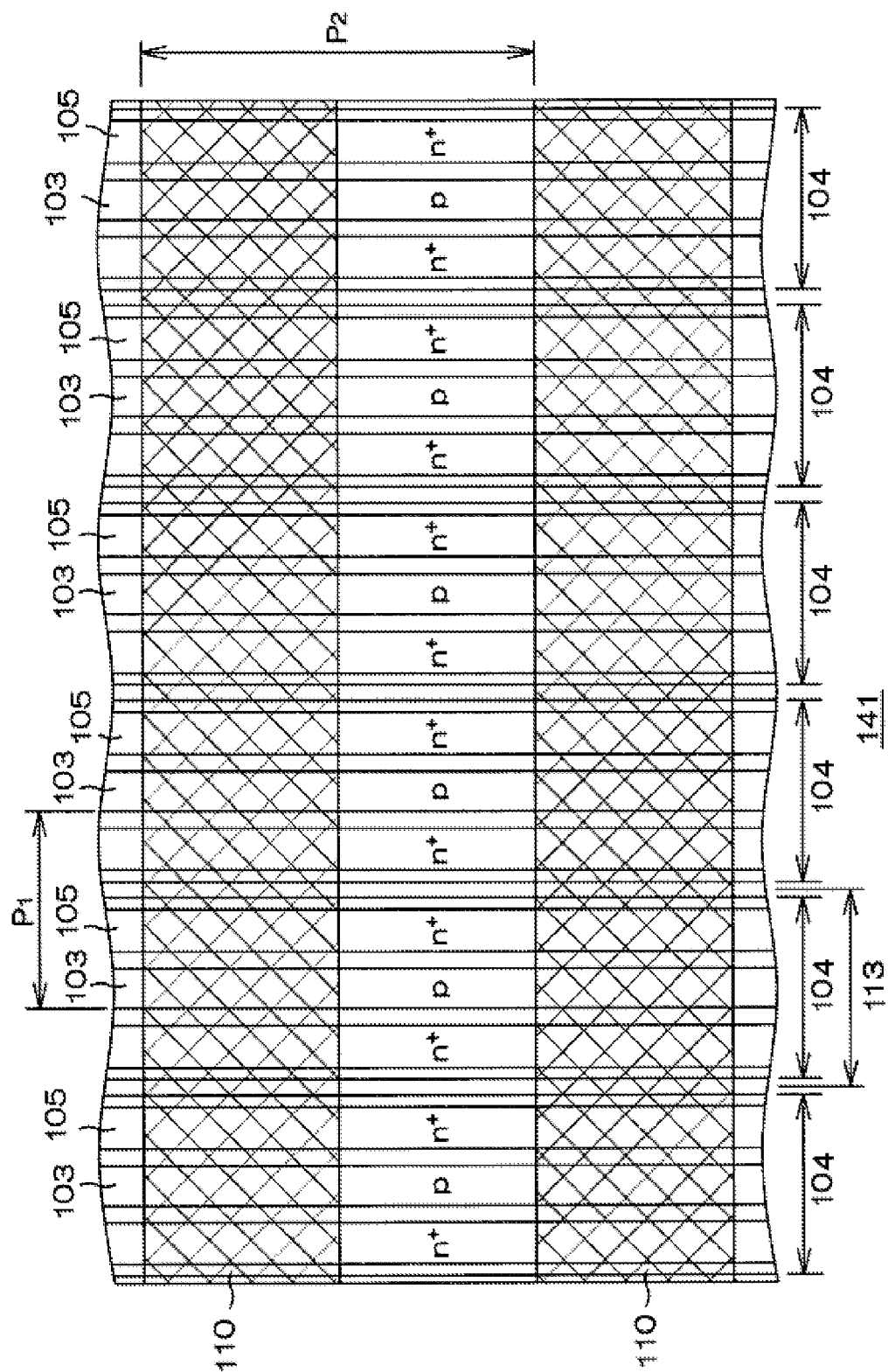
FIG. 22 is a modification example of the layout of the p-type columnar regions and $p^+$ collector layers.
Figure 23:
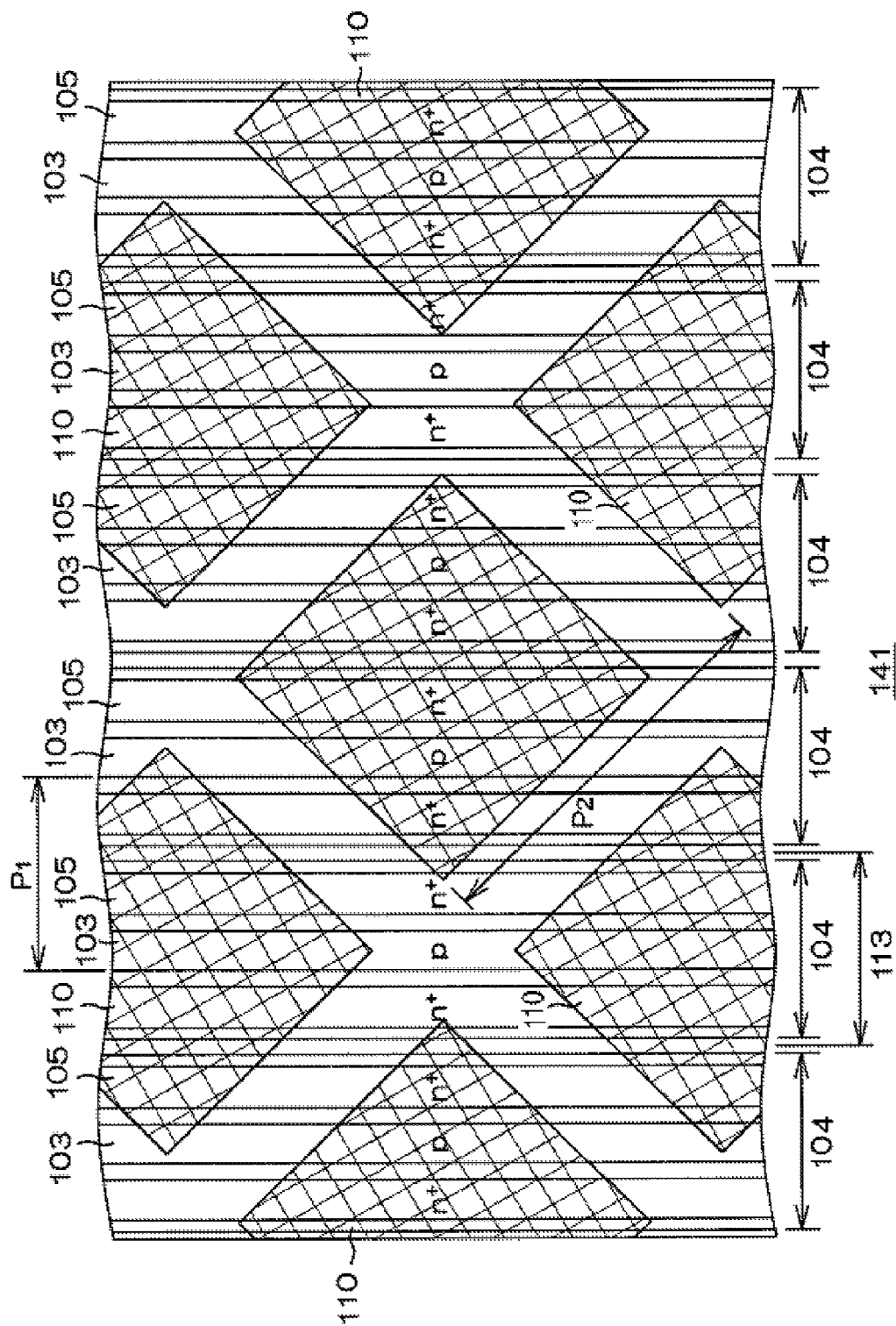
FIG. 23 is a modification example of the layout of the p-type columnar regions and $p^+$ collector layers.

First, in FIGS. 22 and 23, a modification example of the layout of the p⁺ collector layers 110 in relation to the striped p-type columnar regions 103 is shown.

Specifically, in FIG. 22, the p⁺ collector layers 110 are formed in stripes that intersect the stripe-shaped p-type columnar regions 103 in a plan view. More specifically, the p⁺ collector layers 110 are formed in stripe shapes orthogonal to the p-type columnar regions 103. With this configuration in FIG. 22, the respective p⁺ collector layers 110 are formed in a continuous manner across the stripe-shaped p-type columnar regions 103 and evenly face all of the p-type columnar regions 103. As a result, it is possible to eliminate variation in area of the p⁺ collector layers 110 between the cells 113; therefore, variation in ON-resistance between the cells 113 can be minimized. In FIG. 22, these p-type columnar regions 103 and p⁺ collector layers 110 are shown as being orthogonal to each other as an example of the stripe-shaped p⁺ collector layers 110 intersecting the p-type columnar regions 103, but the p⁺ collector layers 110 may intersect the p-type columnar regions 103 at a tilted angle such as an acute angle or an obtuse angle.

In FIG. 23, the p⁺ collector layers 110 are arranged apart from each other in a grid shape in a plan view, and the respective p⁺ collector layers 110 are formed in diamond shapes that intersect (go across) the p-type columnar regions 103 so as to straddle a plurality of the adjacent p-type columnar regions 103. The shape of the respective p⁺ collector layers 110 may be a diamond shape as shown in FIG. 23, or may be another polygonal or circular shape. With this configuration in FIG. 23, the p⁺ collector layers 110 are not formed in a continuous manner across the stripe-shaped p-type columnar regions 103 as in the configuration in FIG. 22 but are arrayed in a periodic grid shape, thus making it possible to equally face all of the p-type columnar regions 103 in a manner similar to the configuration in FIG. 22. As a result, it is possible to eliminate variation in area of the p⁺ collector layers 110 between the cells 113; therefore, variation in ON-resistance between the cells 113 can be minimized.

Figure 24:
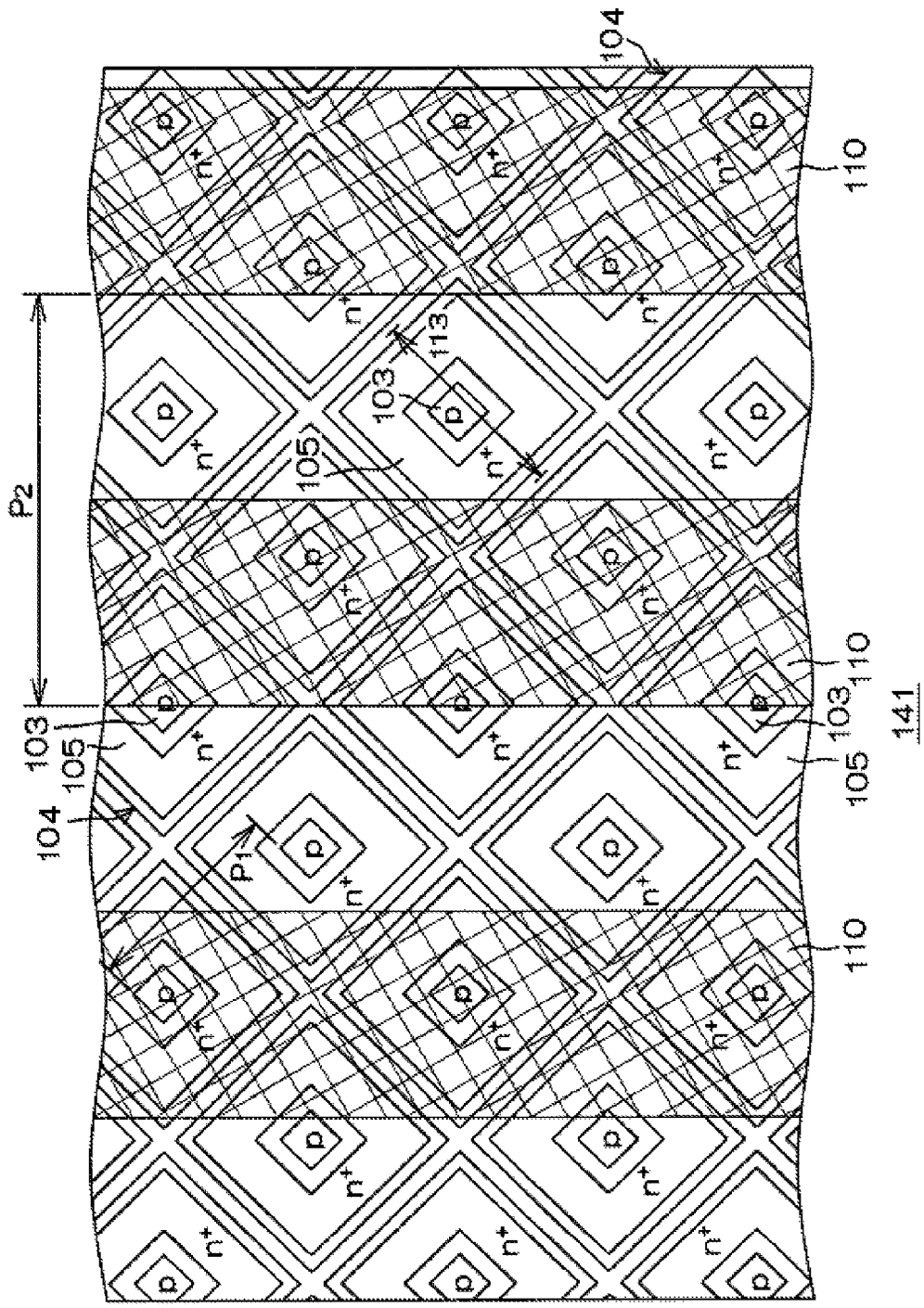
FIG. 24 is a modification example of the layout of the p-type columnar regions and $p^+$ collector layers.
Figure 25:
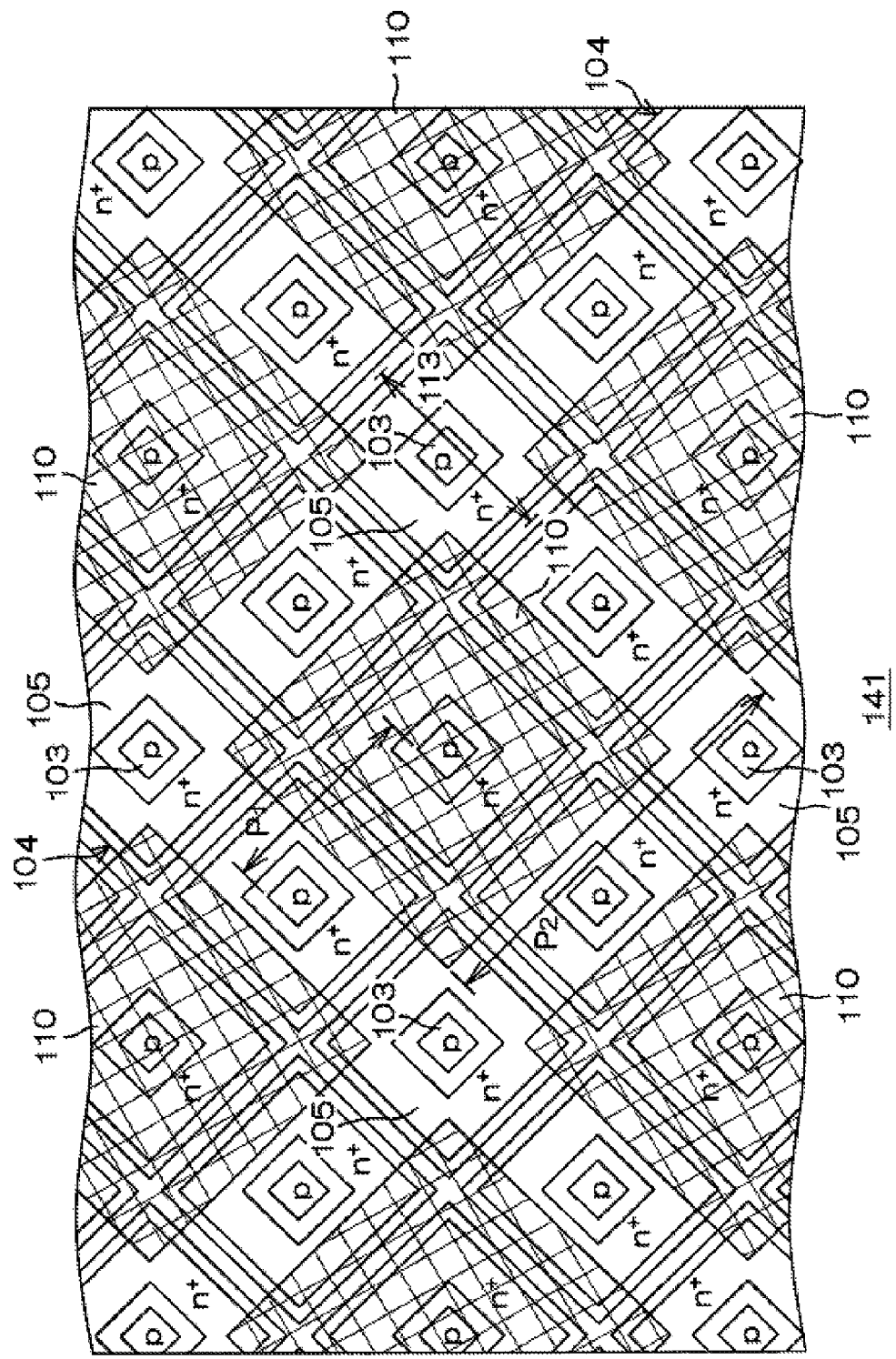
FIG. 25 is a modification example of the layout of the p-type columnar regions and $p^+$ collector layers.

Next, in FIGS. 24 and 25, a modification example is shown of the layout of the p⁺ collector layers 110 in relation to the diamond-shaped p-type columnar regions 103. In other words, in FIGS. 24 and 25, the p-type columnar regions 103 are formed in the inner areas of the respective p-type base layers 104 arranged apart from each other in a grid shape on the surface of the n⁻ base layer 102. The n⁺ source layers 105 are formed so as to encompass the respective p-type columnar regions 103. The shape of the respective p-type base layers 104 may be a diamond shape as shown in FIGS. 24 and 25, or may be another polygonal or circular shape. The shape of the p-type columnar regions 103 may also be a diamond shape in accordance with the respective p-type base layers 104, or may be another polygonal or circular shape.

The p⁺ collector layers 110 are formed in stripe shapes parallel to each other in FIG. 24, and in FIG. 25 are formed in diamond shapes larger than the p-type base layers 104. In FIG. 25, the p⁺ collector layers 110 are arranged apart from each other in a grid shape in a plan view.

The modification examples shown in FIGS. 22 to 25 are merely examples, and the layout of the p-type columnar regions 103 and p⁺ collector layers 110 can be modified as appropriate within the scope of the present invention.

Embodiments of the present invention were described above, but the present invention can also be implemented in other embodiments.

Figure 26:
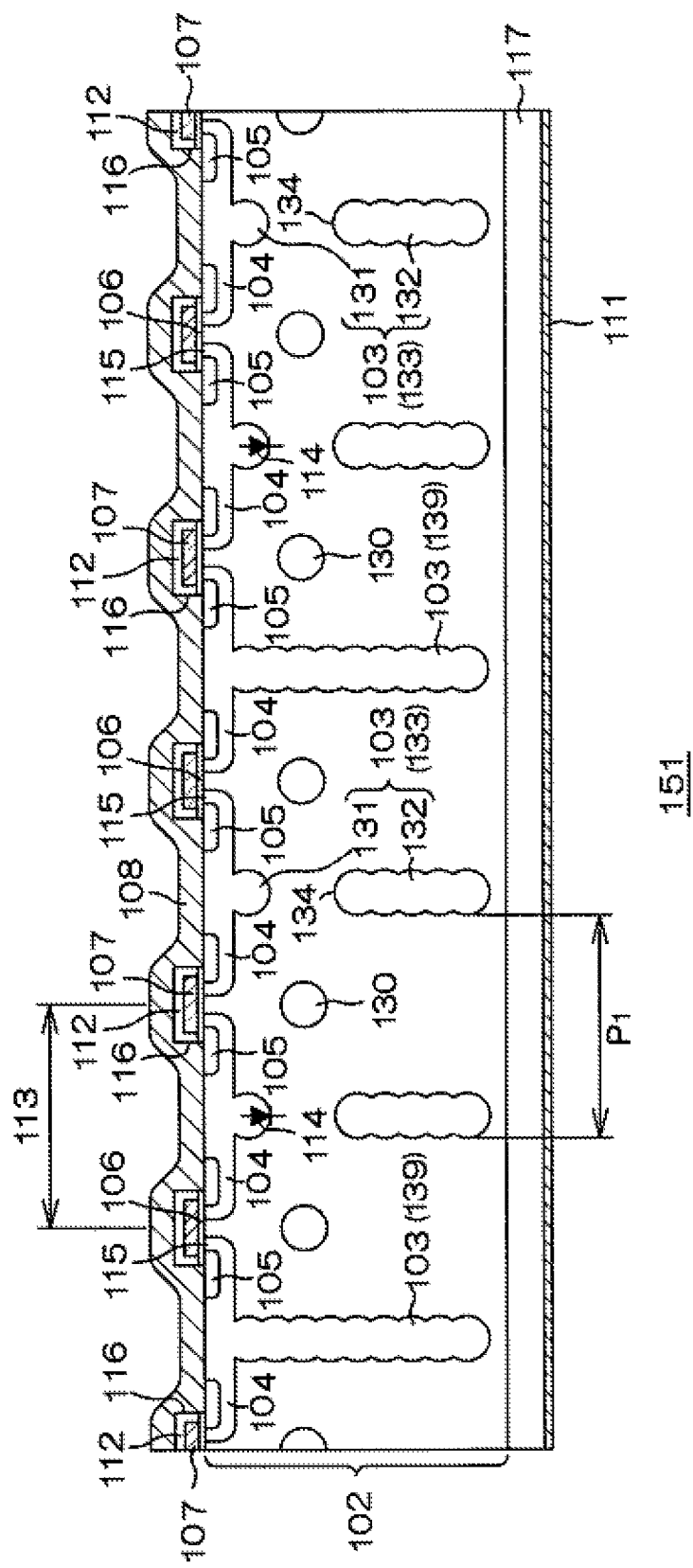
FIG. 26 is a schematic cross-sectional view of a semiconductor device of Embodiment 6 of the present invention.

As with a semiconductor device 151 shown in FIG. 26, the p-type columnar regions 103 may selectively include continuous columnar regions 139 that continue from the p-type base layer 104 to the bottom edge of the bottom columnar region 132 without being separated into top and bottom, for example. In this case, the separated columns 133 and continuous columnar regions 139 may be arrayed regularly (alternately, for example) or may be arrayed randomly. As shown in FIG. 26, by selectively providing the continuous columnar regions 139 that are specialized for superjunction characteristics, it is possible to adjust the trade-off between the switching speed and on-resistance of the semiconductor device 151.

In the respective embodiments described above, the p-type columnar regions 103 were grown by multi-epitaxial growth, but the p-type columnar regions can be formed by forming deep trenches in the n⁻ base layer 102 and then embedding the p-type semiconductor layers in these deep trenches, for example.

The structure of the cells 113 may be a planar gate structure as in the respective embodiments above, or may be a trench gate structure.

A configuration may be used in which the conductivity type of the respective semiconductor portions of the semiconductor devices 101, 141, and 151 are reversed. In the semiconductor device 101, the p-type parts may be n-type and the n-type parts may be p-type, for example.

Besides these, various modifications in design can be made within the scope of the claims.

Working Example

Figure 27:
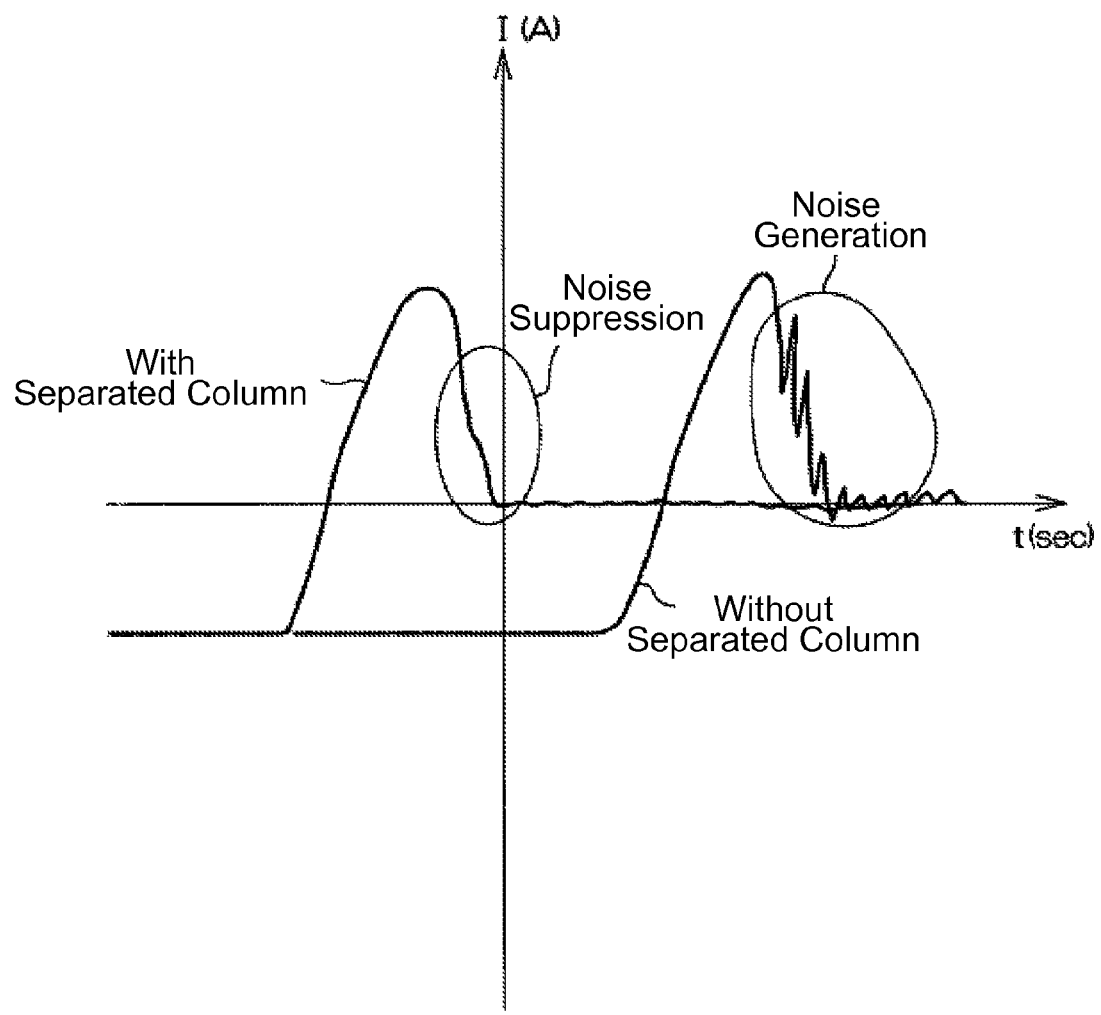
FIG. 27 is a waveform diagram of one example of current waveform from when the parasitic diode is in an on-state to when it is turned off.

FIG. 27 is a waveform diagram of one example of current waveform between the source electrode 108 and the drain electrode 111 from when the parasitic diode 114 is in an ON-state to when it is turned OFF. As shown in FIG. 27, in the comparison example with the "Without Separated Columnar Region," noise occurs due to ringing (vibration of the reverse recovery current) or sudden changes in the current when the parasitic diode 114 is turned OFF. By contrast, in the working example with the "With Separated Columnar Region," the reverse recovery current settles back to zero smoothly and noise is suppressed.

Simulation Example 3

Figure 28A:
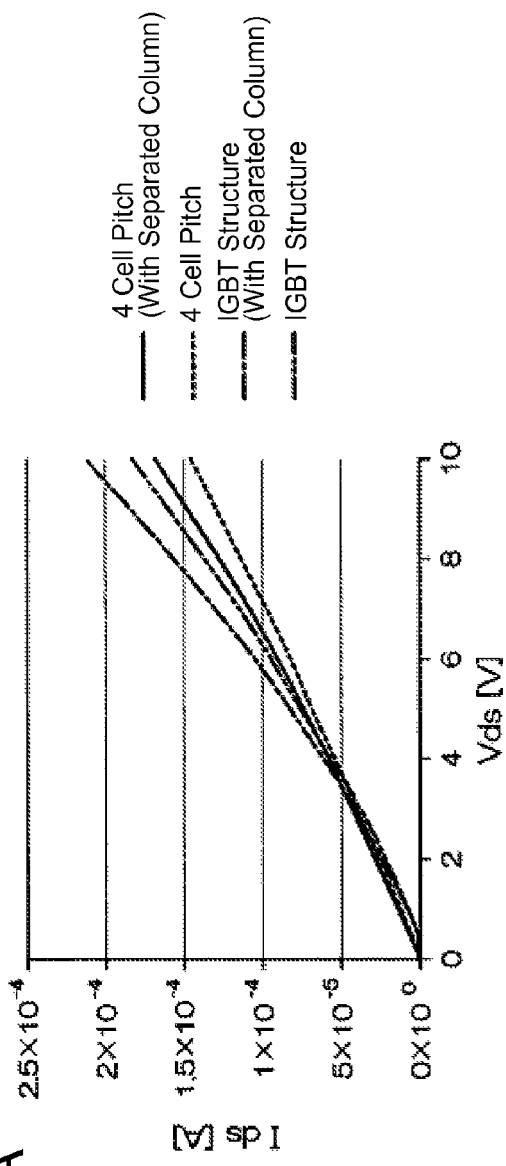
FIG. 28A is a graph of Id-Vd characteristics of the semiconductor device.
Figure 28B:
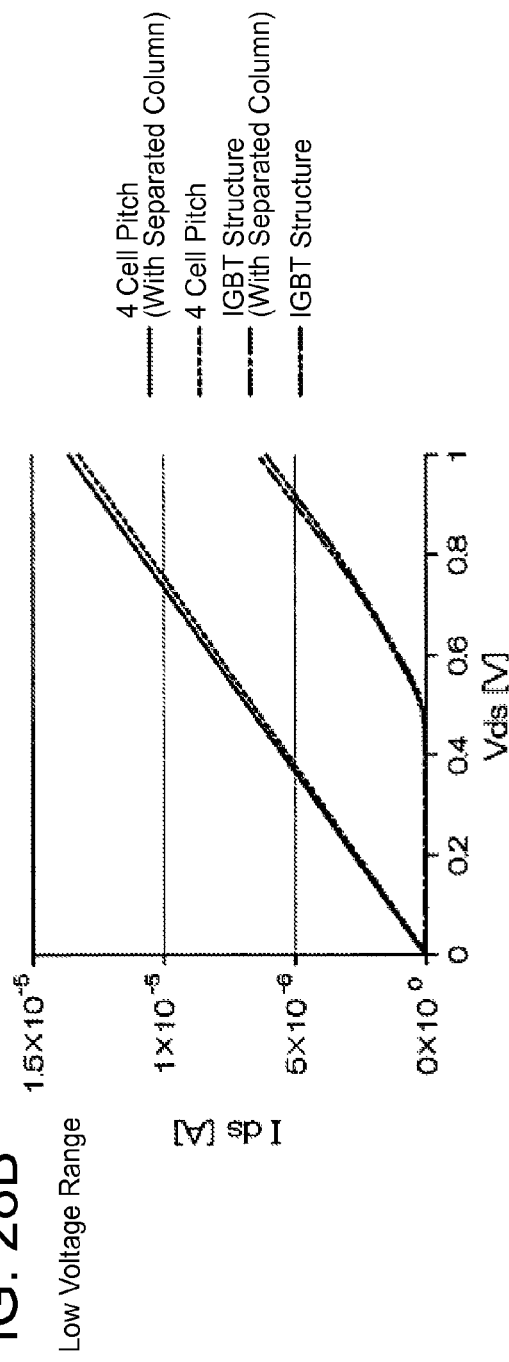
FIG. 28B is a graph in which the characteristics in the low voltage range of FIG. 28B have been magnified.

In Simulation Example 3, it was confirmed how the respective ON-resistances in low voltage ranges and high voltage ranges change depending on the presence or absence of the p⁺ collector layers 110 and the presence or absence of the separated columns 133. The results are shown in FIGS. 28A and 28B. In FIGS. 28A and 28B, "4 cell pitch" means that the p⁺ collector layers 110 are provided at a pitch $P_2$ that is four times (4 cell pitch) that of a pitch $P_1$ of the p-type columnar regions 103 in the semiconductor device 141 shown in FIG. 20. The occupancy of the p⁺ collector layers 110=64%, and the ratio of width of the p⁺ collector layers 110 to that of the n⁺ contact layer 109=1:1. The semiconductor device 141 has an IGBT structure due to a p-type silicon substrate being provided on the entire rear surface of the n⁻ base layer 102.

According to FIG. 28A, if the separated column 133 is formed then ON-resistance is reduced in high voltage ranges as compared to if the separated column 133 were not formed. The structural difference between the "4 cell pitch (With Separated Columnar Region)" and "4 cell pitch" is that presence or absence of the separated columnar region. The "4 cell pitch (With Separated Columnar Region)" allows more current to pass through. In other words, the ON-resistance is reduced.

On the other hand, according to FIG. 28B, ON-resistance is reduced in the low voltage ranges as compared to the IGBT structure due to the contact between the n⁺ contact layer 109 and the drain electrode 111 being left intact by selective forming of the p⁺ collector layers 110.

Simulation Example 4

Figure 29:
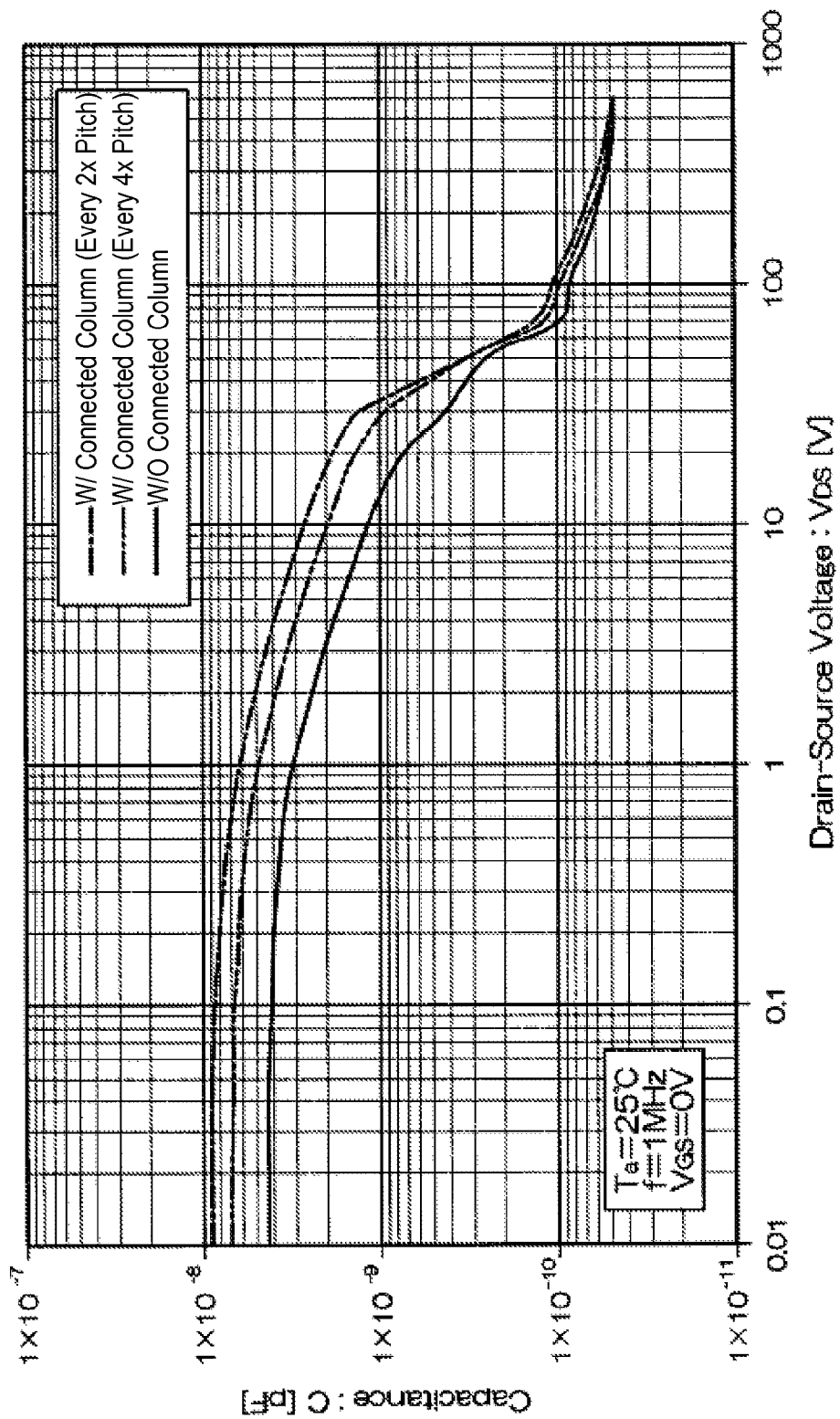
FIG. 29 is a graph of the relationship between drain-source voltage and output capacitance of the semiconductor device.

In Simulation Example 4, it was confirmed how the parasitic output capacitance of the semiconductor device changes depending on the number of separated columns 133. These results are shown in FIG. 29. In FIG. 29, "With Continuous Column (For Every 2×Pitch)" means that every third p-type columnar region 103 serves as the continuous columnar region 139 in the semiconductor device 151 shown in FIG. 26. In other words, this is the configuration shown in FIG. 26. In this case, two separated columns 133 are arranged between the adjacent continuous columnar regions 139. In a similar manner, "With Continuous Column (For Every 4×Pitch)" means that every fifth p-type columnar region 103 serves as the continuous columnar region 139, and "Without Continuous Column" means that all of the p-type columnar regions 103 are separated columns 133.

According to FIG. 29, the parasitic output capacitance of the semiconductor device is lowest in "Without Continuous Column," second lowest in "With Continuous Column (For Every 4×Pitch)," and highest in "With Continuous Column (For Every 2×Pitch)". In other words, more separated columns 133 means a greater reduction in parasitic ON-resistance.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

The invention claimed is:

1. A semiconductor device, comprising:
a first conductive type base layer;
a plurality of second conductive type base layers selectively formed on a surface of the first conductive type base layer;
a first conductive type source layer that is formed in an inner area of the respective second conductive type base layers at a gap from a periphery of the respective second conductive type base layers, the first conductive type source layer forming a channel region with said periphery;
a gate electrode formed so as to face the channel region across a gate insulating film;
a plurality of second conductive type columnar regions that are formed in the first conductive type base layer so as to continue from the respective second conductive type base layers and that are arranged at a prescribed first pitch with respect to the second conductive type base layers that are adjacent to each other; and
a plurality of second conductive type collector layers that are selectively formed on a rear surface of the first conductive type base layer and that are arranged at a prescribed second pitch, the second pitch being larger than the first pitch of the second conductive type columnar regions.

2. The semiconductor device according to claim 1, wherein the second pitch is two times to five times the first pitch.

3. The semiconductor device according to claim 1, wherein the occupancy of the second conductive type collector layers with respect to the entire rear surface of the first conductive type base layer is 50% to 80%.

4. The semiconductor device according to claim 1, wherein the second conductive type collector layers are formed so as to face the respective second conductive type columnar regions in a thickness direction of the first conductive type base layer.

5. The semiconductor device according to claim 4, wherein the second conductive type columnar regions are formed in a stripe shape in a plan view.

6. The semiconductor device according to claim 5, wherein the second conductive type collector layers are formed in a shape that intersects the respective second conductive type columnar regions and that faces the respective second conductive type columnar regions at this intersection in a plan view.

7. The semiconductor device according to claim 6, wherein the second conductive type collector layers are formed in a stripe shape in a plan view.

8. The semiconductor device according to claim 7, wherein the second conductive type collector layers are formed in a stripe shape that is orthogonal to the respective second conductive type columnar regions in a plan view.

9. The semiconductor device according to claim 6, wherein the second conductive type collector layers are formed in a polygonal shape or a circular shape in a plan view.

10. The semiconductor device according to claim 5, wherein the second conductive type collector layers are formed in a stripe shape that is parallel to the respective second conductive type columnar regions in a plan view.

11. The semiconductor device according to claim 4, wherein the second conductive type columnar regions are formed in a polygonal shape or a circular shape in a plan view.

12. The semiconductor device according to claim 11, wherein the second conductive type collector layers are formed in a stripe shape in a plan view.

13. The semiconductor device according to claim 11, wherein the second conductive type collector layers are formed in a polygonal shape or a circular shape in a plan view.

14. The semiconductor device according to claim 1,
wherein the first conductive type base layer includes a first conductive type contact layer arranged between each of the plurality of the second conductive type collector layers, the first conductive type base layer having a higher impurity concentration than a first conductive type drift layer that is formed in a top area of the plurality of the second conductive type collector layers.

15. The semiconductor device according to claim 14, wherein a ratio of a width of the second conductive type collector layer to a width of the first conductive type contact layer in each second pitch is 1:1.

16. The semiconductor device according to claim 1, wherein the first pitch is 5 μm to 20 μm and the second pitch is 5 μm to 200 μm.

17. The semiconductor device according to claim 1, wherein the second conductive type collector layers have a width of 2.5 μm to 160 μm.

18. The semiconductor device according to claim 1, wherein the second conductive type collector layers have a depth of 0.2 μm to 3.0 μm from the rear surface of the first conductive type base layer.

19. The semiconductor device according to claim 1, wherein the second conductive type collector layers have an impurity concentration of $1\times10^{17}$ cm$^{-3}$ to $1\times10^{22}$ cm$^{-3}$.

20. A semiconductor device, comprising:
a first conductive type drain layer;
a first conductive type base layer formed on the first conductive type drain layer;
a plurality of second conductive type base layers selectively formed on a surface of the first conductive type base layer;
a first conductive type source layer that is formed in an inner area of the respective second conductive type base layers at a gap from a periphery of the respective second conductive type base layers, the first conductive type source layer forming a channel region between said periphery;
a gate electrode formed so as to face the channel region across a gate insulating film;
a second conductive type columnar region that is formed in the first conductive type base layer and that extends towards the first conductive type drain layer from at least some of the second conductive type base layers;
a drain electrode electrically connected to the first conductive type drain layer; and
a source electrode electrically connected to the first conductive type source layer,
wherein the second conductive type columnar region has a top columnar region integrally formed with the respective second conductive type base layers and a bottom columnar region that is longer than the top columnar region and that is electrically floating.

21. The semiconductor device according to claim 20, further comprising:
a second conductive type auxiliary area formed at a location that is laterally separated with a gap from both the top columnar region and the bottom columnar region.

22. The semiconductor device according to claim 20, wherein the top columnar region and the bottom columnar region are separated by a gap that is less than or equal to 10 μm in a vertical direction.

23. The semiconductor device according to claim 20, wherein at least some of the second conductive type base layers selectively have a continuous columnar region that continues from the respective second conductive type base layers to a bottom edge of the bottom columnar region.

24. The semiconductor device according to claim 20, further comprising:
a second conductive type collector layer partially formed on a rear surface of the first conductive type drain layer.

25. The semiconductor device according to claim 24,
wherein the second conductive type columnar region is arranged at a prescribed first pitch between the second conductive type base layers that are adjacent, and
wherein the second conductive type collector layer is arranged at a prescribed second pitch larger than the first pitch of the second conductive type columnar region.

26. The semiconductor device according to claim 25, wherein the occupancy of the second conductive type collector layer with respect to the entire rear surface of the first conductive type drain layer is 40% to 80%.

27. A method of manufacturing a semiconductor device, comprising:
forming a first conductive type base layer on a first conductive type drain layer by selectively implanting a second conductive type impurity into a prescribed first horizontal location and then forming a bottom main layer that is of a first conductive type through epitaxial growth for a first period of time in locations other than said prescribed first horizontal location, thereafter forming a first conductive type sub-layer through epitaxial growth on the entirety of said bottom main layer, and then forming a top main layer thereon having the same structure as the bottom main layer through epitaxial growth for a second period of time that is shorter than the first period of time;

forming a second conductive type columnar region by annealing the first conductive type base layer having the top main layer and the bottom main layer and then diffusing the second conductive type impurity inside the top main layer and the bottom main layer, the second conductive type columnar region having a top columnar region vertically separated by the sub-layer and a bottom columnar region that is longer than the top columnar region;

selectively forming a second conductive type base layer on the surface of the first conductive type base layer, the second conductive type base layer continuing from the second conductive type columnar region;

forming a first conductive type source layer on an inner area of the second conductive type base layer such that a gap is present between a periphery of the second conductive type base layer and the first conductive type source region, the first conductive type source layer forming a channel region between said periphery and the second conductive type base layer;

forming a gate electrode so as to face the channel region across a gate insulating film;

forming a drain electrode that is electrically connected to the first conductive type drain layer; and forming a source electrode that is electrically connected to the first conductive type source layer.

28. The method of manufacturing a semiconductor device according to claim 27,
wherein the step of forming the first conductive type base layer includes forming the bottom main layer by epitaxially growing a plurality of layers at a prescribed first thickness, thereafter epitaxially growing a single layer of the sub-layer having the same thickness as the first prescribed thickness, and then forming the top main layer by again epitaxially growing a plurality of the layers having the first prescribed thickness but in a smaller number than the bottom main layer.

29. The method of manufacturing a semiconductor device according to claim 27,
wherein forming the sub-layer through epitaxial growth in the step of forming a first conductive type base layer includes forming the sub-layer while implanting the second conductive type impurity at a second horizontal location that is laterally separated from the first horizontal location, and
wherein the step of forming the second conductive type columnar region includes forming the second conductive type auxiliary area with gaps from both the top columnar region and the bottom columnar region by diffusing the second conductive type impurity inside the sub-layer through the annealing treatment.

30. The method of manufacturing a semiconductor device according to claim 27,
wherein forming the sub-layer through epitaxial growth in the step of forming a first conductive type base layer includes forming a buffer layer of 5 μm to 30 μm.

* * * * *